(12) United States Patent
Frydman et al.

(10) Patent No.: US 7,944,206 B2
(45) Date of Patent: May 17, 2011

(54) METHOD AND APPARATUS FOR ACQUIRING HIGH RESOLUTION SPECTRAL DATA OR HIGH DEFINITION IMAGES IN INHOMOGENEOUS ENVIRONMENTS

(75) Inventors: Lucio Frydman, Rehovot (IL); Boaz Shapira, Rehovot (IL); Assaf Tal, Rehovot (IL)

(73) Assignee: Yeda Research and Development Co. Ltd., Rehovot (IL)

(\*) Notice: Subject to any disclaimer, the term of this patent is extended or adjusted under 35 U.S.C. 154(b) by 234 days.

(21) Appl. No.: 12/158,364

(22) PCT Filed: Dec. 14, 2006

(86) PCT No.: PCT/US2006/047689
§ 371 (c)(1),
(2), (4) Date: Aug. 21, 2008

(87) PCT Pub. No.: WO2007/078821
PCT Pub. Date: Jul. 12, 2007

(65) Prior Publication Data
US 2010/0001727 A1 Jan. 7, 2010

Related U.S. Application Data

(60) Provisional application No. 60/752,489, filed on Dec. 21, 2005, provisional application No. 60/799,527, filed on May 11, 2006.

(51) Int. Cl.
*G01V 3/00* (2006.01)
(52) U.S. Cl. ........................ 324/307; 324/309
(58) Field of Classification Search .......... 324/300–322; 600/407–445
See application file for complete search history.

(56) References Cited

U.S. PATENT DOCUMENTS 4,689,563 A \* 8/1987 Bottomley et al. ........... 324/309

(Continued)

FOREIGN PATENT DOCUMENTS

WO    WO 2004/011899    2/2004

(Continued)

OTHER PUBLICATIONS

Written Opinion of the International Searching Authority published Oct. 17, 2008 for PCT/US2006/047689 filed Dec. 14, 2006 (U.S. Appl. No. 12/158,364 claims priority to this PCT).

(Continued)

*Primary Examiner* — Brij B Shrivastav
(74) *Attorney, Agent, or Firm* — Martin Fleit; Paul D. Bianco; Fleit Gibbons Gutman Bongini & Bianco PL

(57) ABSTRACT

A method and apparatus for treating a sample for acquiring high-definition magnetic resonance images (MRI images) or high resolution nuclear magnetic resonance (NMR) spectra even in the presence of magnetic field distortions within one or multiple scans. The spatial nature and temporal dependence of the field inhomogeneities are determined a priori using any of several literature procedures. A static or oscillating magnetic field gradient is applied on the sample so as to endow spins at different positions within the sample with different resonance frequencies. A phase- and amplitude-modulated radiofrequency (RF) pulse is applied in unison with the magnetic field gradient so as to endow spins at different positions within the sample with a homogeneous excitation/inversion profile. The nature of the spatially-selective RF irradiation is tailored in such a way that, when added on top of the effects of the inhomogeneities, the spins' evolution phases and their signal amplitudes at the time of the acquisition become independent of the inhomogeneities. The spin signals thus created are captured and decoded, so as to obtain the spins' response as if the inhomogeneity was not present. The collected data is processed to a suitable rearrangement and Fourier analysis procedure to retrieve a final undistorted image or spectrum. The magnetic field gradient can be oscillated to impose this kind of inhomogeneity corrections on multiple spatial dimensions sequentially, or simultaneously.

16 Claims, 16 Drawing Sheets

U.S. PATENT DOCUMENTS

| | | | |
|---|---|---|---|
| 5,099,208 A * | 3/1992 | Fitzpatrick et al. | 324/312 |
| 5,726,569 A * | 3/1998 | Krieg et al. | 324/309 |
| 6,636,038 B1 * | 10/2003 | Heid | 324/314 |
| 6,836,113 B2 | 12/2004 | Zhang | |
| 7,088,099 B2 * | 8/2006 | Doddrell et al. | 324/309 |
| 7,271,588 B2 * | 9/2007 | Frydman | 324/318 |
| 7,417,430 B2 * | 8/2008 | Aldefeld et al. | 324/309 |
| 2004/0113616 A1 | 6/2004 | Markl et al. | |
| 2005/0134275 A1 * | 6/2005 | Frydman | 324/321 |
| 2008/0284432 A1 * | 11/2008 | Nistler et al. | 324/307 |
| 2010/0060284 A1 * | 3/2010 | Sugiura | 324/318 |
| 2010/0160767 A1 * | 6/2010 | Deimling | 600/419 |

FOREIGN PATENT DOCUMENTS

| | | |
|---|---|---|
| WO | WO 2005/062753 | 7/2005 |
| WO | WO 2007/022423 | 2/2007 |

OTHER PUBLICATIONS

International Preliminary Report on Patentability published Oct. 21, 2008 for PCT/US2006/047689 filed Dec. 14, 2006 (U.S. Appl. No. 12/158,364 claims priority to this PCT).

International Search Report mailed Sep. 24, 2008 for PCT/US2006/047689 filed Dec. 14, 2006 (U.S. Appl. No. 12/158,364 claims priority to this PCT).

* cited by examiner

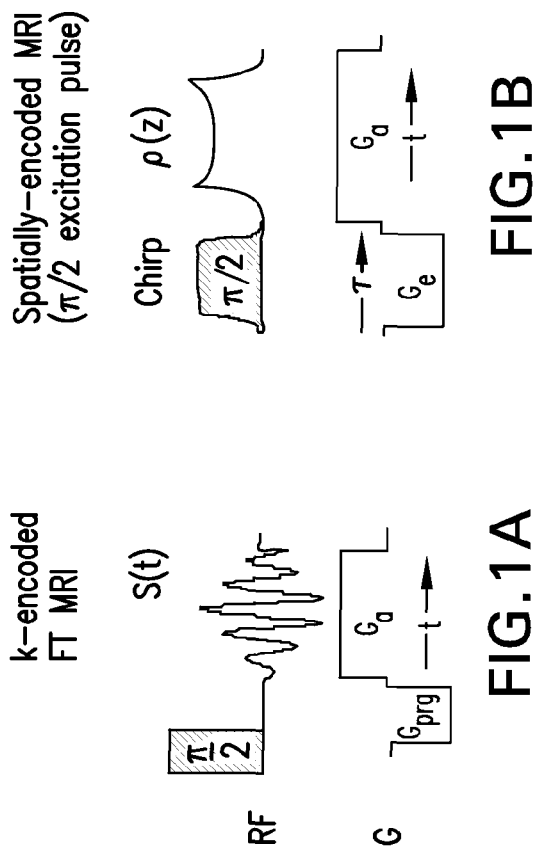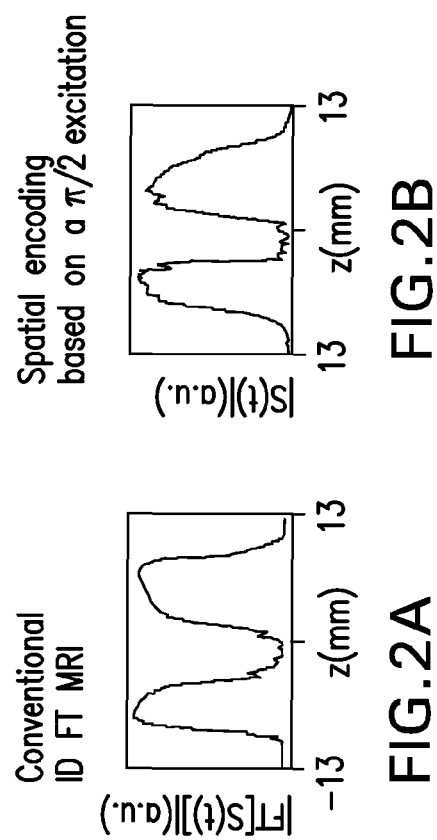

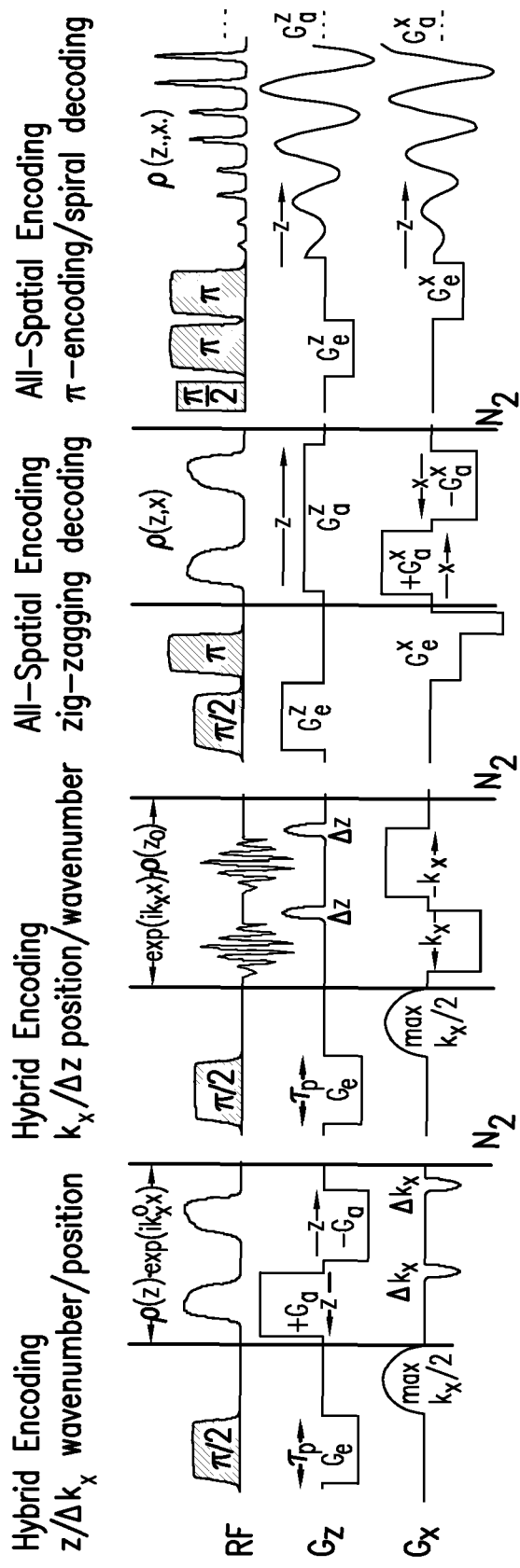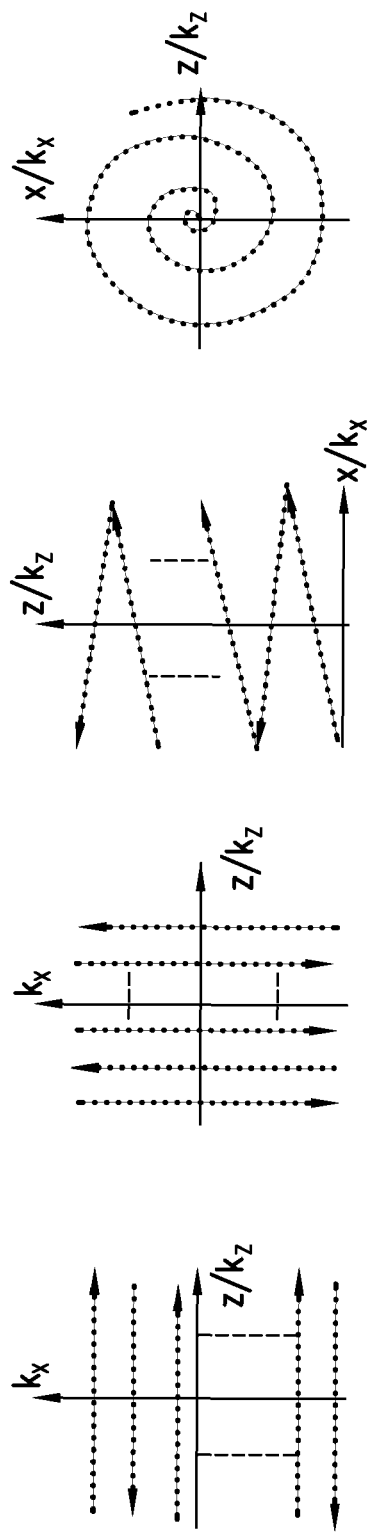
FIG. 3A  FIG. 3B  FIG. 3C  FIG. 3D

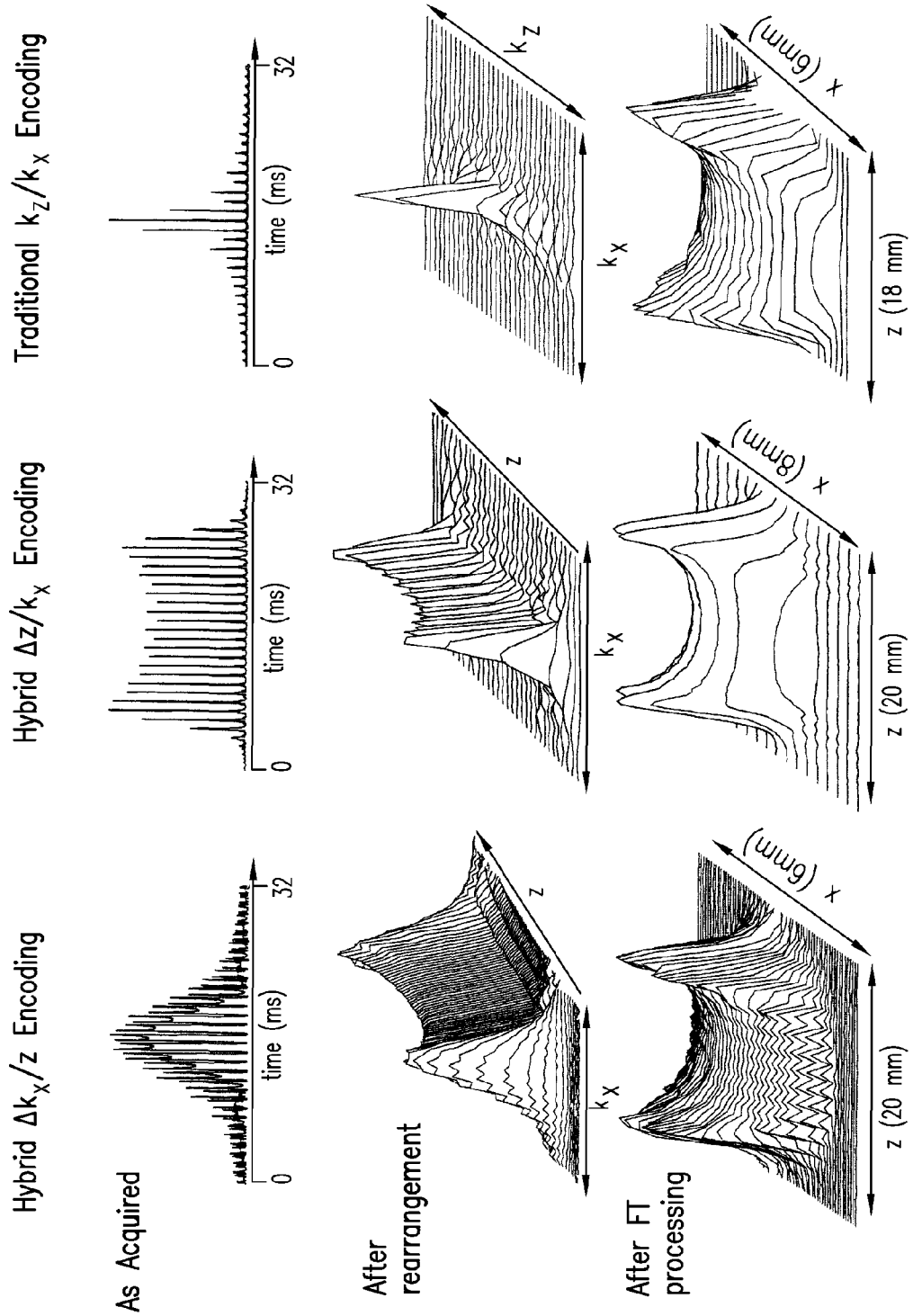

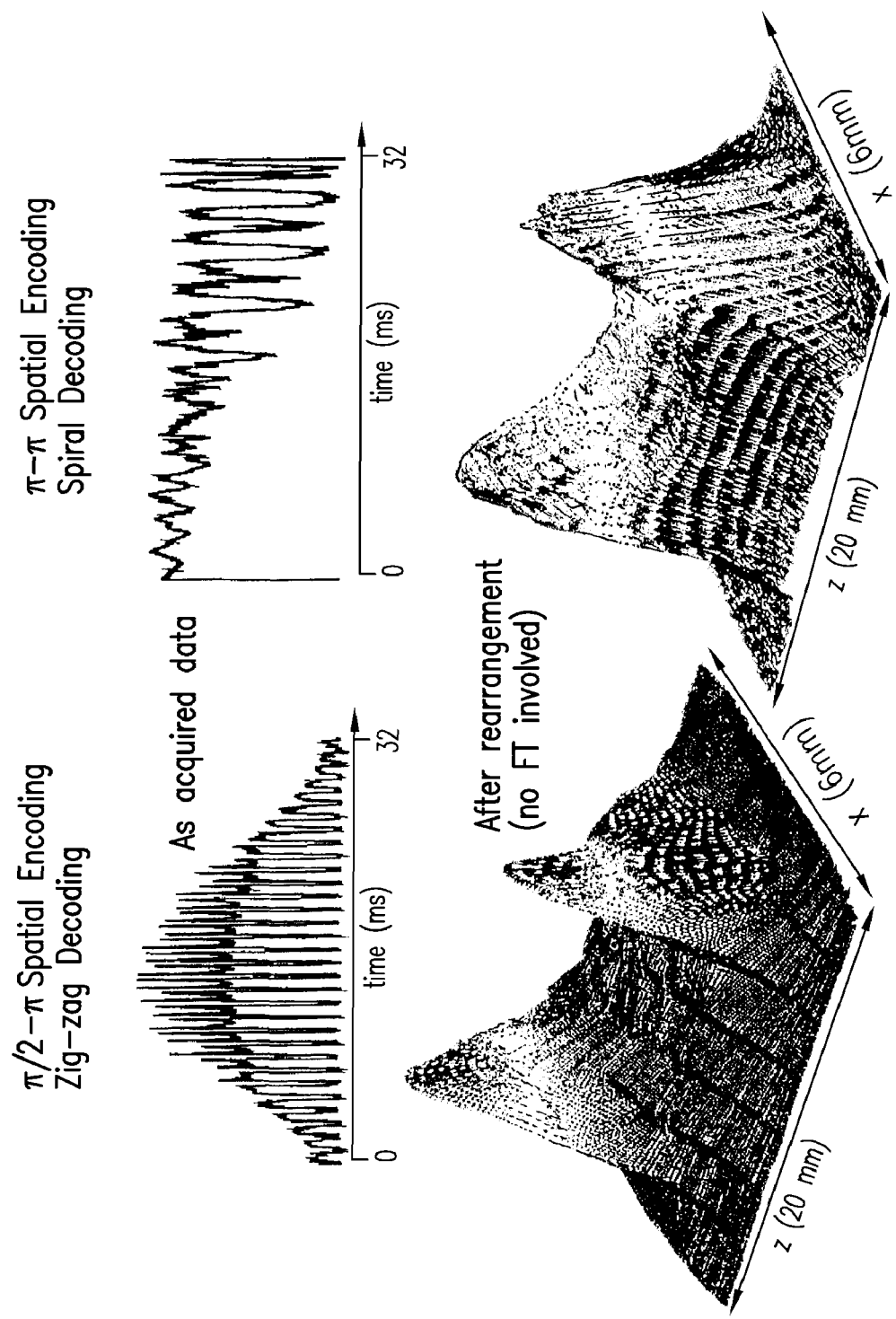

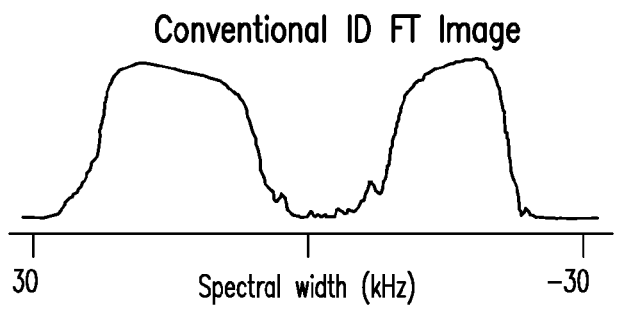
FIG. 6A — Conventional 1D FT Image
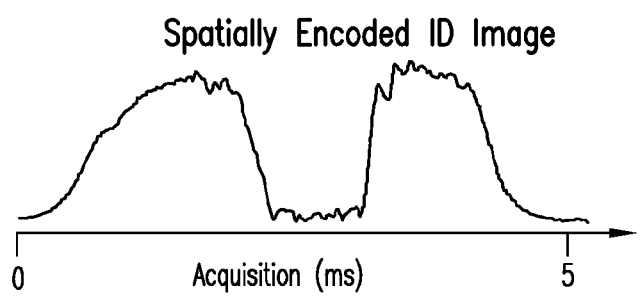
FIG. 6B — Spatially Encoded 1D Image
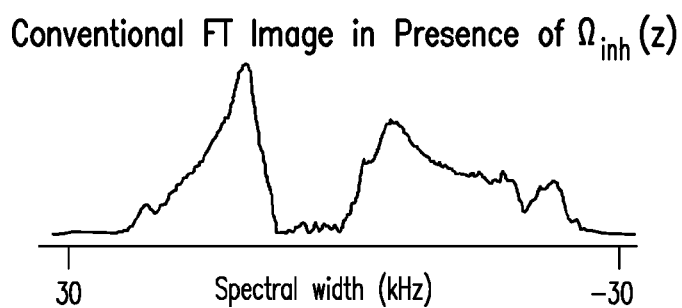
FIG. 6C — Conventional FT Image in Presence of $\Omega_{inh}(z)$
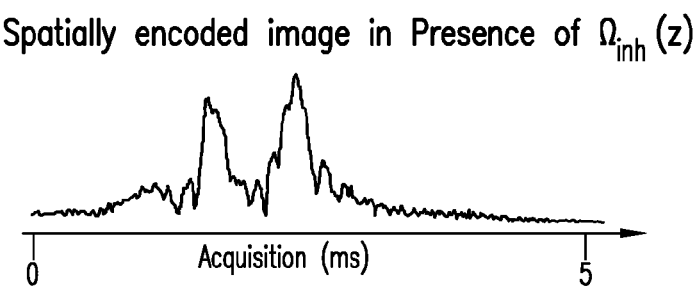
FIG. 6D — Spatially encoded image in Presence of $\Omega_{inh}(z)$
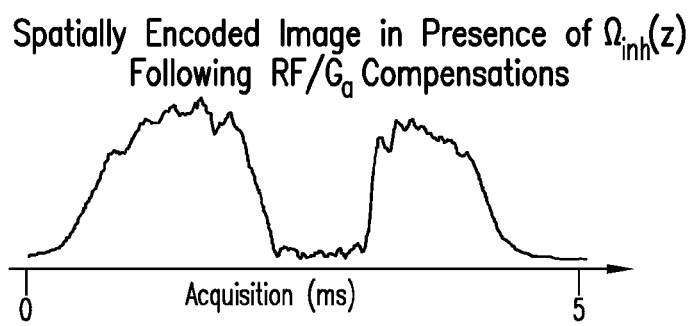
FIG. 6E — Spatially Encoded Image in Presence of $\Omega_{inh}(z)$ Following RF/$G_a$ Compensations Correct Field Compensation
(only the desired stationary phase contributing)

Incorrect Field Compensation
(multiple roots of the stationary phase condition
contributing at once)

Correct RF phase and $G_a$ Compensation
but no $\gamma B_1$ correction

Acquisition time (ms)

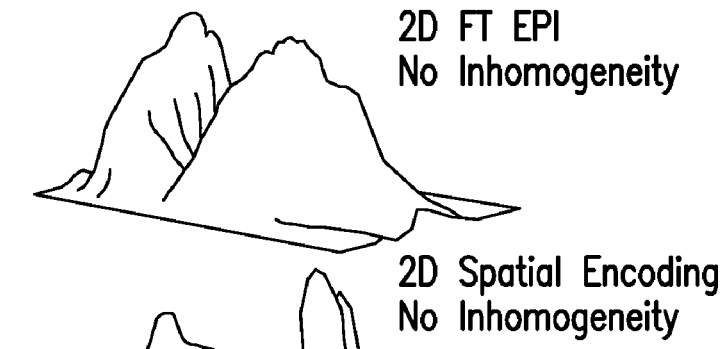
FIG. 10A — 2D FT EPI No Inhomogeneity
FIG. 10B — 2D Spatial Encoding No Inhomogeneity
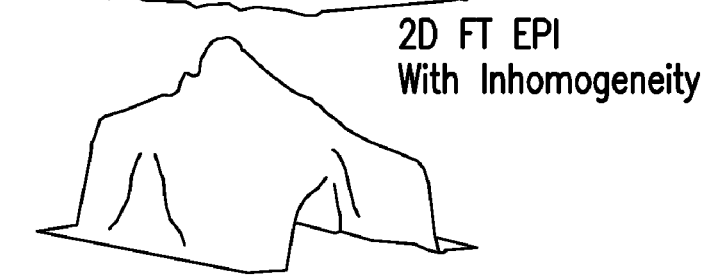
FIG. 10C — 2D FT EPI With Inhomogeneity
FIG. 10D — 2D Spatial Encoding With Inhomogeneity
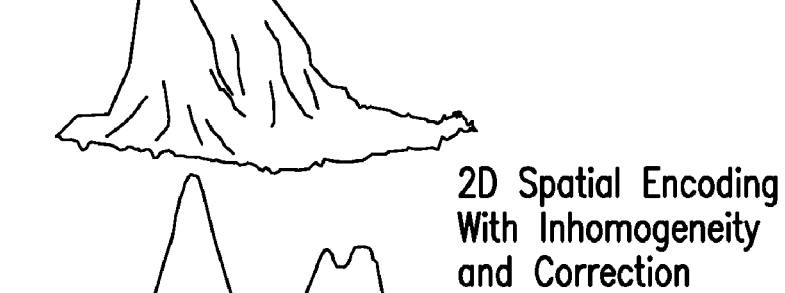
FIG. 10E — 2D Spatial Encoding With Inhomogeneity and Correction
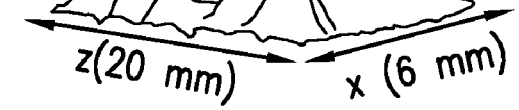
z(20 mm)  x (6 mm)

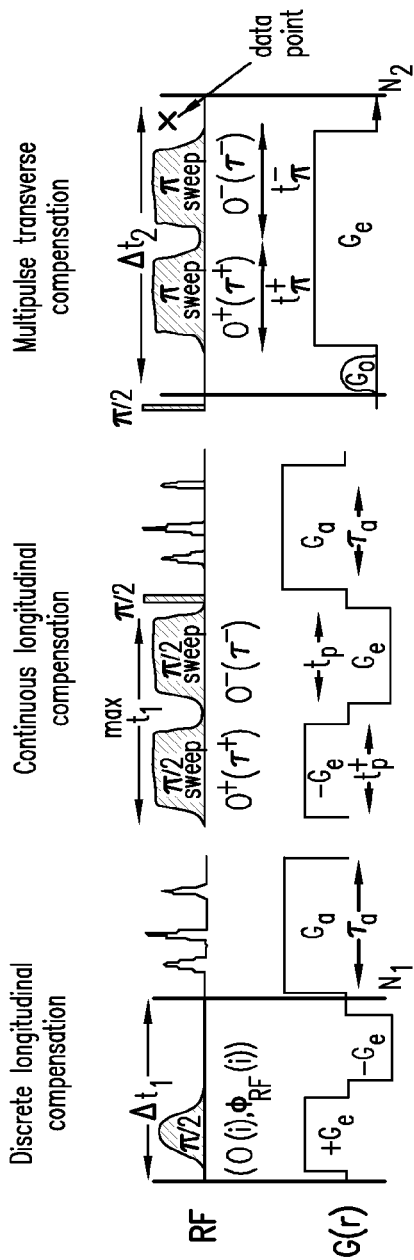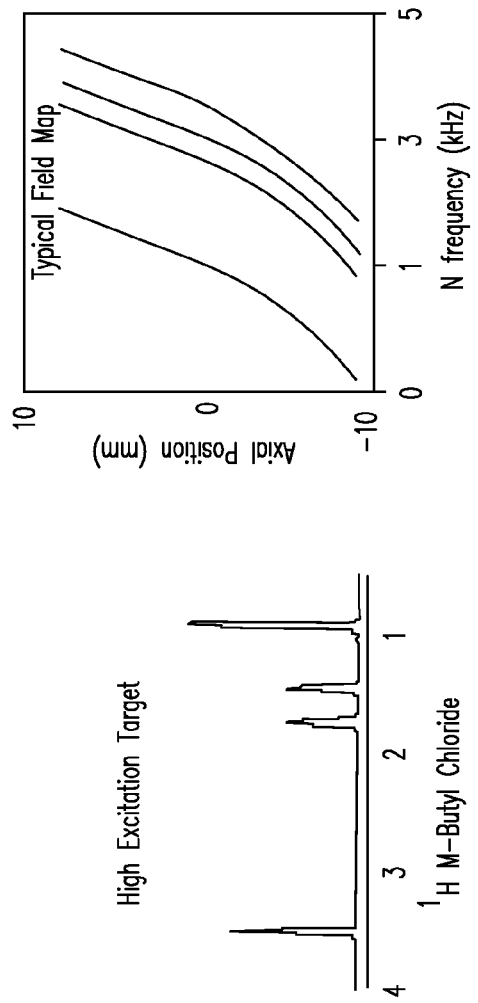

Bloch decay spectrum (partial)
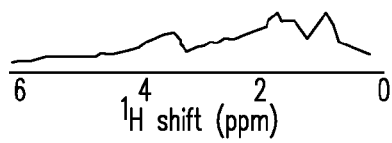
$^1H$ shift (ppm)
FIG.14A
Longitudinal chirped correction
FIG.14B
Transverse multipulse correction
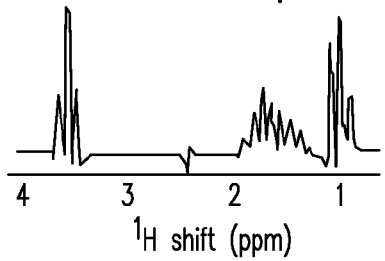
$^1H$ shift (ppm)
FIG.14C
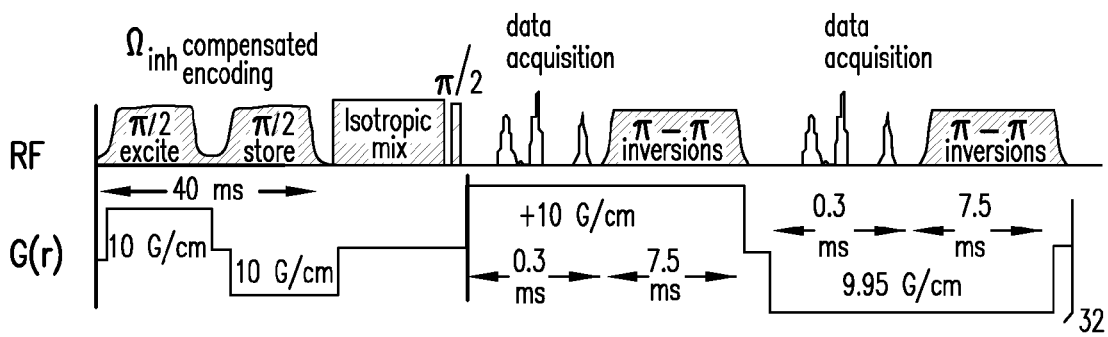
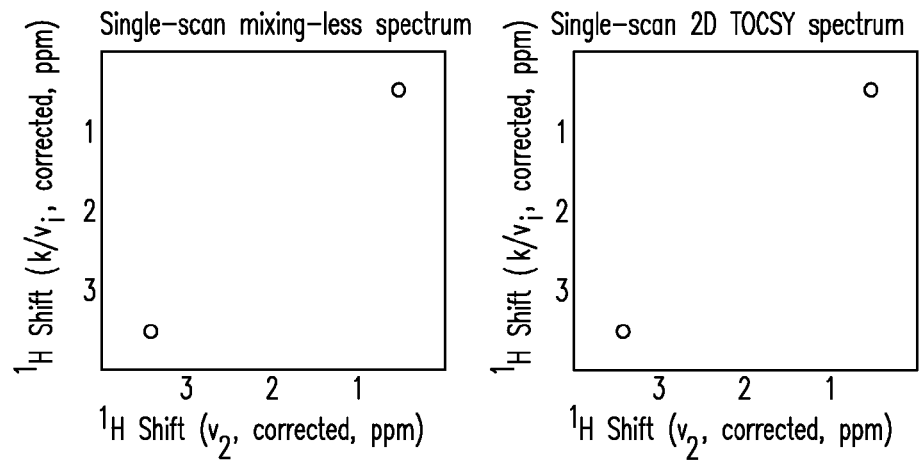
FIG.15

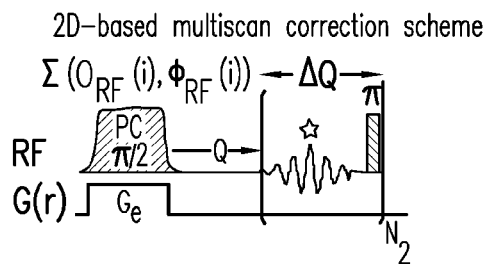
2D-based multiscan correction scheme
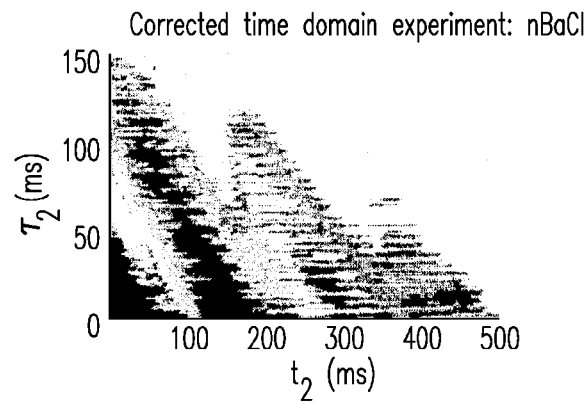
FIG.16A
Corrected time domain experiment: nBaCl
FIG.16B
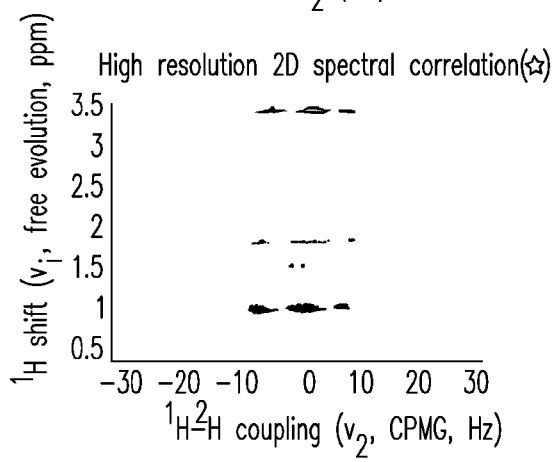
High resolution 2D spectral correlation(☆)
FIG.16C
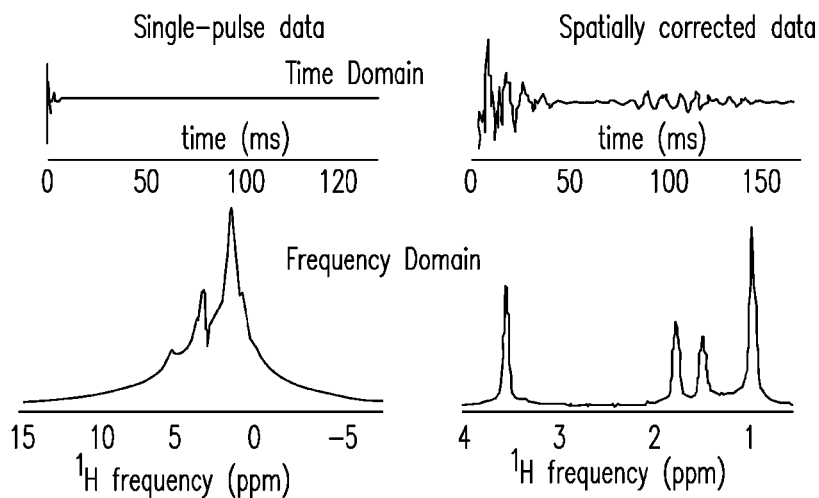
FIG.17

METHOD AND APPARATUS FOR ACQUIRING HIGH RESOLUTION SPECTRAL DATA OR HIGH DEFINITION IMAGES IN INHOMOGENEOUS ENVIRONMENTS

CROSS-REFERENCE TO RELATED APPLICATIONS

This application is a continuation of PCT/US2006/047689, filed Dec. 14, 2006, which claims the benefit of U.S. Provisional Application Nos. 60/752,489, filed Dec. 21, 2005, and 60/799,527, filed May 11, 2006.

GOVERNMENT INTERESTS

Federally Sponsored Research

This invention was made in part by government support under Grant No. R21 GM072565 awarded by the NIH. The United States government has certain rights in the invention.

BACKGROUND OF THE INVENTION

1. Field of the Invention

The present invention relates to a method and apparatus for acquiring well-resolved, high-definition images or high resolution spectral data even when dealing with heterogeneous media. And more particularly, to a method and apparatus for acquiring uni- or multidimensional nuclear magnetic resonance images or spectra within a single or multiple scans, even when the sample is subject to inhomogeneous magnetic fields, or to other kinds of spatial or chemical heterogeneities. The present invention also relates to a variety of methods employing the principles of these methods or techniques.

2. Prior Art

"Ultrafast" nuclear magnetic resonance imaging (MRI) methods can afford multidimensional profiles of a sample in a non-invasive fashion, and within a fraction of a second [1, 2].[1] Pivotal to this development was Mansfield's introduction of the k-space concept [3], leading eventually to echo-planar-imaging (EPI) and to subsequent ultrafast propositions [4-6]. Like its Jeener-Ernst nD nuclear magnetic resonance (NMR) spectroscopy counterpart [7, 8] EPI retrieves multidimensional information by monitoring the spins' behavior as a function of time, rather than by monitoring their response at a predefined set of irradiation frequencies. A subsequent Fourier transform (FT) of the free induction decay signals (FIDs) is thus needed to extract the relative contributions of the intervening Bohr precession frequencies to the spins' spectrum. Unlike what is done in conventional 2D NMR spectroscopy, where the two frequencies to be correlated occupy separate portions of the experiment, 2D EPI alternates the relative contributions of the frequencies defining the spins' evolution in such fashion so as to deliver the complete 2D time-domain interferogram following a single excitation of the spins. This "k-walk" principle can be carried out by switching the intervening gradients or by modulating them in a concurrent fashion, leading to a variety of related ultrafast acquisition modes [1, 4, 9-12]. These have eventually become one of the cornerstones of modern MRI and underlie several contemporary fields in medical research, including functional organ studies, the imaging of rapidly changing and/or pulsating systems, real-time interventional imaging, and rapid angiographic characterizations [1, 2].

[1] Abbreviations: EPI—echo planar imaging; FID—free induction decay; FOV—field of view; FT—Fourier transformation; MRI—magnetic resonance imaging; nD—arbitrary one or multi-dimensional experiment; NMR—nuclear magnetic resonance.

In an effort to emulate EPI's advantages, it has been recently proposed to use an alternative nD NMR acquisition scheme capable of affording arbitrarily high-dimensional data sets within a single scan [13-16]. By contrast to the imaging-derived k-scanning methodologies, however, the new nD single-scan protocol is applicable within a purely spectroscopic scenario or within an imaging-oriented one [16, 17]. Underlying this "ultrafast NMR" approach is the sequential, single-shot encoding of the NMR interactions one is attempting to measure, along an ancillary inhomogeneous frequency domain. This is most often introduced by the application of an external magnetic field gradient, which endows spins located at different positions with individually addressable frequencies. When applied in conjunction with a frequency-incremented excitation or inversion of the spins, such gradients lead to the possibility of "spatial encoding" the NMR interactions to be measured. In other words they allow one to encode the spin interactions $\Omega_1$ with a phase $\phi(r) \approx C\Omega_1 (r-r_0)$, rather than with the usual temporal encoding $\phi(t) \approx \Omega_1 \cdot t$. Patterns encoded in such fashion can be subject to a mixing process, and subsequently read out with the aid of a seconds acquisition gradient, revealing their initial evolution frequencies according to echo positions arising at $k=-C\Omega_1$. Furthermore, subjecting this acquisition gradient to multiple oscillations allows one to monitor the actions of a second, direct-domain set of NMR Hamiltonians. This multiple-readout feature opens up the possibility to collect multidimensional NMR correlations within a single scan, irrespective of the details of the NMR experiment under question. At the moment spatial encoding offers the sole approach to the completion of generic nD NMR spectroscopic acquisitions within a single scan; at the same time and within a purely imaging framework, it offers an alternative to ultrafast MRI protocols based on 2D FT, such as EPI.

In addition to enabling the acquisition of multidimensional NMR/MRI data sets within a single scan, the position-dependent encoding of the interactions just described opens up another possibility: the acquisition of high-resolution NMR spectra from bulk samples, even when these are subject to local or global inhomogeneities of the magnetic field. Indeed as we have illustrated in a purely spectroscopic scenario [18, 19] the spatial encoding underlying ultrafast NMR can also be exploited in order to correct, at the time of the spatially-dependent spin excitation, for the effects that field distortions will have at a later time when the signal acquisition will take place. Related compensation principles have also been demonstrated along direct acquisition domains with the introduction of so-called "shim pulses" [20]. These procedures do not entail a betterment of the fields but rather radiofrequency (RF) manipulations, which can address either longitudinal ($B_0$) or transverse ($B_1$) field distortions by manipulations of the phase and/or amplitudes of the pulses.

Nuclear Magnetic Resonance spectroscopy can deliver unique chemical insight in a non-invasive fashion [33]. To do so, however, it demands an extremely high homogeneity from the external magnetic field $B_0$ where the experiment takes place. Field inhomogeneities $\Delta B_0(r) = \gamma \Omega_{inh}(r)$ need to be reduced until made small vis-à-vis the smallest internal shifts or couplings to be measured, when considered over the full sample volume. This translates in demanding that field perfections be better than 1 part in $10^8$ over sample volumes on the order of 1 cm$^3$; a significant challenge requiring serious investments in both the size of the main magnet and the number of auxiliary shimming coils to be used [34]. Moreover instances arise where even the most extensive efforts cannot deliver the required field homogeneity; for example when dealing with samples subject to substantial internal susceptibility distortions, or when dealing with sudden changes in the nature of the medium being examined. All of these are common scenarios in a variety of in vivo NMR spectroscopy experiments [35], where the achievement of high resolution is further aggravated by the relatively low length-to-width ratio of the typical animal or clinical magnet, and by the advent of higher magnetic field strengths requiring an increasing number of higher-order shims to achieve the needed field corrections. An ultimate example of these complications is found in ex situ NMR experiments, whose goal is to obtain high resolution spectroscopic information from objects operating on the basis of single-sided magnets [36].

In an effort to overcome these complications, a number of alternatives have been proposed for collecting high resolution chemical information in the presence of field distortions. One of the first strategies to be demonstrated involved the use of two-dimensional (2D) NMR experiments, where high resolution was achieved by correlating the effects of arbitrary field inhomogeneities at a particular chemical site with identical effects affecting neighboring sites in the spin system [37, 38]. While the reliance of these experiments on relatively weak multi-spin correlations did not endow them with the highest of sensitivities, they showed an advantage over competing proposals in that they dealt equally well with 1D, 2D or 3D $\Omega_{inh}(r)$ distributions. These 2D correlations have therefore served as basis for a variety of high-resolution NMR experiments in inhomogeneous fields [39, 40]. Another compensation approach to remove field inhomogeneities proposed the use of custom-built radiofrequency (RF) coils, whose $B_1$ distortions matched spatially those of the $B_0$ field [41, 42]. Recently a different route for exploiting RF fields to compensate for $\Delta B_0$ inhomogeneities possessing a priori arbitrary spatial dependencies has been described; this involved the combined application of a field gradient spreading out the spins resonance frequencies according to their spatial positions, in conjunction with a suitable train of excitation or refocusing RF pulses whose phases compensate for the cumulative effects of the inhomogeneities [18, 19]. Worth mentioning in connection to this approach yet in a fast-imaging context is also the use of tailored-RF excitation pulses applied in combination with a slice-selection gradient, in order to compensate for susceptibility distortions arising in echo-planar-imaging acquisitions at the instant of the main gradient-echo formation [44, 32].

SUMMARY OF THE INVENTION

The purpose of the present invention is to provide a method and apparatus that enables acquisition of high definition images or high resolution spectral data in inhomogeneous environments. The manner of how this is accomplished will be elaborated upon in the following; further to potential spectral applications, also shall be described the compensating potential of the spatial encoding principle within a purely imaging scenario, where it is positions rather than internal shifts that are being sought. In particular, what will be demonstrated is how the inhomogeneity-compensating capabilities that characterize spatial encoding methods can be combined with a number of NMR data acquisition protocols, enabling the acquisition of high-definition nD MRI images and of nD NMR spectra even when spins are subject to sizable $\Omega_{inh}(r)$ spatial distortions of the ideal $B_0$ static NMR field. In order to facilitate the visualization of how these complementary features come together, one begins by reviewing the principles of the spatial encoding methodology as applied to an ideal NMR/MRI scenario. Then, one proceeds to describe the basis of the compensation procedure in 1D NMR/MRI, and conclude by sketching its extension to higher-dimensional single-scan experiments. All these pre-eminently theoretical treatments are accompanied with demonstrations of their validity, using 1D and 2D NMR/MRI experiments on simple phantoms.

Accordingly, it is a principal object of the present invention to provide a method and apparatus for treating a sample to acquire high-definition multidimensional images and spectra even if under the action of heterogeneities, comprising the steps of: (1) defining the spatial distribution of the active heterogeneities; (2) partitioning a sample into a set of independent subensembles endowed with different resonance frequencies; (3) implementing an irradiation of the sample whereby the various subensembles are selectively manipulated by a series of excitation or refocusing sequences, capable of compensating for the heterogeneities at the time of the data acquisition; (4) applying thereafter, if needed, additional encoding sequences capable of monitoring additional spectroscopic or spatial dimensions from each of the subensembles; (5) monitoring the observable signals arising from the various subensembles, by applying a time-dependent field gradient capable of unraveling (and, if needed be, of further restoring the ideality of) the spatial image; (6) suitably processing the observable signals acquired in this manner into a complete multidimensional image.

In the method described above the partitioning effected during the excitation and/or encoding periods can be effected notionally. Also, it is possible to that the polychromatic irradiation and the resolved detection scheme is selected to suit the particular kind of imaging, including of optical, paramagnetic electron, mass and nuclear magnetic resonance origin. Further, the acquisition of either a single- or a multi-dimensional image can be completed in several scans, and in a preferred embodiment, the acquisition of either a single- or a multi-dimensional image is completed in a single scan.

In the method as described, the corrective encoding is applied sequentially or on the full sample at once. Also, magnetic field gradients are used for exciting, refocusing, and acquiring the image. The magnetic field gradients can be used for compensating for potential spatial inhomogeneities in the course of the excitation or refocusing sequences. The method can be carried out wherein sequences capable of distinguishing between the spatial and chemical origin of the resonance frequencies are effected.

In the method as described above, the corrective spatial encoding procedure may be combined with other image acquisition protocols to obtain a high definition image even in the presence of external field distortions.

The invention further contemplates a method for treating a sample to acquire high-definition magnetic resonance images (MRI images) even in the presence of magnetic field distortions within one or multiple scans, comprising the steps of: (1) quantifying a priori the spatial nature of the field inhomogeneities using any of several literature procedures; (2) applying a static or oscillating magnetic field gradient on the sample so as to endow spins at different positions within the sample with different resonance frequencies; (3) applying a phase- and amplitude-modulated radiofrequency (RF) pulse in unison with this gradient so as to endow spins at different positions within the sample with a homogeneous excitation/inversion profile; (4) tailor the nature of the spatially-selective RF irradiation in such a way that, when added on top of the effects of the inhomogeneities, the spins' evolution phases and their signal amplitudes at the time of the acquisition became independent of the inhomogeneities; (5) capturing the spin signals thus created while using a second set of acquisition magnetic field gradients, which decodes the spins' spatial locations as if the inhomogeneity was not present; (6) subjecting the collected data to a suitable rearrangement and Fourier analysis procedure so as to retrieve the final undistorted image being sought. This method can be carried out wherein the magnetic field gradient oscillates so as to impose the inhomogeneity correction on multiple spatial dimensions simultaneously.

In addition to the foregoing, the purpose of the present invention is to further demonstrate the potential of these gradient-assisted spatially encoded manipulations, towards the acquisition of high resolution NMR spectra in inhomogeneous or unstable fields. To accomplish this one focuses initially on static one-dimensional inhomogeneities, and proceeds to extend the basic spatial encoding framework laid out in the inventors previous work [18,19] to describe a variety of compensating sequences. These include a spatially-continuous indirect-domain single-scan compensation approach, a new kind of "shim pulses" somewhat different in nature from those recently discussed by Pines et al [43], and a novel class of multi-scan 2D compensation experiments. The applications of these techniques are illustrated without loss of generality to 1D and 2D NMR acquisitions, stressing their usefulness and potential as well as their respective limitations. In particular it is shown that the last of the approaches mentioned can considerably alleviate the complications associated to hitherto available sequences, both in terms of the achievable resolution as well as of spectral sensitivity. Possible extensions of all the assessed methods to deal with inhomogeneities in multiple spatial/temporal dimensions are also noted Accordingly, it is another principal object of the present invention to provide a method and apparatus for treating a sample to acquire high-definition uni- and multidimensional spectra even if under the action of heterogeneities, comprising the steps of (1) defining the spatial distribution of the active heterogeneities; (2) partitioning a sample into a set of independent subensembles endowed with different resonance frequencies, for instance via the application of field gradients; (3) implementing an irradiation of the sample whereby the various subensembles are selectively manipulated by a series of excitation or refocusing sequences, capable of compensating for the heterogeneities at the time of the data acquisition; (4) applying thereafter, if needed, additional encoding sequences capable of encoding additional spectroscopic or spatial dimensions from each of the subensembles; (5) monitoring the observable signals arising from the various subensembles; (6) suitably processing the observable signals acquired in this manner into a complete spectrum and/or image.

In addition, the method may include partitioning effected during the excitation and/or encoding periods is effected notionally. Also, the polychromatic irradiation and the data detection scheme can be selected to suit the particular kind of spectroscopy desired, including of optical, paramagnetic electron, mass and nuclear magnetic resonance origin. Further, acquisition of either a single- or a multi-dimensional spectrum can be completed in several scans. Still further, the corrective encoding is applied sequentially or on the full sample at once. In the practice of the method and the apparatus, the magnetic field gradients are used during the excitation and/or refocusing of the system, and during the data acquisition period. The magnetic field gradients can be used for compensating for potential spatial inhomogeneities in the strengths of the excitation, refocusing or detection sequences. Also, the corrective spatial encoding procedure may be combined with other data acquisition protocols to obtain a high resolution spectrum even in the presence of external field distortions.

The present invention also contemplates a method and apparatus for treating a sample to acquire high-resolution nuclear magnetic resonance spectra (NMR spectra) even in the presence of magnetic field distortions within one or multiple scans, comprising the steps of: (1) quantifying a priori the spatial nature of the field inhomogeneities using any of several literature procedures; (2) applying a static or oscillating magnetic field gradient on the sample so as to endow spins at different positions within the sample with different resonance frequencies; (3) applying a phase- and amplitude-modulated radiofrequency (RF) pulse in unison with this gradient so as to endow spins at different positions within the sample with a homogeneous excitation/inversion profile; (4) tailor the nature of the spatially-selective RF irradiation in such a way that, when added on top of the effects of the inhomogeneities, the spins' evolution phases and their signal amplitudes at the time of the acquisition became independent of the inhomogeneities; (5) capturing the spin signals thus created as a coherent superposition of the spins' from all spatial locations, as if the inhomogeneity was not present; and (6) subjecting the collected data to a suitable rearrangement and Fourier analysis procedure so as to retrieve the final undistorted spectrum being sought. The magnetic field gradient can be oscillated so as to impose the inhomogeneity correction on multiple spatial dimensions simultaneously.

Other and further objects of the present invention will become evident from the following detailed description of the invention when taken in conjunction with the appended drawings.

BRIEF DESCRIPTION OF THE DRAWINGS

FIG. 1 shows schematically and graphically a comparison of schemes capable of yielding MR profiles ρ(z) from a 1D sample. FIG. 1(A) illustrates a conventional scheme where a gradient-driven k-domain S(t) echo is monitored following a hard pulse, leading after FT to the 1D profile. FIG. 1(B) illustrates a non-FT scheme where positions are initially encoded via the application of a frequency-swept excitation pulse, and subsequently read out via the application of a decoding gradient. FIG. 1(C) illustrates Idem as in FIG. 1(B), but with the encoding phase profile resulting from an adiabatic π-sweep which follows the initial hard-pulse excitation of the spins.

FIG. 2 shows schematically and graphically an experimental illustration of the capability of the various pulse sequences introduced in FIG. 1 to afford 1D profiles of a sample. The phantom used in these experiments consisted of a uniform water-based polyacrilamide gel filling a 5 mm NMR tube, doped near its center with a $CoCl_2$ solution. The observation coil was nearly 18.5 mm in length, and the paramagnetic dope led to a low signal-intensity region ca. 3 mm long. FIG. 2(A) shows the profile arising by FT of an echo FID recorded under the action of a −5 G/cm longitudinal gradient, digitized over 5 ms using a 10 µs dwell time. A 2.5 ms long gradient pulse with $G_{prg}$=5 G/cm and a 5 ms free evolution time (to enhance the $T_2$ contrast) were introduced prior to the acquisition. FIG. 2(B) shows the profile arising from taking the absolute value of an FID collected with $G_e$=−$G_a$=5 G/cm, 5 ms long excitation ($\tau_p$) and acquisition ($T_a$) times, and a 2 µs acquisition dwell time. A $\pi/2$ chirped RF pulse sweeping over ±21.5 kHz with an amplitude $\gamma B_1 \approx 750$ Hz was used for the spatial encoding, and a 5 ms free evolution delay inserted prior to the actual data decoding. FIG. 2(C) illustrates Idem as in FIG. 2(B), but with the encoding arising from a 2.5 ms long, 1600 Hz strong $\pi$ inversion pulse, applied following a hard-pulse excitation.

FIG. 3 shows schematically and graphically examples of different schemes that, with the aid of spatial encoding principles, can afford 2D MRI profiles within a single transient. FIG. 3(A) illustrates a hybrid scheme introduced in Reference [17], relying on an initial $G_e$-driven encoding along one axis coupled to repetitive decoding echoes separated by small phase increments along the orthogonal direction. FIG. 3(B) illustrates a hybrid scheme were the roles of FIG. 3(A) have been reversed, and a single spatial decoding is interrupted by numerous repetitive k-domain acquisitions. FIG. 3(C) illustrates a purely spatial encoding alternative, where following an initial $\pi/2-\pi$ encoding along orthogonal axes the image is rasterized along a zigzag trajectory. FIG. 3(D) illustrates a spatial encoding alternative whereby the profile is rasterized by an outward-expanding spiral trajectory. Shown for clarity are the k/r-space trajectories executed in each case, with dots representing the digitized data points.

FIG. 4 shows schematically and graphically results obtained upon applying different single-scan 2D imaging protocols on a water-filled 5 mm NMR tube, with z representing the long axis of the sample. Shown on top views are magnitude plots of the time-domain signal as collected in the spectrometer; the center row of views illustrates the same data after being correctly rearranged in their corresponding k/r spaces; plotted on the bottom views are the 2D images arising from suitable FT (1D for FIG. 4(A) and FIG. 4(B); 2D for FIG. 4(C)) of these rearranged data. FIG. 4(A) illustrates experiment acquired using the hybrid $z/\Delta k_x$ encoding depicted in FIG. 3(A) with $G_e=5$ G/cm, $\tau_p=5$ ms, $k_x^{max}=1.6$ mm$^{-1}$, $G_a=26$ G/cm, $N_2=16$. FIG. 4(B) shows an experiment acquired using the hybrid $k_x/\Delta z$ encoding depicted in FIG. 3B with: $G_e=5$ G/cm, $\tau_p=5$ ms, $k_x^{max}=1.6$ mm$^{-1}$, $N_2=16$, $k_x$ scanning times of 950 µs, and $\Delta z$ increments arising from pulsing 15 G/cm gradients over 50 µs. FIG. 4(C) shows a 2D EPI experiment arising from a sequence akin to that in FIG. 3(B) except for the fact that the initial excitation preceded the first gradient and was given by a hard $\pi/2$ pulse; other acquisition parameters involved $G_e=1$ G/cm, $\tau_p=1$ ms, $k_x^{max}=5.8$ mm$^{-1}$, $G_a^x=\pm14.5$ G/cm, $G_a^z=1.2$ G/cm, $N_2=16$. In all experiments data were digitized at 40 kHz.

FIG. 5 shows schematically and graphically results obtained upon applying the purely spatial encoding single-scan 2D variants illustrated in FIG. 3(C), FIG. 3(D), to the same water profile exemplified in FIG. 4. Unlike those earlier examples only rearrangements of the collected data—no FTs—were involved in the image retrieval. The spatial encoding used in FIG. 5(A) employed 5 ms $\pi/2$ and $\pi$ chirped pulses applied in the presence of $G_e^z=5$ G/cm, $G_e^x=2.5$ G/cm respectively; decoding used an effective $G_a^x=0.4$ G/cm, $G_a^z=25$ G/cm, $N_2=16$. The spatial encoding in FIG. 5(B) was imposed (along both axes) by applying 5 ms long adiabatic $\pi$ pulses while in the presence of 4 G/cm gradients; the decoding involved 8 oscillations reaching to a maximum gradient of 15 G/cm. Notice in this latter case the absence of the clear (x,z) profiles observed in FIG. 5(A)'s 1D time-domain signal, as well as of the "ribs" characterizing the 2D image in FIG. 5(A) along the z axis.

FIG. 6 shows schematically and graphically experimental demonstration of the field-compensating principles described in this invention, for the case of the 1D phantom introduced in FIG. 2. FIG. 6(A) and FIG. 6(B) illustrate FT and spatially-encoded profiles collected from the phantom under conditions similar to those detailed in that FIG. 5 regarding G/cm excitation and acquisition gradients, 10 ms average free-evolution times, 18.5 mm long samples, etc. FIG. 5(C) and FIG. 6(D) illustrate Idem as in FIG. 6(A) and FIG. 6(B), but upon subjecting on the sample an artificial $\Omega_{inh}(z)=1.31z-0.193z^2$ kHz (with z the displacement away from the sample's center in mm). This inhomogeneity was introduced by distorting the z, $z^2$ magnet shims, and was characterized by mapping the water resonance using a simple gradient-echo sequence. FIG. 6(E) illustrates Idem as in FIG. 6(D), but after inserting the mapped inhomogeneity profile into the algorithm described in Paragraph 3.1, recalculating from it the correcting RF sweep and acquisition gradient patterns, and applying these for the acquisition of the data. The most remarkable feature of this compensation procedure (and therefore a basic test of its correct functioning) is the fact that it enabled the signal to perdure (last a long time) in the time domain, long after either the conventional k-space or its analogous spatially-encoded signal have both decayed into the background noise. This, in spite of $\Omega_{inh}$ spanning over 25 kHz and of the experiment still requiring $G_e=-5$ G/cm, and an average $G_a=+4.13$ G/cm over the acquisition. Notice that although still not ideal, the "wiggles" exhibited by this experimental $\Omega_{inh}$-compensated profile are akin to those of its homogeneous counterpart in FIG. 6(B). Simulations indicate that these reflect in both cases limitations of the chirped excitation pulse in delivering the desired profile, rather than in an actual failure of the compensation procedure.

FIG. 8 shows schematically and graphically an experimental illustration of different artifacts affecting the field-compensating principles described in this invention, collected under the conditions depicted in FIG. 6 for the same 1D phantom.

FIG. 10 shows schematically and graphically an experimental demonstration of the field-compensating principles described in this invention, for the case of a two-dimensional acquisition on the phantom sample introduced in FIG. 2. FIG. 10(A) shows a single-scan 2D FT EPI image recorded using a blipped read-out of 32 echoes spread over 32 ms; acquisition gradients were $G_a^x=+15$ G/cm and $G_a^z=0.85$ G/cm (pulsed over 50 µs every 950 µs). FIG. 10(B) shows a single-scan 2D spatially-encoded image collected using a zigzagging scheme as in FIG. 5(A) except for $G_e^x=G_e^z=4$ G/cm; $G_a^x=\pm 25$ G/cm and $G_a^z=0.5$ G/cm. FIG. 10(C) and FIG. 10(D) illustrate Idem as in FIG. 10(A) and FIG. 10(B) but upon subjecting the sample to the artificial $\Omega_{inh}(z)$ illustrated in FIG. 11(A). FIG. 10(E) illustrates Idem as in FIG. 10(D) but after inserting the mapped inhomogeneity profile into the algorithm described herein, calculating from it the correcting RF sweep and acquisition gradient patterns, and applying it for the acquisition of the data. Illustrated in FIG. 11 are the main parameters used for implementing this correction, as well as a comparison between the raw data sets arising with and without the use of such correction.

FIG. 11 shows schematically and graphically a comparison in FIGS. 11(B) to 11(D) between various parameters involved in the acquisition of the inhomogeneity-compensated image shown in FIG. 10(E) (full lines), and the ones that would have been used for an equivalent acquisition in the absence of inhomogeneities (dashed lines). The actual experiment involved a 2D spatially-encoded sequence utilizing a zigzag decoding (FIG. 3(D)) with $N_2=8$, and assumed FOVs=23 mm (z)×6 mm (x). Both encoding gradients were set at 4 G/cm and encoding times at 4 ms; the field inhomogeneity shown in FIG. 11(A) was mapped and assumed in the compensation calculations.

FIG. 12 shows schematically and graphically for a further embodiment of the invention, in which strategies are illustrated that are capable of yielding high resolution spectra with compensated field inhomogeneities within a single scan, by means of the combined application of shaped RF pulses and refocused field gradients. FIG. 12(A) shows discrete spatially-encoded strategy illustrated in Ref. [18], yielding a compensated $t_1$ evolution by means of RF phase manipulations. FIG. 12(B) shows a scheme relying on shaping the offset of two continuously-chirped RF pulses, and imposing an $\Omega_{inh}$-compensated longitudinal pattern at the conclusion of the indirect domain evolution: FIG. 12(C) shows a direct-domain compensation scheme involving the application of two consecutive adiabatic inversions plus an extra linear gradient, shaped so as to refocus inhomogeneities within each dwell time $\Delta t_2$. Unlike the cases shown in FIGS. 12(A) and (B), FIG. 12(C) requires a Fourier transform of the data rather than the application of an acquisition gradient $G_a$, for the sake of reading out the spectral information.

FIG. 13 shows schematically and graphically in FIG. 13(A) a high-resolution $^1$H NMR spectrum of the n-Butylchloride/CDCl$_3$ solution used as target for assaying the $\Omega_{inh}$ compensation procedures. FIG. 13(B) illustrates an example of the artificial broadening introduced by miss-dialing the $\{\hat{z}^i\}_{i=1-5}$ values in the spectrometer's shim coils, shown as plots of the frequency of each site vs its axial position within the sample.

FIG. 14 shows schematically and graphically an experimental demonstration of the performance of the single-scan compensation schemes illustrated in FIGS. 12(B) and 12(C), to compensate for 1D $\Omega_{inh}(r)$ inhomogeneities. FIG. 14(A) illustrates an artificially broadened spectrum of the target sample obtained following a single-pulse $\pi/2$ excitation. FIG. 14(B) shows results from the $\pi/2-\pi/2$ continuous spatial encoding along $t_1$. FIG. 14(C) illustrates Idem but for a train of $\pi-\pi$ corrections applied in-between each sampled point along $t_2$.

FIG. 15 shows schematically and graphically examples of data sets collected upon merging the strategies illustrated in FIGS. 12(B) and 12(C), into the unified single-scan 2D acquisition scheme shown on top. FIG. 12(A) illustrates a mixing-less trace displaying a purely diagonal correlation. FIG. 12(B) illustrates Idem upon introducing a 60 ms long DIPSI-based isotropic mixing period. Experimental parameters were identical as those mentioned in connection to FIG. 14; the different appearances along the indirect- and direct-domains are mostly a consequence of the different scalings characterizing the two $\Delta B_0$ compensation sequences.

FIG. 16 shows schematically and graphically in FIG. 16(A) a novel scheme proposed for the refocusing of field inhomogeneities in a two-dimensional fashion, incorporating a spatially-encoded correction based on a polychromatic excitation triggering the $t_1$, followed by a CPMG-type acquisition for signal enhancement happening over $t_2$. FIG. 16(B) shows experimental time-domain results obtained with the pulse sequence shown in FIG. 16(A) on the artificially broadened sample shown in FIG. 14(A); compare the time decays arising along these two axes with the one displayed for the same sample upon applying a conventional excitation (FIG. 17(A)). For all the 360 increments making up the resulting 2D data set, a polychromatic irradiation was built from 173 individual frequency components equally spaced over a ≈475 kHz spread, achieved by the application of a 60 G/cm gradient along the sample tube's $\hat{z}$ direction. The phases of the individual frequency components making up such compensating pulse were tailored according to the recipe in eq. 76, with the $t_1$ parameter incremented in 500 µs steps. Notice that the homonuclear J modulation, with a period of ca 140 ms, is clearly discernible along both time domains. FIG. 16(C) shows 2D chemical/shift—J coupling correlation spectrum arising from a suitable two-dimensional processing of the data set shown in FIG. 16(B). For the sake of simplicity this spectrum was retrieved from solely a single set of the points digitized during $t_2$, corresponding schematically to the positions indicated by the star. Sensitivity could be improved by processing all points within each $\Delta t_2$ period in a similar fashion, and then co-adding the resulting 2D spectra. As its time-domain counterpart FIG. 16(B), this 2D frequency spectrum is shown in magnitude mode. Introducing field gradients during $t_1$ and neglecting the internal shifts/couplings transforms this route into an imaging approach immune to field inhomogeneity effects.

FIG. 17 shows schematically and graphically a comparison between: FIG. 17(A) showing the single-pulse data $S(t)/I(\Omega_1)$ arising from the inhomogeneously-broadened n-Butylchloride/CDCl$_3$ sample; and FIG. 17(B) showing the $S(t_1)/I(\Omega_1)$ results achievable upon applying on the same sample the polychromatic 2D correction scheme of the present invention. These Clatter traces correspond to a time-domain slice/frequency-domain projection of the 2D data shown in FIG. 16, along the indirect dimension.

DETAILED DESCRIPTION OF PREFERRED EMBODIMENTS OF THE INVENTION

Incorporation By Reference

Figure 7:
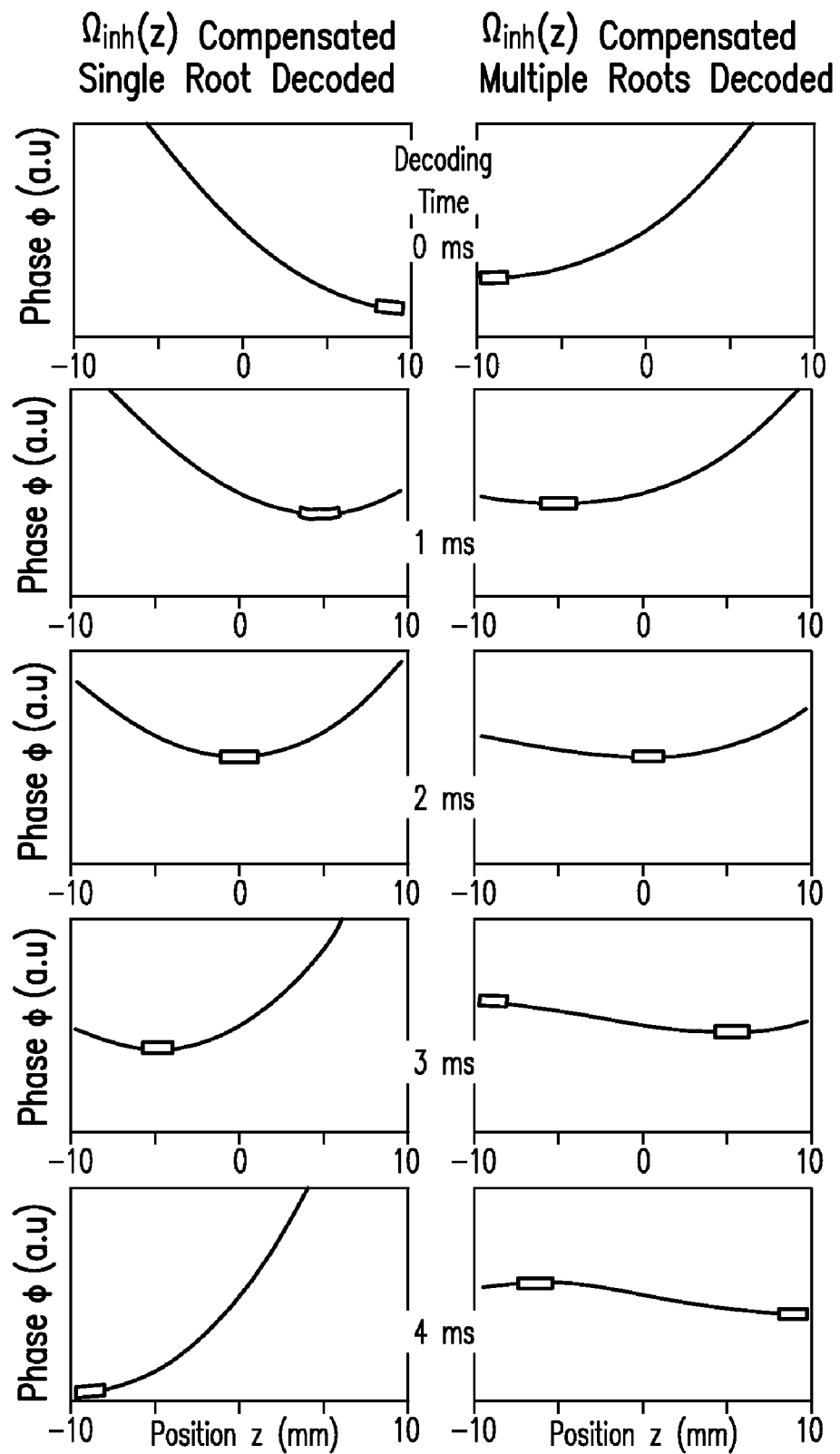
FIG. 7 shows schematically and graphically the graphical explanation of how the onset of multiple roots limits the proposed method of spatially-encoded field compensation. Shown on the left- and right-hand columns are numerically calculated profiles describing the evolution of phase encoded within a $-9 \leq z \leq 9$ mm long sample, as a function of the data acquisition time. In both cases the samples were assumed to have been excited with 4 ms long $\pi/2$ chirped pulses and constantly subject to an inhomogeneity $\Omega_{inh}(z)=1.4z^2$ (in kHz and mm); an (encoding gradient $G_e=-9.4$ G/cm was used in the left-column case while $G_e=+9.4$ G/cm for the right-hand scenario. The compensating algorithm described in the specification was used in both instances, leading to detectable signals corresponding to the stationary-phase voxels indicated in all graphics by the thicker red traces. Notice that whereas in both cases the algorithm leads to an unraveling of the sample that proceeds, as desired, linearly in time, longer evolution times lead in the right-hand column to the appearance of a second region of flat phase whose signal will also contribute to the FID. As detailed in the specification and illustrated in this figure, such artifacts can be avoided by a judicious choice of the encoding/decoding conditions, or by suitable filtering of the data according to its constituent frequencies.

The inventor(s) hereby incorporate by reference in their entirety the following documents previously filed: Provisional Appl. Ser. No. 60/398,822 filed Jul. 26, 2002; International Patent Appl. PCT/US2003/021314 filed Jul. 7, 2003; and International Patent Appl. PCT/US2004/040449 filed Dec. 3, 2004.

Spatial Encoding: Single-Scan nD MRI Acquisitions in Homogeneous Fields

Spatial Encoding in One Dimension.

Before dwelling on the potential opened up by spatial encoding towards the acquisition of undistorted images in inhomogeneous fields, we briefly review the basis of spatial encoding as it applies to single-scan nD MRI acquisitions. Moreover we begin with the simplest of cases: the mapping of a unidimensional spin-density profile ρ along a single axis z. Whereas the spatial encoding experiment underlying this kind of acquisition is not very different from that underlying conventional Fourier imaging (FIGS. 1A, 1B), their physics actually are. This distinction arises from the fact that in conventional k-space MRI spins are homogeneously excited via the application of a single hard pulse, whereas spatial encoding relies on imparting on the spins an initial spatially-dependent phase $\phi_e(z)$. One possible way of achieving this is by exciting the spins using a selective RF pulse, whose offset O is swept while in the presence of an excitation gradient $G_e\hat{z}$. This pulse will address spins sequentially according to their coordinate z at times τ(z) when the RF offset O matches the spin's resonance frequency ω(z); i.e., $$O[\tau(z)] = \omega(z) = \gamma G_e z + \Omega_1 \quad (1)$$

where $\Omega_1$ is the site's chemical shift. For the simplest case of an offset being swept at a constant rate R between initial and final values $O_i$, $O_f$, the instant at which the RF will address spins at a coordinate z will be given by $$\tau(z) = \frac{\Omega_1 + \gamma G_e z - O_i}{R} \quad (2)$$

The overall position-dependent phase $\phi_e(z)$ accumulated over the course of such sweep can be expressed (apart from an arbitrary phase constant) as $$\phi_e(z) = \phi_{RF}[\tau(z)] + (\tau_p - \tau_z) \cdot \omega(z) \quad (3)$$

where $\tau_p$ is the overall duration of the frequency chirped pulse, and $$\phi_{RF}[\tau(z)] = \int_0^{\tau(z)} [O_i + Rt']dt' \quad (4)$$

reflects the rotating-frame phase of the pulse at each instant τ(z). This contribution to $\phi_e$ is imparted onto spins positioned at any given coordinate z through the effects of the RF nutation, whereas the additional contribution to $\phi_e$ arises from the free evolution of the spins once they have been excited. The expression for $\phi_e$ can be further simplified by assuming an on-resonance single-site instance, and initial/final RF offsets chosen so as to excite a sample of physical length L. These two conditions can be summarized as $$\Omega_1 = 0 \quad (5a)$$

$$O_i = -O_f = -\gamma G_e L/2, \quad (5b)$$

and lead to an overall phase encoding[2]

[2] Constant terms appearing in phase expressions are usually irrelevant, and when mentioned it is mostly for completeness.

$$\phi_e(z) = \frac{\gamma G_e L \tau_p}{8} + \left(\frac{\gamma G_e \tau_p}{2}\right)z - \left(\frac{\gamma G_e \tau_p}{2L}\right)z^2. \quad (6)$$

This expression is to be contrasted with the conventional MRI post-excitation phase, which is simply a z-independent constant. When the FID arising from such homogeneously-excited spin ensemble is subject to digitization under the presence of a constant $G_a\hat{z}$ acquisition gradient, the result $$S_{conv}(t) \propto \int_{allz} dz \rho(z) \cdot e^{i\gamma G_a z t} \quad (7)$$

is clearly Fourier conjugate to the spin density profile ρ(z) viewed as a function of the extraction variable $$k = \gamma \int_0^t G_a(t')dt' = \gamma G_a t. \quad (8)$$

FT against k is thus needed as part of the image-formation process. By contrast, when a spin ensemble that has teen spatially-encoded as in eq. 6 is subject to a similar acquisition process, the resulting FID $$S_{s-e}(t) \propto \int_{allz} dz \rho(z) \cdot e^{i\phi_e(z)} e^{ik(t) \cdot z} \quad (9)$$

will already reflect an implicit k-dependent Fourier analysis of the encoded magnetization profile. Indeed the z-dependence in $\phi_e(z)$ implies that most spins will not contribute to this signal at any given time; the exception will arise from those spins located at z coordinates where the stationary condition for the overall acquisition phase $$\Phi(z,t)=\phi_e(z)+k(t)z \quad (10)$$

is satisfied. In other words the signal for any value k(t) will arise only from those spins located at a $z_k$ coordinate, such that $$\frac{d}{dz}[\phi_e(z)+k(t)z]_{z=z_k} = 0. \quad (11)$$

Based on the expression in eq. 6 for $\phi_e(z)$ there is only one solution to this condition, and it is:

$$z_k = \frac{L}{2} - \frac{R}{(\gamma G_e)^2} \cdot k(t). \quad (12)$$

Furthermore, for the case of this acquisition being implemented by a constant gradient applied over a time $T_a$ chosen so as to unravel the full extent of the initial encoding (i.e., $G_a T_a = G_e \tau_p$), eq. 12 can be simplified into $$z[k(t)] = \frac{L}{2} - \frac{L}{T_a} \cdot t. \quad (13)$$

The signal detected in this fashion for a particular k-value can be explicitly described by expanding the overall acquisition phase around the relevant extremum:

$$\Phi(z) \approx \Phi(z_k) + \frac{1}{2}\left(\frac{d^2\Phi}{dz^2}\right)_{z=z_k} (z-z_k)^2. \quad (14)$$

Inserting this into eq. 9 results in the FID $$S_{s\text{-}e}(t) \propto e^{i\Phi(z_k)} \rho(z_k) \int_{z\approx z_k} dz \exp\left[i\left(\frac{d^2\Phi}{dz^2}\right)_{z=z_k} (z-z_k)^2/2\right] \quad (15)$$

which, relying on the identity $$\int_{-\infty}^{\infty} dz\, e^{iaz^2} = \sqrt{\frac{\pi}{2|a|}}\,[1+i\,\text{sgn}(a)], \quad (16)$$

leads to a signal having an absolute value $$|S_{s\text{-}e}(t)| \propto \sqrt{\frac{2\pi}{\left|\frac{d^2\Phi}{dz^2}\right|_{z=z_k}}} \rho(z_k) \quad (17)$$

Eqs. 13 and 17 mean that the time-domain signal will in this case probe the spins' density $\rho(z)$ in a one-to-one fashion, interrogating spins from the position that was excited last (assumed to be $z_f=L/2$) and walking its way "backwards" to the position that was first excited by the frequency chirp ($z_i=-L/2$). As for the weighting factor appearing in the collected FID, $$\sqrt{\frac{2\pi}{\left|\frac{d^2\Phi}{dz^2}\right|_{z=z_k}}} = \sqrt{\frac{2\pi}{\left|\frac{d^2\phi_e}{dz^2}\right|_{z=z_k}}} = \frac{\sqrt{|2\pi R|}}{|G_e|}, \quad (18)$$

it defines the spatial extent $\Delta z$ that will contribute to a particular $\rho(z_k)$ voxel or, in other words, the spatial resolution of the method. An important feature of this parameter is its independence on position z and on the acquisition variables k/t. This in turn is what guarantees that an undistorted profile $\rho(z)$ will arise simply by monitoring the intensity of the FID signal as a function of time.

For the sake of completion it is worth reviewing a second spatial encoding alternative, this one arising from the action of a frequency-swept π-pulse driving an inversion of the spins coming in the wake of an initial, homogeneous hard-pulse excitation (FIG. 1C). Following the arguments above as well as guidelines described elsewhere [21,22], one can estimate the overall encoding imparted during the course of such inversion pulse as $$\phi_e(z) = -\tau_z \cdot \omega(z) + 2\phi_{RF}(\tau_z) + (\tau_p - \tau_z) \cdot \omega(z). \quad (19)$$

On comparing this (expression with its analogue for the case of a frequency-chirped π/2 excitation (eq. 3) we notice an additional term $-\tau_z \cdot \omega(z)$ reflecting the encoding accumulated prior to the instant $\tau_z$ when the π inversion pulse reached an offset $\omega(z)$, and a doubling of the net $\phi_{RF}$-influence. Following the same assumptions as before ($\Omega_1=0$; $O_i=-O_f=-\gamma G_e L/2$; $R=\gamma G_e L/\tau_p$) this encoding phase can be written as $$\phi_e(z) = -\frac{\gamma G_e L \tau_p}{4} - \left(\frac{\gamma G_e \tau_p}{L}\right) z^2. \quad (20)$$

Main distinctions thus resulting between this π-driven encoding and that arising from its π/2 counterpart (eq. 6) include the absence of a linear term, and a doubling of the quadratic coefficient. The first of these features implies that upon imposing the stationary phase approximation the decoded positions will be given by $$z[k(t)] = -\frac{2R}{(\gamma G_e)^2} \cdot k(t). \quad (21)$$

The initial position thus rasterized will correspond to the center of the sample, meaning that the full field-of-view (FOV) will be missed by the signal acquisition process unless an initial "purging" gradient pulse $k_{prg}=-\gamma G_e \tau_p/2$ is first applied. As for the second of these features it implies that, given identical conditions, the π-driven encoding will be characterized by a voxel size that is $\sqrt{2}$ time smaller (i.e., by a $\sqrt{2}$ higher resolution) than its π/2 encoding counterpart.

These expressions summarize the main features of 1D spatially-encoded MRI; FIG. 2 exemplifies their experimental realization as applied to the profiling of a simple water phantom. Several features of this acquisition method had been presented in part in an earlier publication [17];[3] also compared there in further detail were issues concerning the overall sensitivities and demands on field gradients of the conventional vis-à-vis the spatially-encoded imaging approaches. It was then concluded that whereas the former could be made comparable, conventional imaging makes a more efficient use of its excursion along the k-domain—monitoring signals from all voxels in the sample at once, rather than unraveling them in a voxel-by-voxel fashion. It follows that for a given number $N_k$ of spatial elements, the wavenumber $k_{max} = G_a T_a$ to be used in the spatial encoding case has to exceed its conventional counterpart by a factor $\sqrt{N_k}$. This may often be a serious complication yet not always will it be an incapacitating one; for instance along the readout dimension of a single-scan 2D EPI experiment, where gradients may have to be chosen small due to sampling rather than due to hardware requirements. Another main difference between the methodologies is given by the built-in capabilities of the spatial encoding to compensate experimentally for field distortions, as further discussed herein. Before going into this aspect, however, we briefly describe how the 1D spatial encoding principle described can be extended to single-scan acquisitions in multiple dimensions.

[3] In that previous 2D-oriented publication the encoding time $\tau_p$–$\tau$ was referred to as $t_1$ and the acquisition time $t$ as $t_2$.

Spatially-Encoded Single-Scan Multidimensional MRI.

As in traditional FT MRI, the spatial encoding procedure just described retrieves its imaging information by relying on the application of a field gradient. Since gradient effects can be reversed with a nearly complete efficiency within arbitrarily short periods of time, spatial encoding will enable—as EPI does—to monitor spin distributions along multiple dimensions in an "ultrafast" fashion; i.e., within a single continuous acquisition. Such an extension to multiple dimensions does not necessarily imply that all domains to be explored need to be spatially encoded: performing the spatial encoding procedure along a given axis does not preclude the use of a conventional Fourier encoding along another orientation. Without attempting to present an exhaustive description of possibilities, FIG. 3 exemplifies this flexibility by presenting four different non-EPI approaches to the collection of 2D NMR images within a single scan. Also included in this Figure are cartoons depicting the different kinds of r/k-domain scannings that occur in each scheme. Panel (A) presents a sequence where spins that have been spatially encoded along one axis, have their 1D profiles repeatedly rasterized during the course of the acquisition while another gradient incrementally "blips" their phases along an orthogonal domain. Panel (B) is another r/k-encoding hybrid, where it is the spatial encoding dimension that now gets incrementally unraveled while the orthogonal axis is repeatedly imaged in reciprocal space via the application of a strong oscillatory gradient. FIG. 3C is a purely spatially-encoded 2D MRI possibility where orthogonal quadratic encoding phases are generated by frequency-swept excitation ($\pi/2$) and inversion ($\pi$) pulses, applied consecutively while under the action of corresponding gradients. Panel (D) is another pure spatially-encoded alternative where a different quadratic pattern was generated by applying a pair of adiabatic $\pi$ inversions following an initial homogeneous excitation, and the ensuing spatial encoding is subsequently unraveled in an out-spiraling fashion.

The hybrid cases depicted in FIGS. 3A and 3B combine a unidimensional spatial encoding along one of the dimensions, with a conventional k-domain encoding along an orthogonal axis. The image formation process underlying these sequences can thus be directly derived from the unidimensional arguments that were given in the previous paragraph (eqs. 7 and 9), if applied along orthogonal dimensions. Presented in FIGS. 4A and 4B are experimental realizations of these two procedures, including for clarity some of the intermediate processing stages. Both of these experiments involved the continuous acquisition of a single-scan FID containing data in the mixed spatial—/wavenumber—domain $(z,k_x)$; these data had to be suitably rearranged prior to its further processing. In the (A) case this entailed a splicing of the individual z profiles, and their suitable rearrangement in a 2D matrix (including alternating reversals of the even/odd images) as a function of monotonically increasing $k_x$ values. In (B) by contrast, the $S(k_x)$ echoes were the ones which had to be spliced, reversed, and subsequently positioned in a 2D matrix as a function of a monotonically rasterized z coordinate. Finally, in both cases, a 1D FT along the $k_x$ dimension—preceded and/or followed by suitable ancillary manipulations such as zero-filling, weighting, echo alignment procedures, magnitude calculations, etc.—are needed for obtaining the full 2D image. Presented for completion in FIG. 4C is a single-scan image collected using a traditional blipped k-space EPI encoding.

FIGS. 3C and 3D present alternative approaches to single-scan 2D imaging, this time based entirely on spatial encoding principles. The first of these cases involves an initial $\pi/2$ excitation pulse chirped while in the presence of a $G_e^z \hat{z}$ gradient, followed by a $\pi$ sweep executed while under the action of $G_e^x \hat{x}$. As a result of the spin inversion associated with the RF $\pi$ pulse the total encoding then becomes a difference between eqs. 20 and 6:

$$\phi_e(x, z) = \left[-\frac{\gamma G_e^x L_x \tau_p^x}{4} - \left(\frac{\gamma G_e^x \tau_p^x}{L_x}\right)x^2\right] - \left[\begin{array}{c} -\frac{\gamma G_e^z L_z \tau_p^z}{8} + \\ \left(\frac{\gamma G_e^z \tau_p^z}{2}\right)z - \left(\frac{\gamma G_e^z \tau_p^z}{2L_z}\right)z^2 \end{array}\right]. \quad (22)$$

Application of the EPI-type decoding scheme illustrated in FIG. 3C will thus yield an FID whose magnitude records the $\rho(x,z)$ sample profile in real space, starting from one end of the sample and then rastering the object along a zigzag trajectory towards the opposite corner. FIG. 5A presents an experimental example of the corresponding image, once again collected for a simple cylindrical water phantom. Notice in it a "ribbed" structure along the z direction, associated to the relatively coarse zigzag chosen for this particular acquisition. By contrast to eq. 22, the encoding procedure illustrated in FIG. 3D will result on the purely quadratic form $$\phi_e(x, z) = \text{constant} - \left(\frac{\gamma G_e^x \tau_p^x}{L_x}\right)x^2 + \left(\frac{\gamma G_e^z \tau_p^z}{L_z}\right)z^2. \quad (23)$$

The initial $(x_0, z_0) = (0,0)$ coordinate at which the ensuing decoding will thus begin, makes this approach particularly well suited for a spiral-like decoding involving oscillating and time-incremented orthogonal gradients. FIG. 5B illustrates a phantom image obtained in this fashion. Notice that by contrast to its FIG. 5A counterpart, no details regarding a coarse rasterization of the image are evident. A point worth remarking again in connection to the spatially-encoded acquisitions displayed in FIGS. 5A, 5B, is that no Fourier processing was needed for arriving to these single-scan 2D images. Therefore the absence of an equidistant grid of points within the bidimensional FIDs afforded by these spatially-encoded procedures constitutes a minor graphic-display inconvenience rather than, as is the case for FT-based k-domain acquisitions, an actual problem to be solved by sophisticated numerical algorithms [1,23].

FIG. 5 exemplifies just two out of the numerous strategies by which purely spatially-encoded MRI procedures could be used to retrieve multidimensional images. Other possibilities involving two or three dimensions, $\pi/2$ or $\pi$ encoding pulses, etc.; can also be conceived. As long as one assumes an ideal decoherence-free spin system, the in-plane rotating-frame magnetization patterns that will arise prior to the signal acquisition from any of these encoding procedures will be given by $$M_{xy}(r) = \rho(r) e^{i\phi_e(r)}, \quad (24)$$

where $$\phi_e[r = (x, y, z)] = \sum_{\alpha = x,y,z} (a_\alpha + b_\alpha \cdot \alpha + c_\alpha \cdot \alpha^2) \quad (25)$$

is the quadratic excitation phase encoded by the action of the chirped pulses along the multiple spatial dimensions. In parallel to eq. 9, the FID arising upon such pattern while executing a multidimensional "walk" through k-space, $$S_{s-e}(t) \propto \int\!\!\!\int\!\!\!\int_{\text{all } r} dr \rho(r) \cdot e^{i\phi_e(r)} e^{ik(t) \cdot r}, \quad (26)$$

will reflect the rasterized $\rho(r)$ spatial profile of the spins. The particular coordinate $r_{k(t)}$ decoded for a given k(t) value, will be the one fulfilling the 3D stationary phase condition $$\nabla_r[\phi_e(r) + k(t) \cdot r]_{r=r_k} = (0,0,0) \Leftrightarrow \quad (27a)$$

$$k_\alpha = -b_\alpha - 2c_\alpha \cdot \alpha. \quad (27b)$$

An extension of the one-dimensional Taylor-expansion arguments given for the 1D case (eq. 15) can also yield the spatial resolution of the ensuing $|S_{s-e}(t)| \propto \rho(r_k)$ voxel element. In the 3D case this will be related to the determinant of the Hessian matrix $$\{Q_{ij} = D_{ij}[\phi_e(r) + k(t) \cdot r]\}_{i,j=x,y,z}; \quad D = \begin{pmatrix} \frac{\partial}{\partial xx} & \frac{\partial}{\partial xy} & \frac{\partial}{\partial xz} \\ \frac{\partial}{\partial yx} & \frac{\partial}{\partial yy} & \frac{\partial}{\partial yz} \\ \frac{\partial}{\partial zx} & \frac{\partial}{\partial zy} & \frac{\partial}{\partial zz} \end{pmatrix}, \quad (28)$$

when evaluated at the particular coordinate $r_k$. Based on eq. 27 this yields $$|S_{s-e}(t)| \propto \sqrt{\frac{(2\pi)^3}{|\det(Q)|_{r=r_k}} \rho(r_k)} \quad (29a)$$

$$= \prod_{\alpha=x,y,z} \sqrt{\frac{\pi}{|c_\alpha|}} \rho(r_k). \quad (29b)$$

Unidimensional arguments can also be extended in a straightforward fashion to derive the FOVs along the independent axes, as well as to compare the demands that purely spatially-encoded vis-à-vis traditional EPI-encoding make in terms of gradient strengths, etc. Yet rather than continuing with these extensions we turn to the central topic of this work, on how to integrate field inhomogeneity compensations into the spatial encoding procedure.

Spatially-Encoded 1D MRI in the Presence of Field Inhomogeneities Compensating for Field Inhomogeneities For the sake of simplicity we begin by describing the retrieval of undistorted one-dimensional $\rho(z)$ profiles in the presence of field inhomogeneities, leaving for the next discussion an extension to higher-dimensional cases. FIG. 6 illustrates experimentally the actual capabilities of the approach, comparing for a simple water phantom results obtained in the presence and absence of inhomogeneities, when utilizing both conventional and spatially-encoded 1D MRI approaches under similar gradient-strength conditions. Upon executing either one of the imaging procedures described in Paragraph 2.1 while under the action of similar $B_0$ inhomogeneities, all methods will fail to deliver faithful representations of the object. The distortions imparted by these inhomogeneities onto the FT Fourier and spatially-encoded images will actually be different, as is to be expected given the differing physical procedures underlying these procedures. And while ideally such distortions could be accounted for at a post-acquisition level via numerical compensation procedures [1,24,25], these compensations tend to be numerically unstable and therefore restricted under limited signal-to-noise conditions. On the other hand, owing to the voxel-by-voxel encoding and read-out involved in the spatial encoding procedures introduced in the previous discussion, the latter have a built-in capability of restoring at an experimental level the faithfulness of the collected image. This capability is illustrated by the trace in FIG. 6E, collected using the same average gradient strength as the profile in FIG. 6D, but following a suitable temporal shaping of the RF encoding pulse and of the subsequent decoding gradient. Such shaping does actually require an a priori knowledge of the field inhomogeneity profile $\gamma \Delta B_0(z) = \Omega_{inh}(z)$; yet given this knowledge the procedure can compensate distortions using gradients whose span is only a few times larger than that of the inhomogeneities—ca. a factor of four for the case illustrated in FIG. 6.

Recording such undistorted $\rho(z)$ profiles while in the presence of field inhomogeneities, will require restoring the two basic conditions which defined the ideal spatial-encoded image formation process: a linearity between coordinate z and the acquisition time t (eq. 13), and a constant pixel size $\Delta z$ throughout the acquisition process (eq. 18). The physics that define these two parameters will not change fundamentally upon going from a homogeneous—to an inhomogeneous-field acquisition; voxels will still be decoded according to the stationary phase condition $$\left.\frac{d\Phi}{dz}\right|_{z=z_k(t)} = 0, \quad (30)$$

and spatial resolution will still be defined by $$\Delta z(t) = \sqrt{\frac{2\pi}{\left|\frac{d^2\Phi}{dz^2}\right|_{z=z_k(t)}}}. \quad (31)$$

The effects of the field inhomogeneities will be expressed by the fact that there will now be an additional contribution defining the overall phase $\Phi(z)$ arising from $\Omega_{inh}(z)$—effects which will have to be compensated out. To visualize how this distortion can be removed we will assume for concreteness that spins were excited by the action of a swept π/2 chirped RF nutation.[4] The $\Omega_{inh}(z)$ contribution will be given by an extra term in the excitation phase $$\phi_e(z) = \phi_{RF}[\tau(z)] + [\tau_p - \tau(z)] \cdot [\gamma G_e z + \Omega_1 + \Omega_{inh}(z)] \quad (32)$$

as well as by an addition to the overall acquisition phase $$\Phi(z,t) = \phi_e(z) + k \cdot z + \Omega_{inh}(z) t. \quad (33)$$

[4] The description for the case of a π-based encoding follows very similar (and in fact somewhat simpler) lines If the encoding and decoding processes were to proceed as in the homogeneous case it is clear that these new terms would break both the linear z/t relation as well as the constant voxel size demand, leading to distortions such as those illustrated in FIG. 6D. Yet we can "force" a reintroduction of the ideal behavior by tailoring at least two of the several free parameters at our disposal; these include $\phi_{RF}[\tau(z)]$ (i.e., the shape of the RF encoding pulse), k(t) (i.e., the shape of the acquisition gradient $G_a$ and/or of the dwell time $\Delta t$), as well as the encoding gradient $G_e$. In the present exposition we have chosen $\phi_{RF}[\tau(z)]$ and $G_a(t)$, in order to carry out the correction.

The demand for a linearity between z and t can be used to derive the shape of the acquisition gradient. To do so we insert eq. 33 into expression 30, and solve for $\gamma G_a(t) = dk/dt$ $$\gamma G_a(t) = \left\{ \begin{array}{l} -\dfrac{d}{dt}\left[\dfrac{d\phi_e(z)}{dz}\right] - \\ t \cdot \dfrac{d}{dt}\left[\dfrac{d\Omega_{inh}(z)}{dz}\right] - \\ \dfrac{d\Omega_{inh}(z)}{dz} \end{array} \right\}_{z=z(t)}, \quad (34)$$

The t-dependence in this expression can be translated into a z-dependence (or vice versa) by imposing the demand $$z(t) = \dfrac{L}{2} - \dfrac{L}{T_a} \cdot t \Leftrightarrow \dfrac{d}{dt} = -\dfrac{L}{T_a}\dfrac{d}{dz}, \quad (35)$$

which transforms eq. 34 into a single-variable second-order differential expression. Although $\Omega_{inh}(z)$ is an a priori mapped function, solving eq. 34 still requires knowledge of the $\phi_e(z)$ function—or better said, of its second spatial derivative—appearing on the first right-hand term. The definition of this function will stem in turn from demanding a constant pixel size throughout the acquisition. In other words, we shall design the initial encoding experienced by the spins during their excitation in such a way, so that when coupled to the cumulative dephasing effects of $\Omega_{inh}(z)$ the overall result will be a time-independent spatial resolution $\Delta z$ throughout the course of the acquisition. It follows from eq. 31 that such constant-voxel demand is mathematically equivalent to requesting $$\dfrac{d}{dt}\left[\dfrac{d^2\Phi(z)}{dz^2}\right]_{z=z(t)} = 0. \quad (36)$$

Inserting into this expression the definitions given in eqs. 33 and 35, results in demanding that $\phi_e(z)$ and $\Omega_{inh}(z)$ be related by $$\dfrac{d^3\phi_e(z)}{dz^3} = -\dfrac{T_a}{L}\left[\dfrac{d^2\Omega_{inh}(z)}{dz^2} + \left(z - \dfrac{L}{2}\right)\dfrac{d^3\Omega_{inh}(z)}{dz^3}\right]. \quad (37)$$

Notice that according to this derivation, the voxel size correction: i) is introduced at an excitation but not at an acquisition level; ii) will not be needed if $\Omega_{inh}$'s effects are linear (which would introduce a constant displacement of the image but no intra-voxel distortions); iii) will only affect third and higher orders of $\phi_e(z)$ (terms which were absent in the homogeneous case, eq. 6); and iv) will allow by a single integration for the calculation of the acquisition gradient $G_a(t)$, pending certain simple boundary conditions that we proceed to discuss.

Eq. 37 defines the encoding profile that we would like applied on the spins, as a function of their z positions. This $\phi_e(z)$ profile depends on fixed parameters we shall assume known ($G_e$, $\Omega_1$ and $\Omega_{inh}(z)$ in eq. 32), as well as on an RF-driven phase $$\phi_{RF}[\tau(z)] = \int_0^{\tau(z)} O(\tau') d\tau'.$$

This spatially-dependent phase profile we can control in a number of ways; for example by defining the instant $\tau(z)$ at which a particular RF offset O being continuously swept reaches and excites spins resonating at a frequency $\omega(z) = \gamma G_e z + \Omega_1 + \Omega_{inh}(z)$. To visualize how the resulting $O(\tau)$ sweep provides sufficient flexibility to design the desired $\phi_e(z)$ profile, we shall assume for simplicity a null chemical shift. Taking then the spatial derivative of eq. 32 (as constant phase terms in the end are unimportant) one ends up with $$\dfrac{d\phi_e(z)}{dz} = O[\tau(z)] \cdot \dfrac{d\tau}{dz} + [\tau_p - \tau(z)]\left[\gamma G_e + \dfrac{d\Omega_{inh}(z)}{dz}\right] - \dfrac{d\tau}{dz} \cdot [\gamma G_e + \Omega_{inh}(z)]. \quad (38)$$

Since the offset also has to fulfill the condition $O[\tau(z)] = \gamma G_e z + \Omega_{inh}(z)$, the first and last terms on the right-hand side of this expression will cancel each other out; one can then solve for $\tau(z)$ as $$\tau(z) = \tau_p - \dfrac{\dfrac{d\phi_e(z)}{dz}}{\left[\gamma G_e + \dfrac{d\Omega_{inh}(z)}{dz}\right]}. \quad (39)$$

The expression for $d\phi_e/dz$ involved in this equation can be obtained from the $\Omega_{inh}(z)$ profile following a double integration of eq. 37, subject to the initial and final boundary conditions of the RF sweep $$\tau(z_f = L/2) = \tau_p; \quad \tau(z_i = -L/2) = 0 \quad (40)$$

Notice that after the First of these integration processes, all the functions required to define the $\gamma G_a(t)$ gradient profile are already known. Finally, the last step in deriving the RF offset profile to be used in the experiment, requires inverting $\tau(z)$ into $z(\tau)$, and plugging the result into $O(\tau) = \gamma G_e z(\tau) + \Omega_{inh}[z(\tau)]$.[5]

[5] It appears that in the small inhomogeneity limit $\|d\Omega_{inh}(z)/dz\| \ll |\gamma G_e|$, replacing in $$\frac{d\phi_e(z)}{dz} \bigg/ \left[\gamma G_e + \frac{d\Omega_{inh}(z)}{dz}\right] \quad \text{eq. 39}$$

$$\text{for } \left(\frac{d\phi_e(z)}{dz}\right) \left[1 - \frac{\frac{d\Omega_{inh}(z)}{dz}}{\gamma G_e}\right] \bigg/ \gamma G_e$$

could further aid in the calculations, even if we have not exploited this so far.

From an experimental standpoint, it is often simpler to program the resulting pulse as a phase table $\phi_{RF}(\tau)$, to be read at a constant dwell $\Delta\tau$ by the spectrometer's RF generation hardware. Moreover, since the inhomogeneity will in general affect the rate at which the RF sweeps any given range of frequencies, it also follows that the amplitude of the RF may have to be tailored during the clocking out of the pulse. Indeed as described elsewhere for the case of spatial encoding under homogeneous conditions (e.g., Appendix of ref. 17), the strength $\gamma B_1$ of a chirped pulse that is swept at a constant rate R can be calibrated so as to impart a (non-adiabatic) $\pi/2$ nutation of the spins. This in turn requires setting $\gamma B_1$ as $\approx 0.25\sqrt{|R|}$, which is a constant for the homogeneous-field scenario. In the inhomogeneous field situation by contrast the sweep rate $R = dO/d\tau$ is no longer constant, and hence spins positioned at different z coordinates will be nutated by different extents unless the $B_1$ field is suitably compensated for this. This can be simply done by setting a second, amplitude-modulating table as part of the pulse definition with $\gamma B_1(\tau)$ defined as $0.25\sqrt{|dO(\tau)/d\tau|}$; not accounting for this leads to image distortions, as further illustrated below.

Limitations of the Compensation Procedure

Having derived the conditions under which the spatial encoding protocol can compensate for 1D field inhomogeneities, it is pertinent to discuss what will be the limits of such procedure. Some of these may arise from non-coherent decay factors that will not be here addressed, including $T_2$, diffusion and motions. But we have also identified two main methodological limitations worth discussing. One of these arises from our demand that the $\tau(z)$ in eq. 39 be invertible into a $z(\tau)$ expression. Numerical simulations for various arbitrary $\Omega_{inh}(z)$ profiles reveal a variety of instances where, for large enough inhomogeneities, this is no longer possible.[6] In principle one should be able to accommodate the profile requested by the compensation as long as $\omega(z)$ is a univalued function, where each z voxel can be addressed independently and at will during by an RF pulse of duration $\tau_p$. This in turn requires that $d\omega(z)/dz \neq 0$ throughout the course of the encoding; assuming that the inhomogeneity gradients we are dealing with are smaller than the the $\gamma G_e$ gradient,[7] this translates into requesting $$|\gamma G_e| > \left|\frac{d\Omega_{inh}(z)}{dz}\right| \forall z \in (-L/2, L/2). \quad (41)$$

[6] We believe that many of these cases actually reflect our reliance on a continuous frequency-swept pulse for achieving the desired $\phi_{RF}(\tau)$ pattern, which although a natural choice for implementing the encoding under homogeneous field conditions may no longer be optimal in the presence of field inhomogeneities. In such instances other excitation/inversion algorithms [26-28], might be more useful generators of the arbitrary $\phi_e(z)$ profiles being sought.

[7] Another interesting alternative, dealing with exploiting this paper's approach to retrieve undistorted spatial images for cases where the gradient is actually smaller than the intrinsic inhomogeneities, will be discussed elsewhere.

A second, physically different limitation to the method described above is posed by the effects that will be introduced by $\Omega_{inh}(z)$ during the course of the acquisition, which entailing a time $T_a$ that is usually longer than $\tau_p$ may eventually control the maximum limits of tolerable inhomogeneities. These longer-term distortions are mathematically represented by the multiple $z_{k(t)}$ roots that for long enough acquisition times t, will be able to satisfy the condition stated in eq. 30. Indeed, when considering in this equation k and t as fixed parameters, one realizes that the signal detected at any given time will contain contributions from all z coordinates fulfilling the stationary phase condition $$\frac{d\phi_e(z)}{dz} + \frac{d\Omega_{inh}(z)}{dz} \cdot t + k = 0. \quad (42)$$

In the $\Omega_{inh} = 0$ case $\phi_e(z)$ is a second-degree polynomial and thus only a single $z_k$ value (eq. 12) will satisfy this condition. By contrast we have seen that when $\Omega_{inh}(z) \neq 0$ then also $(d^3\phi_e/dz^3) \neq 0$, and the stationary phase condition may exhibit multiple roots. One of these will of course derive from the undistorted $z(t) = L/2 - L/T_a \cdot t$ solution for which $\phi_e$ and $G_a$ were originally designed; but eventually other positions may end up satisfying eq. 42, putting an end to the method's ability to deliver undistorted images. FIG. 7 illustrates with a series of graphs, the appearance of this multiple-roots phenomenon. Ways to deal with this problem reside in either setting all conditions such that the undesired stationary-phase voxels fall outside the FOV of the object that has been excited, or alternatively so that they only begin to appear at virtual times $t > T_a$. Another possibility entails relying on the fact that different voxels fulfilling eq. 42 will in general be associated to different resonance frequencies. A judicious application of suitable time and frequency-dependent filtering functions can therefore help select solely the faithful solution being sought. Multiple experimental parameters ($G_e$, $G_a$, $\tau_p$, $T_a$) are available to achieve and define these procedures; some of these are illustrated in the following Paragraph.

One-Dimensional Compensations: Analytical and Numerical Examples

Before proceeding with an extension of the protocol just presented to multidimensional cases, we deem it valuable to illustrate the implementation of the various calculations in the paragraphs above for two additional examples. We focus first on an explicit derivation of the compensating functions $\phi_{RF}(\tau)$ and $G_a(t)$ for the simplest relevant distortion. Since, as mentioned earlier, spatially-encoded voxels are free from distortions upon being subject to linear field inhomogeneities, we shall consider towards this end a quadratic inhomogeneity $$\Omega_{inh}(z) = \eta_0 + \eta_1 z + \eta_2 z^2. \quad (43)$$

From the constant-voxel condition in eq. 37 it follows that $$\frac{d^3\phi_e(z)}{dz^3} = -2\eta_2 \frac{T_a}{L}. \quad (44)$$

A condition that can be integrated twice subject to the boundary conditions in eqs. 39, 40 cast as $$\tau(z_i) = 0 \Leftrightarrow \frac{d\phi_e}{dz}\bigg|_{z_i = -L/2} = 0; \quad (45)$$

$$\tau(z_f) = \tau_p \Leftrightarrow \frac{d\phi_e}{dz}\bigg|_{z_f = L/2} = \left[\gamma G_e + \left(\frac{d\Omega_{inh}(z)}{dz}\right)\bigg|_{z_f = L/2}\right]\tau_p.$$

This in turn yields an explicit form for the gradient that needs to be applied over the course of the acquisition:

$$\gamma G_a(t) = -\eta_1 - \frac{\gamma G_{\mathit{eff}} \tau_p}{T_a} - \frac{\eta_2 L \tau_p}{T_a} - \frac{2L}{T_a}\eta_2 \cdot t, \quad (46)$$

where $\gamma G_{\mathit{eff}} = \gamma G_e + \eta_1$. This solution clearly reverts to the homogeneous demand $G_a = -G_e \tau_p / T_a$ on making $\Omega_{inh}(z) = 0$, and entails otherwise a linear "increase" in gradient strength with time in order to account for growing effects of the quadratic inhomogeneity. An interesting feature to remark regarding eq. 46, is that in the inhomogeneous case it leads to a second solution in addition to $z(t)=L/2-L/T_a \cdot t$. This is a second root of the kind introduced above, which in this case will be expressed by $$z_{artifact}(t) = \frac{\gamma G_{\mathit{eff}} \tau_p}{\eta_2 T_a} - \frac{L}{2}\left(1 + \frac{2\tau_p}{T_a}\right) - \frac{L}{T_a} \cdot t. \quad (47)$$

Figure 8A:
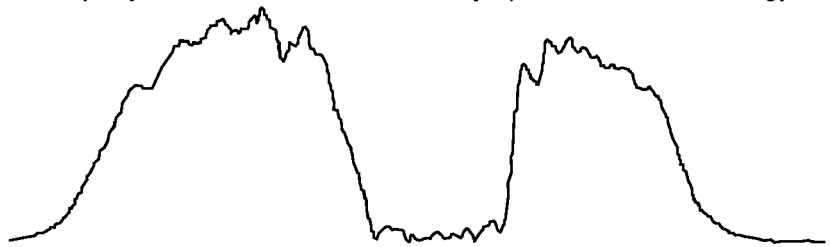
FIG. 8(A) shows a spatially-encoded profile obtained upon employing a "correct" excitation gradient ($G_e=5$ G/cm) as well as the RF and acquisition gradient shapes arising from the $\Omega_{inh}(z)$ profile.
Figure 8B:
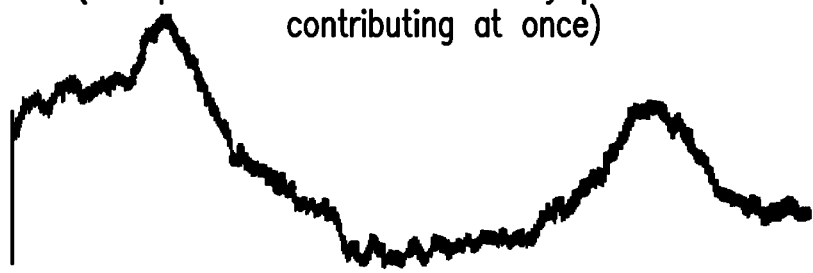
FIG. 8(B) illustrates Idem as FIG. 8(A) but upon choosing the opposite excitation gradient ($G_e=-5$ G/cm) and then solving for the correct compensating conditions. Notice the severe distortions arising due to the presence of multiple voxels satisfying the stationary phase condition for most of the acquisition time.

Notice that just as the "legitimate" solution being sought, this position is also decoded linearly with time. This in turn enables one to avoid its interfering effects, by making sure that the different parameters making up the constant term of this position already place $z_{artifact}(t=0)$ outside the object's FOV. FIG. 8 illustrates an example of this carried out, in this instance by a judicious choice of the sign of the $G_e$ gradient chosen for the encoding.

The conclusion reached above also indicated how double integration of eq. 44 bound to eqs. 45, enables one to derive the tailored offset chirp to be applied for avoiding the dephasing effects introduced by the inhomogeneity. For the case of a quadratic $\Omega_{inh}(z)$, this can be carried out analytically and, following some algebra, leads to $$O(\tau) = -\eta_o - \frac{\gamma G_{\mathit{eff}}\left[\begin{array}{c}-2L\eta_2\tau + \tau_p \\ (\gamma G_{\mathit{eff}} + L\eta_2) - \Delta\end{array}\right]}{2\eta_2 T_a} + \frac{\left[\begin{array}{c}2L\eta_2\tau + \tau_p \\ (\gamma G_{\mathit{eff}} + L\eta_2) + \Delta\end{array}\right]}{4\eta_2 T_a^2}, \quad (48a)$$

where $$\Delta = \sqrt{\begin{array}{c}(\gamma G_{\mathit{eff}}\tau_p - 2L\eta_2\tau + L\eta_2\tau_p)^2 + \\ \eta_2 T_a[2L\gamma G_{\mathit{eff}}(\tau_p - 2\tau) + L^2\eta_2(2\tau_p + T_a)]\end{array}}. \quad (48b)$$

Figure 8C:
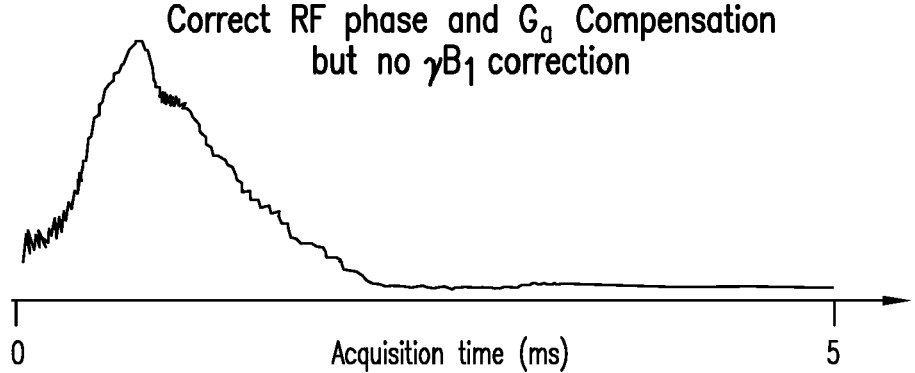
FIG. 8(C) shows a profile resulting upon employing the appropriate excitation/acquisition gradients and RF offset shaping, but neglecting a suitable correction of the $\gamma B_1(\tau)$ RF amplitude.
Figure 9A:
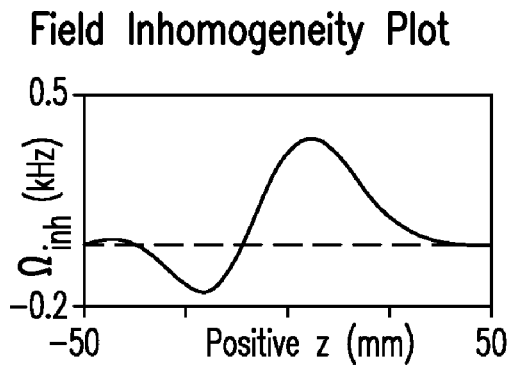
FIG. 9(A) shows an assumed inhomogeneity profile, spanning ≈500 Hz over a 100 mm object.
Figure 9B:
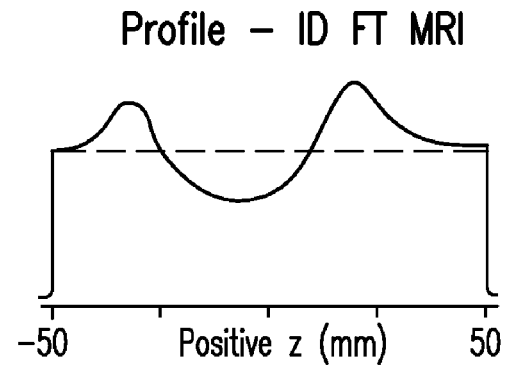
FIG. 9(B) shows a distortion imposed by the inhomogeneity on a 1D image arising from FTing a FID collected over a 32 ms acquisition time using $G_a=0.5$ G/cm; the dotted line indicates the undistorted $\rho(z)$ profile.
Figure 9C:
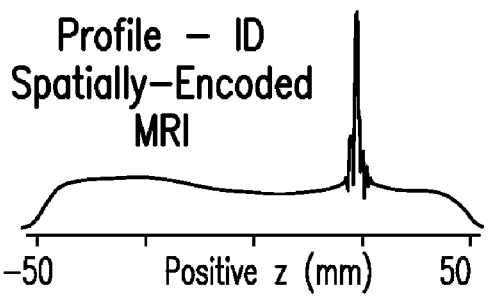
FIG. 9(C) illustrates a spatially-encoded image arising after applying a linearly-chirped $\pi/2$ pulse $\tau_p=4$ ms and $G_e=4$ G/cm, followed by a decoding with $G_a=0.5$ G/cm and $T_a=32$ ms.
Figure 9D:
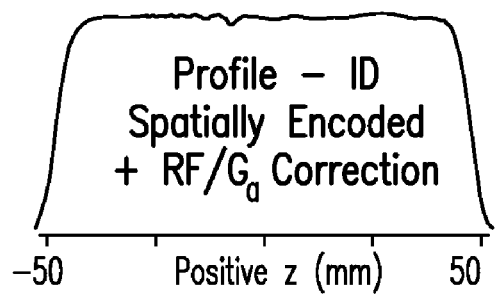
FIG. 9(D) illustrates Idem as FIG. 9(C) but upon introducing the RF-driven compensation employed in this invention. The characteristics of the "correcting" RF encoding pulse are shown in FIG. 9(E).
Figure 9E:
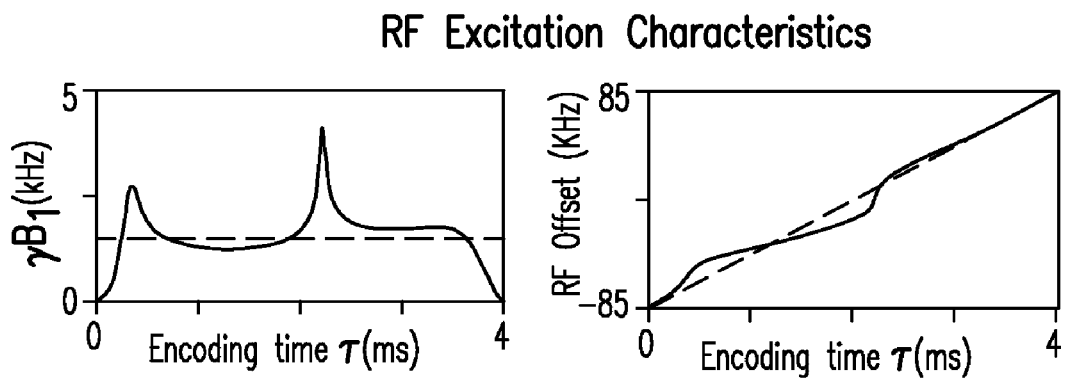
FIG. 9 shows schematically and graphically a numerical example of the inhomogeneity compensation procedure executed under conditions akin to those of an MRI exam; shown for comparison (dotted lines) are parallel sets of functions corresponding to $\Omega_{inh}=0$.

From here the tailored RF amplitude $\gamma B_1(\tau)$, proportional to $\sqrt{|dO(\tau)/d\tau|}$, can also be worked out. FIG. 8C illustrates the relevance of suitably tailoring this nutation, with an image decoded using all the right compensation parameters except for such RF amplitude correction. While the idealized inhomogeneity in eq. 43 gives the opportunity to explore analytically variably aspects of the compensation procedure, we anticipate most of the latter's applications to involve numerical solutions of cases where $\Omega_{inh}(z)$ is a more-or-less arbitrary distribution that has been a priori measured. Furthermore, and working with the case of an EPI-type read-out dimension in mind, the compensation problem will most likely have to deal with larger objects, smaller inhomogeneities, and weaker read-out gradients than those treated in FIGS. 6-8. To illustrate the methodology's capability to deal also with such cases we show in FIG. 9 another example, this time dealing with a synthetic inhomogeneity constructed on the basis of a damped Airy function containing an oscillating spatial dependency (panel A). Both conventional k- as well as spatially-encoded procedures fail to yield appropriate profiles under EPI-type read-out conditions (FIGS. 9B, 9C), while a compensation based on the numerical resolution of the above equations successfully yields an undistorted image (FIG. 9D)—even if relying on acquisition gradients of similar strength.

Compensating Inhomogeneities in Multiple Dimensions

The compensation principles described above for the case of 1D acquisitions can be expanded to multidimensional acquisitions. A main demand of these multidimensional procedures is that suitable encoding and decoding sequences be devised, whereby each voxel r is addressed independently and only once, both during the initial excitation as well as during the latter acquisition stages. A one-to-one relation during the encoding is required in order to be able to compensate each $\Omega_{inh}(r)$ element in the field distribution. The analogous decoding demand derives from the fact that the protocol enables the correct compensation of $\Omega_{inh}(r)$ solely for a single acquisition time t, but not for multiple times. For instance 2D encoding schemes of the kind illustrated in FIGS. 3C and 3D will be unable to compensate generic $\Omega_{inh}(x,z)$ 2D distributions, as they both address all elements positioned perpendicular to a particular x or z coordinate at once. Neither will decoding schemes such as the ones in FIGS. 3C and 3D succeed in compensating distortions along the x direction, as several individually-encoded coordinates along this axis are interrogated multiple times during the acquisition discussion. In general, full compensation of an arbitrary inhomogeneity along n-dimensions will demand the use of an nD spatial-encoding pulse, followed by a continuous n-dimensional rasterization of the image. When viewed as a function of $\tau$ and t both the nD encoding and decoding processes regain in this fashion a one-dimensional character, and the various equations and conditions derived in Section 3 can be re-applied.

The mathematics of a full 3D inhomogeneity compensation are quite involved, and their general treatment will be deferred to a subsequent publication. Still, we would like to exemplify some of the new issues that will arise even when dealing with the simplest of nD compensation cases. One feature that was absent in both the 1D inhomogeneous field treatment as well as in the homogeneous nD one—but which is a regular feature of all $\Omega_{inh}(r)$ nD compensation schemes—concerns the fact that spins will no longer be addressed along orthogonal directions. This will in turn shift the initial coordinate of the rasterization from its ideal position, and mix the constant-voxel and linear rasterization demands among all n dimensions. This feature can be appreciated by considering the nD stationary phase condition eq. 27, which will now become $$k(t) = -\nabla_r[\phi_e(r)] - t \cdot \nabla_r[\Omega_{inh}(r)] \quad (49)$$
$$= -\nabla_\omega[\phi_e(r)] \cdot J(r) - t \cdot \nabla_r[\Omega_{inh}(r)]$$

with $\nabla_\omega[\phi_e(r)]=(\partial\phi_e/\partial\omega_x, \partial\phi_e/\partial\omega_y, \partial\phi_e/\partial\omega_z)$ and $$J = \begin{pmatrix} \frac{\partial\omega_x}{\partial x} & \frac{\partial\omega_x}{\partial y} & \frac{\partial\omega_x}{\partial z} \\ \frac{\partial\omega_y}{\partial x} & \frac{\partial\omega_y}{\partial y} & \frac{\partial\omega_y}{\partial z} \\ \frac{\partial\omega_z}{\partial x} & \frac{\partial\omega_z}{\partial y} & \frac{\partial\omega_z}{\partial z} \end{pmatrix} \quad (50)$$

the Jacobian matrix relating positions r and axes of frequency encoding ω. In the absence of inhomogeneities this transformation would be diagonal, with each frequency-swept encoding addressing its respective spatial direction. Yet in the presence of an $\Omega_{inh}(r)$ term J will connect the decoding along a given axis with encodings which happened along other, non-orthogonal directions. Also the conditions that define the constant voxel size will now require that conditions along multiple orthogonal directions be suitably related. Indeed for the inhomogeneous-field case we shall demand, in analogy to eq. 36, that $$\frac{d}{dt}[\det Q_{r=r(t)}] = 0 \qquad (51)$$

where following eq. 28 we define $$Q_{ij} = D_{ij}[\phi_e(r) + k \cdot r + t\, \Omega_{inh}(r)] = \partial/\partial i \partial/\partial j \{\phi_e[\omega(r)]\} + t\, \partial/\partial i \partial/\partial j\, [\Omega_{inh}(r)] \qquad (52)$$

Once again the Jacobian relating the encoding frequencies ω) and orthogonal directions r will intervene in this matrix via the derivatives of $\phi_e[\omega(r)]$, making Q off-diagonal as long as $\Omega_{inh} \neq 0$.

Rather than considering such full treatment we shall focus here on the simpler (and arguably more relevant) case, of how to compensate a 2D spatially-encoded experiment for a 1D inhomogeneity of the type $\Omega_{inh}(z)$. Specifically we shall consider the 2D spin encoding instance illustrated in FIG. 3C, which will now lead to $$\phi_e = \phi_e^x(\omega_x) + \phi_e^z(\omega_z) \qquad (53)$$

now defined as a function of the swept—the RF encoding frequencies $$\omega_z(z) = \gamma G_e^z z + \Omega_{inh}(z) \qquad (54)$$

and $$\omega_x(x,z) = \gamma G_e^x x + \Omega_{inh}(z). \qquad (55)$$

Whereas the encoding will be imparted as a function of these frequency variables ω, the decoding process will still be given by gradients acting along orthogonal directions r. A decision is thus to be made in terms of choosing a set of variables for describing the experiment: either for r or for ω. Going for the former implies rewriting the stationary phase condition in eq. 27a as $$(k_x, k_z) = -\left(\frac{\partial \phi_e^x}{\partial \omega_x}, \frac{\partial \phi_e^z}{\partial \omega_z} + t \frac{d\Omega_{inh}}{dz}\right) \cdot \begin{pmatrix} \gamma G_e^x & \frac{d\Omega_{inh}}{dz} \\ 0 & \gamma G_e^z + \frac{d\Omega_{inh}}{dz} \end{pmatrix}, \qquad (56)$$

where as adumbrated the Jacobian matrix is involved on the right-hand side. On these k elements we shall once again impose the conditions that force an idealized rasterization of the image, which for trajectories zigzagging through the (x,z) plane can be cast in an analytically-friendly fashion as $$x(t) = x_i + \frac{L_x}{2} \cos\left[\frac{2\pi N_x}{T_a}(t + \Delta)\right]; \qquad (57)$$

$$z(t) = L_z/2 - \frac{L_z}{T_a} \cdot t$$

$N_x$ being the number of zigzags chosen. The appearance here of the new parameters $x_i$, $\Delta$ reflect the fact that, even if a π-driven encoding solely along the $\hat{x}$ axis is employed, the inhomogeneity will shift the rasterization away from zero and begin it at $$x_i = -\frac{\Omega_{inh}(L_z/2)}{\gamma G_e^x}.$$

As in the 1D case eq. 56 will have to be derivatized with respect to time in order to extract the acquisition gradients $G_a^x(t)$ and $G_a^z(t)$. Given the one-to-one relation between t and z (eq. 57) this is equivalent to taking a derivative with respect to z. Notice that this one-to-one relation is an important demand that could not have been fulfilled if considering the orthogonal x axis (of which t in eq. 57 is not a single-valued function), thus giving mathematical expression to the physical demands noted above. Notice as well that since in the general case $\Omega_{inh}$, $\phi_e^x(\omega_x)$ and $\phi_e^z(\omega_z)$ will be high-dimensional polynomials of x, z, we may once again have to deal here with the possibility of multiple root solutions of the kind introduced above.

Also as in the unidimensional case, the set of second-order spatial derivatives of $\phi_e(x,z)$ that are needed for defining the acquisition gradients $G_a^x(t), G_a^z(t)$ can be retrieved from the constant voxel condition. According to eqs. 51 and 52 this will now require finding the determinant of the matrix $$Q = \begin{pmatrix} (\gamma G_e^x)^2 \frac{\partial^2 \phi_e^x}{\partial x^2} & \gamma G_e^x \frac{d\Omega_{inh}}{dz} \frac{d^2 \phi_e^x}{d\omega_x^2} \\ \gamma G_e^x \frac{d\Omega_{inh}}{dz} \frac{d^2 \phi_e^x}{d\omega_x^2} & (\gamma G_e^z)^2 \frac{d^2 \phi_e^z}{dz^2} + 2\gamma G_e^z \frac{d\Omega_{inh}}{dz} + \frac{d^2 \phi_e^z}{d\omega_z^2} + \\ & \nabla^2 \phi_e\left(\frac{d\Omega_{inh}}{dz}\right) + (\nabla_\omega \phi_e \cdot 1 + t)\frac{d^2 \Omega_{inh}}{dz^2} \end{pmatrix}, \qquad (58)$$

Then setting its time- (i.e., its z-) derivative to zero, and looking for the appropriate $\phi_e^x$, $\phi_e^z$ solutions. It can be shown that for the present case this becomes equivalent to demanding $$\frac{d}{dt}\left\{\left(\frac{d^2 \phi_e^x}{d\omega_x^2}\right)\left[\frac{d^2 \phi_e^z}{dz^2} + \left(t + \frac{d\phi_e^x}{d\omega_x}\right)\frac{d^2 \Omega_{inh}}{dz^2}\right]\right\} = 0. \qquad (59)$$

Notice that the bracketed term in this derivative is akin to a product among the second-derivatives defining the Δx and Δz spatial resolutions, distorted as they now are by the effects of the inhomogeneity. A simple way to solve for the multiple mixed derivatives posed by this equation is to carry out the $\omega_x$—encoding by means of a linear frequency sweep—for instance via an adiabatic π sweep leading to $\phi_e^x(\omega_x) = c_x \omega_x^2$—and port all the necessary corrections to a tailored encoding solely along the z axis. This shifts all the focus onto the $$\Delta z^{-1} \approx \left[\frac{d^2 \phi_e^z}{dz^2}\left(t + \frac{d\phi_e^x}{d\omega_x}\right)\frac{d^2 \Omega_{inh}}{dz^2}\right]$$

term of eq. 59; setting this to zero we can derive the requirement $$\frac{d^3 \phi_e^z}{dz^3} = -\frac{d}{dz}\left\{\frac{d^2 \Omega_{inh}}{dz^2}[t(z) + 2c_x\gamma G_e^x \cdot x[t(z)]] + 2c_x\Omega_{inh}(z)\right\}. \quad (60)$$

This is the 2D analog) to eq. 37 and can likewise be integrated to obtain $$\frac{d^2 \phi_e^z}{dz^2}$$

based on the boundary conditions applying to the relations given in eq. 57 for x(t) and z(t); from here the remainder of the reconstruction procedure can be continued backwards, along lines similar to those detailed for the unidimensional case.

Figures 11A, 11B, 11C, 11D, 11E:
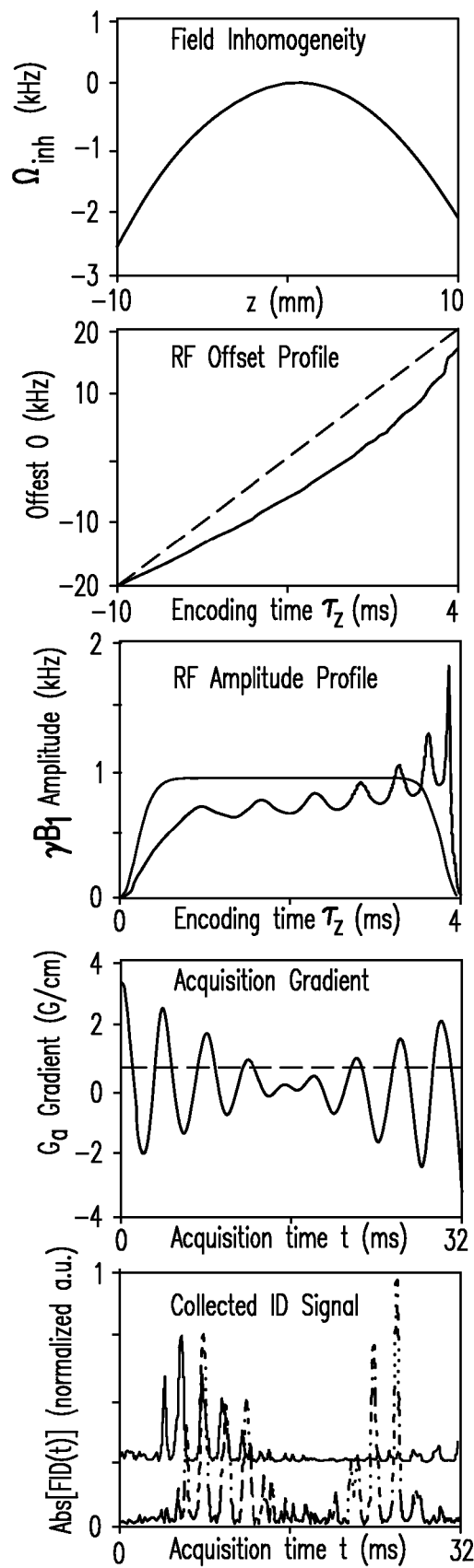
FIG. 11(E) shows a comparison between the time-domain data arising in the presence of the inhomogeneity if the compensation procedure is (thin trace) or isn't (thick trace) used. Notice the diagnostic ability of the compensation to "revive" the signal, extending its effective $T_2^*$.

Based on the resulting relations a software package capable of providing the encoding RF profile $\phi_{RF}[\tau(z)]$ and decoding gradient $G_a^z(t)$ capable of correcting for given $\Omega_{inh}(z)$ inhomogeneity affecting a π/2(z)–π(x) encoding experiment was written; as mentioned, all $G_e$ gradients as well as the x-related functions $\phi_{RF}[\tau(x)]$ and $G_a^x(t)$ could be left out of the correcting task even in this 2D scenario. Experiments were then carried out based on the zigzagging rasterization in eq. 57, for the sake of testing the capabilities of the ensuing compensation. FIG. 10 illustrates a set of representative results obtained in this fashion. Illustrated in panels A and B are single-scan 2D MRI profiles obtained on a 5 mm water phantom in the absence of inhomogeneities utilizing EPI and spatial-encoding approaches; both images are comparable, even if the former is of a slightly higher definition. Shown in FIGS. 10C and 10D is an analogous comparison but upon subjecting the sample to a ca. 10 kHz inhomogeneity artificially induced by de-shimming the sample along the z axis; both images are severely distorted, as expected, along this weak-gradient read-out direction. FIG. 10E illustrates the recovery potential of the spatial encoding approach upon applying the compensation just described; as can be appreciated, the quality of the resulting 2D image is not significantly different from that of its homogeneous-field analog in panel B. A few additional comparisons between un-corrected and corrected features worth remarking in this 2D procedure, are illustrated in FIG. 11.

By treating the sample in a non-uniform fashion, the spatial encoding protocol enables the acquisition of nD MR images within a single scan, while at the same time opening up various possibilities to deal with field inhomogeneities. The present study focused on compensating artifacts that arise from a $B_0$ field distribution; we shall discuss elsewhere additional opportunities that arise in terms of compensating $B_1$-related inhomogeneities, for dealing with the presence of multiple chemical sites, as well as for removing artifacts that arise from the combined action of all of these factors. As for the specific $B_0$ compensation procedures described herein, we believe that while many of their principles will remain valid, their implementation could be improved over the particular set of choices made in the experiments and calculations hereby presented. In particular the ways that have been employed, namely, sweeping the RF pulses to achieve the desired $\phi_{RF}(r)$ profiles, or to reintroduce the image ideality while keeping the encoding gradients and the acquisition dwell time constant are the best modes presently known, but others may be found. Work is still going on to explore various options, and of assessing their relative merits and performance.

We believe that although much simpler and apparently less general than its higher-dimensional counterpart, the one-dimensional $B_0$ compensation scheme introduced above can proof particularly practical. Indeed instances often arise where field inhomogeneities, even though three-dimensional, are primarily relevant along one of the spatial directions. This is the case, for instance, along the read-out direction of a 2D EPI scan, or in an ex-situ single-sided imaging setup. In such cases the execution of a hybrid spatial-encoding/Fourier scheme of the type illustrated in FIG. 3B, where the small bandwidth axis would undergo a "blipped" incrementation and concomitant 1D field compensation while FIDs are actually digitized while under the action of a strong orthogonal k-space encoding, could offer several of the advantages while avoiding the comparative disadvantages of spatially-encoded MRI. Furthermore, the spatially selective nature of this procedure also makes it particularly well suited to spatially discriminating detection setups, such as those arising in parallel imaging [29,30]. Combination of the scheme hereby discussed with other EPI-derived inhomogeneity compensation procedures [31,32] are also avenues worth pursuing. Further tests of these options are currently continuing.

To give effect to the present invention any general purpose computer or computer system including a set of Computer Nodes and/or Group Members can be employed. A typical group member can be an IBM eServer iSeries server system. Any suitably configured processing system is similarly able to be used by embodiments of the present invention. The computer system has a processor that is connected to a main memory, mass storage interface, terminal interface and network interface. These system components are interconnected by a system bus. Mass storage interface is used to connect mass storage devices, such as a DASD device, to the computer system. One specific type of DASD device is a floppy disk drive, which may be used to store data to and read data from a floppy diskette.

The Main Memory contains application programs, objects, data and an operating system image. The applications programs, objects, data and operating system are not required to be completely resident in the main memory at all times or even at the same time. The computer system can utilize conventional virtual addressing mechanisms to allow programs to behave as if they have access to a large, single storage entity, referred to herein as a computer system memory, instead of access to multiple, smaller storage entities such as main memory and DASD device. Note that the term "computer system memory" is used herein to generically refer to the entire virtual memory of computer system.

The operating system is a suitable multitasking operating system such as the IBM OS/400 operating system. Embodiments of the present invention are able to use any other suitable operating system. Operating system includes a DASD management user interface program, a DASD storage management program and a group user interface program. Embodiments of the present invention can utilize architectures, such as an object oriented framework mechanism, that allows instructions of the components of operating system to be executed on any processor within the computer.

Computer systems with single or multiple CPUs can be used equally effectively.

Embodiments of the present invention incorporate interfaces that include separate, fully programmed microprocessors that are used to off-load processing from the CPU. Terminal interface is used to directly connect one or more terminals to the computer system. These terminals, which are able to be non-intelligent or fully programmable workstations, are used to allow system administrators and users to communicate with the computer system.

A network interface can be used to connect other computer systems or group members, to the computer system. The present invention works with any data communications connections including present day analog and/or digital techniques or via a future networking mechanism. Although the exemplary embodiments of the present invention are described in the context of a fully functional computer system, those skilled in the art will appreciate that embodiments are capable of being distributed as a program product via floppy disk, e.g. floppy disk, CD ROM, or other form of recordable media, or via any type of electronic transmission mechanism.

Embodiments of the present invention include an operating system that includes a DASD management user interface program that performs functions related to configuration, operation and other management functions, including functions for selecting one or more DASDs for an auxiliary storage pool (ASP). An ASP is defined as a set of disk units, and an independent auxiliary storage pool (IASP) is a set of disk units independent of a system. An IASP can be switched between systems, if its disk units are switchable and follow configuration and placement rules. The DASD management user interface program is able to communicate with DASD storage management (DSM) program, which is a component of operating system that provides internal support for managing disk units.

Non-limiting Software and Hardware Examples: Embodiments of the invention can be implemented as a program product for use with a computer system such as, for example, the cluster computing environment described herein. The program(s) of the program product defines functions of the embodiments (including the methods described herein) and can be contained on a variety of signal-bearing medium. Illustrative signal-bearing medium include, but are not limited to: (i) information permanently stored on non-writable storage medium (e.g., read-only memory devices within a computer such as CD-ROM disk readable by a CD-ROM drive); (ii) alterable information stored on writable storage medium (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the present invention, whether implemented is part of an operating system or a specific application, component, program, module, object or sequence of instructions may be referred to herein as a "program." The computer program typically is comprised of a multitude of instructions that will be translated by the native computer into a machine-readable format and hence executable instructions. Also, programs are comprised of variables and data structures that either reside locally to the program or are found in memory or on storage devices. In addition, various programs described herein may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It is also clear that given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.) It should be appreciated that the invention is not limited to the specific organization and allocation or program functionality described herein. The present invention can be realized in hardware, software, or a combination of hardware and software. A system according to a preferred embodiment of the present invention can be realized in a centralized fashion in one computer system, or in a distributed fashion where different elements are spread across several interconnected computer systems. Any kind of computer system—or other apparatus adapted for carrying out the methods described herein—is suited. A typical combination of hardware and software could be a general purpose computer system with a computer program that, when being loaded and executed, controls the computer system such that it carries out the methods described herein.

Each computer system may include, inter alia, one or more computers and at least a signal bearing medium allowing a computer to read data, instructions, messages or message packets, and other signal bearing information from the signal bearing medium. The signal bearing medium may include non-volatile memory, such as ROM, Flash memory, Disk drive memory, CD-ROM, and other permanent storage. Additionally, a computer medium may include, for example, volatile storage such as RAM, buffers, cache memory, and network circuits. Furthermore, the signal bearing medium may comprise signal bearing information in a transitory state medium such as a network link and/or a network interface, including a wired network or a wireless network, that allow a computer to read such signal bearing information. The present invention can be realized in hardware, software, or a combination of hardware and software. A system according to a preferred embodiment of the present invention can be realized in a centralized fashion in one computer system, or in a distributed fashion where different elements are spread across several interconnected computer systems. Any kind of computer system—or other apparatus adapted for carrying out the methods described herein—is suited. A typical combination of hardware and software could be a general-purpose computer system with a computer program that, when being loaded and executed, controls the computer system such that it carries out the methods described herein.

An embodiment of the present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

A computer system may include, inter alia, one or more computers and at least a computer readable medium, allowing a computer system, to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer readable medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allow a computer system to read such computer readable information.

Figure 18:
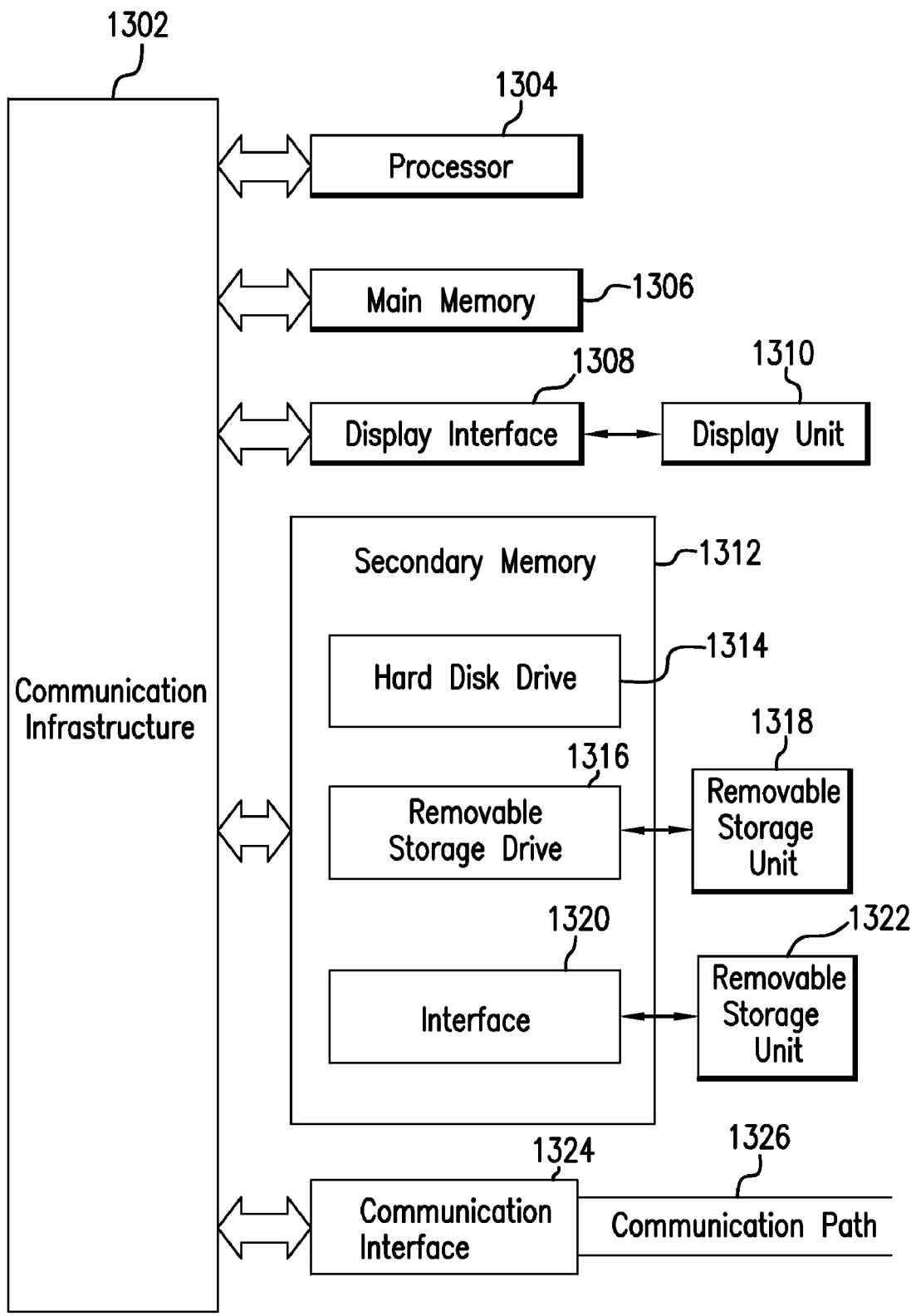
FIG. 18 is a schematic (block diagram) view of a computer system usable with the present invention.

FIG. 18 is a block diagram of a computer system useful for implementing an embodiment of the present invention. The computer system includes one or more processors, such as processor 1304. The processor 1304 is connected to a communication infrastructure 1302 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system can include a display interface 1308 that forwards graphics, text, and other data from the communication infrastructure 1302 (or from a frame buffer not shown) for display on the display unit 1310. The computer system also includes a main memory 1306, preferably random access memory (RAM), and may also include a secondary memory 1312. The secondary memory 1312 may include, for example, a hard disk drive 1314 and/or a removable storage drive 1316, representing a floppy disk drive, a magnetic tape drive, an optical disk drive, and more The removable storage drive 1316 reads from and/or writes to a removable storage unit 1318 in a manner well known to those having ordinary skill in the art. Removable storage unit 1318, represents a floppy disk, magnetic tape, optical disk, and more which is read by and written to by removable storage drive 1316. As will be appreciated, the removable storage unit 1318 includes a computer usable storage medium having stored therein computer software and/or data.

In alternative embodiments, the secondary memory 1312 may include other similar means for allowing computer programs or other instructions to be loaded into the computer system.

Such means may include, for example, a removable storage unit 1322 and an interface 1320. Examples of such may include a program cartridge and cartridge interface (such as that found in video game devices), a removable memory chip (such as an EPROM, or PROM) and associated socket, and other removable storage units 1322 and interfaces 1320 which allow software and data to be transferred from the removable storage unit 1322 to the computer system.

The computer system may also include a communications interface 1324. Communications interface 1324 allows software and data to be transferred between the computer system and external devices. Examples of communications interface 1324 may include a modem, a network interface (such as an Ethernet card), a communications port, a PCMCIA slot and card, and more Software and data transferred via communications interface 1324 are in the form of signals which may be, for example, electronic, electromagnetic, optical, or other signals capable of being received by communications interface 1324. These signals are provided to communications interface 1324 via a communications path (i.e., channel) 1326. This channel 1326 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 1306 and secondary memory 1312, removable storage drive 1316, a hard disk installed in hard disk drive 1314, and signals. These computer program products are means for providing software to the computer system. The computer readable medium allows the computer system to read data, instructions, messages or message packets, and other computer readable information from the computer readable medium. The computer readable medium, for example, may include non-volatile memory, such as Floppy, ROM, Flash memory, Disk drive memory, CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network that allow a computer to read such computer readable information.

Computer programs (also called computer control logic) are stored in main memory 1306 and/or secondary memory 1312. Computer programs may also be received via communications interface 1324. Such computer programs, when executed, enable the computer system to perform the features of the present invention as discussed herein. In particular, the computer programs, when executed, enable the processor 1304 to perform the features of the computer system. Accordingly, such computer programs represent controllers of the computer system.

Further Single-Scan Strategies for the Acquisition of High Resolution NMR Data in Inhomogeneous Fields As explained, spatially-encoded RF-based corrections can also compensate for field inhomogeneities within spectroscopic NMR settings. Consider a field inhomogeneity profile $\Delta B_0(t) = \gamma \Omega_{inh}(r,t)$ that has been a priori characterized, acting in simultaneity with a set of internal frequencies $\Omega_1$—stemming for instance from chemical shifts or J-couplings—or extend gradient derived frequencies $\Omega_1(\vec{X}) = \gamma \vec{G} \vec{r}$, whose spectral distribution $I(\Omega_1)$ we are attempting to measure. A conventional excitation will lead in the transverse rotating-frame plane to a uniformed-phase spin density profile $\rho$, which in the absence of relaxation will result in a time-domain signal $$S(t) \propto \sum_{\Omega_1} I(\Omega_1) e^{i\Omega_1 t} \int_{all\ r} \rho \cdot e^{i\Omega_{inh}(r,t)t} d^3 r. \quad (61)$$

In general this signal will decay within a timescale that is inverse to $\Omega_{inh}$'s span over the detected volume of interest, precluding a resolution of $\Omega_1$ interactions situated closer than this spread. By contrast if one departs from a uniform spin excitation and replaces it with a phase-encoded $\rho(r,t) = \rho_0 \exp[-i\phi(r,t)]$ state where $\phi(r,t) = -\Omega_{inh}(r,t)t$, it is clear that the resulting time-domain signal will be free from the effects of the inhomogeneity and therefore solely reflective of the internal interactions. From an analysis of S(t) a high-resolution, inhomogeneity-free $I(\Omega_1)$ spectrum would follow. This simple argument highlights the two main challenges to overcome towards the successful exploitation of this approach: i) an optimal strategy for imparting for a given time t the spatially-selective z-rotation represented by $\phi(r,t) = -\Omega_{inh}(r,t)t$ needs to be designed, and ii) a way of extending the single-instant correction imparted by this $\phi(r,t)$ towards the acquisition of a full S(t) set multiplexing all spectral information, needs to be found. The latter appears to be the main of the two challenges, particularly if one wishes to implement it on a single-scan acquisition basis. And yet two examples have recently exemplified the use of spatially-selective manipulations of the kind just described, to the acquisition of high resolution data within a single scan [18, 43]. This portion of the description is devoted to brief theoretical descriptions of these methods, and to the experimental demonstration of their potential.

Single-Scan Strategies Based on an Indirect-Domain Spatial Encoding of the Corrections.

One of the solutions proposed for achieving the high resolution goals just mentioned relied on exploiting the principles involved in single-scan nD NMR [13, 14]. By already relying on a spatially-resolved encoding of the interactions, this methodology provides a natural starting point for a $\phi(r)$-based inhomogeneity compensation. Unlike what happens in conventional time-domain experiments, single-scan nD NMR delivers its high-resolution spectroscopic information within an acquisition time $T_a$ that can in principle be made arbitrarily short. This is the consequence of a read-out process where peak positions become determined by the action of an acquisition gradient $G_a$ defining spectral widths according to a wavenumber $$k = \gamma \int_0^t G_a(t') dt',$$

rather than as a result of the numerical Fourier transform of an S(t) time-domain signal. Thus in the usual case of a square-wave gradient acquisition, the spatially-encoded spectral width reaches a maximum span of $\gamma G_a T_a$ and allows one to arbitrarily shorten the acquisition time by a concomitant increase in the gradient's strength. This in turn helps solve the single-instant multiplexing issue mentioned above. We summarize next how spatial encoding enables the acquisition of high resolution spectra assuming, for simplicity, a static inhomogeneity that is unidimensional in nature.

A number of strategies have been proposed for achieving the spatial encoding underlying single-scan nD NMR [13, 14, 21, 22, 45, 46]. One of these relies on a series of $N_1$ discrete excitation pulses, that trigger the evolution of spins placed at different positions $\{r_i\}_{i=1,N_1}$ over a series of incremented times $t_1(r_i)=C(r_i-r_{N_1})$ (FIG. 12A). In order to implement such spatially-selective excitation a suitably refocused encoding gradient $G_e$ is activated, and the offset of the excitation pulses is evenly spread between the $\pm \gamma G_e L/2$ frequency bounds dictated by the sample length L [14]. In the presence of the inhomogeneities, individual positions $r_i$ are then addressed by this train of RF excitation pulses according to $$O[t_1(r_i)] = \gamma G_e r_i + \Omega_{inh}(r_i). \quad (62)$$

This is correct within an undetermined error $\delta r \approx \Omega_1/\gamma G_e$ given by the a priori unknown off-resonance values—an error which for simplicity we shall assume small. The overall position-dependent phase $\phi_e(r_i)$ accumulated by the spins following such discrete spatial encoding process will then reflect a free evolution, depending on the internal shifts $\Omega_1$ as well as on the inhomogeneity effects one is trying to remove:

$$\phi_e(z_i) = \phi_{RF}(r_i) + t_1(r_i) \cdot [\Omega_1 + \Omega_{inh}(r_i)]; i=1,\ldots,N_1 \quad (63)$$

Here $\phi_{RF}(r_i)$ denotes the relative phase of the RF pulse used to excite the i-th discrete spin-packet, and is a key parameter that we can freely manipulate to remove the apparent effects of the inhomogeneity. Indeed since both $\Omega_{inh}(r)$ and $t_1(r_i)$ are known functions, setting the phases of the RF pulses equal to $\phi_{RF}(r_i) = -t_1(r_i) \cdot \Omega_{inh}(r_i)$ (within an arbitrary constant value) will ensure that the overall encoding stemming from eq. 3 ends up free from the effects of the field inhomogeneity, yet reflective of the $\Omega_1$ evolution to be measured [18].

A number of alternatives to this discrete option have been proposed for implementing the spatial encoding underlying single-scan 2D NMR. These include the application of pairs of chirped $\pi/2$ pulses [45], pairs of adiabatic $\pi$ pulse sweeps [46] and $\pi/2$–$\pi$ pulse combinations [21, 22]; all of these acting while under the action of suitable field gradients and capable of yielding the linear $C\Omega_1(r-r_0)$ encoding required for the subsequent $G_a$-driven readout of the interactions. Like their discrete counterpart all these continuous alternatives possess an inhomogeneity compensation potential; given the proven advantages of these frequency-swept options, we address next their mode of compensation. For simplicity we shall focus on the $\pi/2$–$\pi/2$ combination (FIG. 12B), an experiment where continuously swept RF pulses are applied twice: first over an initial time $t_p^+$ to effect a progressive excitation of the spins, and then over a final time $t_p^-$ to implement a regressive storage of the transverse evolution. As a result of these pulses an amplitude modulation is created, encoding the $t_1$ effects of the shifts and couplings as a spatial pattern of stored magnetizations. In the usual, homogeneous field scenario, the offset of these two chirped pulses is swept over the relevant $|\gamma G_e L|$ frequency intervals at a constant rate $R \approx 2\gamma G_e L/t_1^{max}$ during equal periods $t_p^+ = t_p^- = t_1^{max}/2$, while the sign of $G_e$ is alternated between the excitation and storage. It can then be shown that by setting the RF intensity $\gamma B_1 \approx 0.25 \sqrt{R}$ identical $\pi/2$ nutations are achieved; the resulting amplitude-modulated signal possesses the kind of pattern required by the spatial encoding procedure [45]. In order to derive the conditions under which such pair of pulses will deliver the same $\phi_e(r) = C\Omega_1(r-r_0)$ spin evolution even in the presence of field inhomogeneities, we shall consider as in the discrete case a 1D problem where once again $\|\gamma G_e L\| \gg \|\Omega_1\|$. The first of these pulses will then address spins progressively at times $\tau^+(r)$ when its RF offset $O^+$ matches the spin's resonance frequency $\omega^+(r) = \gamma G_e^+ r + \Omega_{inh}(r)$; the second one will act at a time $\tau^-(r)$ when its offset $O^-$ matches $\omega^-(r) = \gamma G_e^- r + \Omega_{inh}(r)$. Following an extension of eq. 63, the overall phase that gets evolved by the spins' magnetizations as a function of their position will be given by $$\phi_e(r) = [t_p^+ - \tau^+(r)] \cdot \omega^+(r) + \tau^-(r) + \phi_{RF}[\tau^+(r)] - \phi_{RF}[\tau^-(r)]. \quad (64)$$

The first two terms in this expression denote the free evolution undergone by spins as a result of the gradient and of the inhomogeneity; as these are both artifacts of the experiment, our aim will be to remove them. To do so we shall be aided by the two $\phi_{RF}$ terms in eq. 64's right-hand side, which are added and subtracted from the spins' evolution by the excitation and storage pulses respectively. These latter contributions can be summarized as $$\phi_{RF}[\tau^\pm(r)] = \int_0^{\tau^\pm(r)} O^\pm(\tau') d\tau' \quad (65)$$

where, as in eq. 62, $O^\pm[\tau(r)] = \gamma G_e^\pm r + \Omega_{inh}(r)$. Notice that in comparison with the discrete refocusing case eq. 65 places an additional constraint, given by the fact that in a continuous sweep scenario the offsets and phases of the RF encoding pulses can no longer be independently manipulated. One possible way to bypass such constraint could rely on the gradients, making the $G_e^\pm$ time-dependent in such fashion so as to compensate for the $\Omega_{inh}(r)$. Instead we shall follow the approach described in Ref. [47] and keep the gradients time-independent, yet depart from the constant sweep rate condition and exploit the variability that modulating the $\tau^+(r)$'s offers to tailor the phase imparted on the spins as a function of position.

The inhomogeneity refocusing condition can be summarized by requesting that eq. 64 be deprived of its spatial dependence; i.e., by claiming $$\frac{d\phi_e(r)}{dr} = 0. \tag{66}$$

Simultaneously the RF sweeps leading to this condition need to allow for a linear spatial encoding of the internal interactions; in other words the overall free evolution time $t_1$ must, as in the homogeneous $B_0$ situation, fulfill $$t_1(r) = [t_p^+ - \tau^+(r)] + \tau^-(r) = C(r_0 - r) \tag{67}$$

with $C = t_1^{max}/L$ and $r_0 = -L/2$. Eqs. 64-67 suffice to derive the times $\tau^\pm(r)$ at which the continuously-swept RF offsets have to excite/store spin coherences positioned at a given coordinate r, and at the same time remove the effects of the inhomogeneity. Assuming for simplicity that, as in the homogeneous encoding cases one uses $G_e^+ = -G_e^- = G_e$, these times need to fulfill $$\tau^+(r) = \frac{C}{2\gamma G_e}\left\{-L\frac{d\Omega_{inh}}{dr}\bigg|_{r=r_0} + \left(\frac{L}{2}-r\right)\left[\gamma G_e - \frac{d\Omega_{inh}(r)}{dr}\right]\right\} \tag{68a}$$

and $$\tau^-(r) = \frac{C}{2\gamma G_e}\left(\frac{L}{2}+r\right)\left[\gamma G_e + \frac{d\Omega_{inh}(r)}{dr}\right]. \tag{68b}$$

From these expressions the frequency sweep profiles of the encoding pulses can be obtained by inverting $\tau^\pm(r)$ into $r(\tau^\pm)$ (numerically if need be), and by then plugging the resulting function into the frequency-modulated excitation/storage profiles $O^\pm(\tau) = \pm\gamma G_e r(\tau^\pm) + \Omega_{inh}[r(\tau^\pm)]$. As in the homogeneous case a suitable amplitude modulation of such frequency-shaped pulses also needs to be introduced, so that the adiabaticity parameters of the sweeps keep on maintaining the $\gamma B_1(\tau) \approx 0.25\sqrt{|dO(\tau)/d\tau|}$ condition required for imparting $\pi/2$ nutations [17]. Notice that as a result of the inhomogeneity the durations of the swept pulses cease to be identical, and become instead given by the $$\frac{t_p^-}{t_p^+} = \frac{\gamma G_e + \frac{d\Omega_{inh}}{dr}\big|_{r=r_O}}{\gamma G_e - \frac{d\Omega_{inh}}{dr}\big|_{r=r_O}} \tag{69}$$

ratio. Further conditions that $\Omega_{inh}(r)$, $\gamma G_e$ need to fulfill in order to enable an inversion of eq. 68 into an RF frequency profile, are discussed in Ref. [47].

Single-Scan Strategies Based on Spatially-Dependent Direct-Domain Rotations: Shim Pulses The strategies just described amount to shaping the RF excitation/storage pulses, so as to impart spatially-dependent z rotations that at the conclusion of an in indirect time $t_1$ shall be able to remove known inhomogeneity profiles. Spatially-dependent z-rotations can also be used in an alternative way to remove previously-known field inhomogeneities; namely, by applying them on spins after they have been excited into the transverse x-y plane. This results in "shim pulses"; spatially-dependent rotations designed to refocus the effects of inhomogeneities acting within a particular dwell time $\Delta t_2$ while preserving, at least to some extent, the effects of chemical shifts. As discussed in Ref. [43] a pair of consecutive $\pi$ pulses spanning the shortest possible times $t_\pi^+, t_\pi^-$ and applied in-between the signal digitization, provide a particularly simple way to impart this kind of spatially-selective z-rotations (FIG. 12C). Indeed as each $\pi$ pulse reverses the effects of the chemical shifts (while leaving homonuclear couplings unaffected) a spectrum will result where chemical shifts appear scaled by a factor $$\frac{t_\pi^+ + t_\pi^-}{t_\pi^+ + t_\pi^- + \Delta t_2},$$

while the J coupling strengths remain unchanged. From a practical perspective this approach differs and complements the one given in the previous paragraph, in the sense that instead of compensating inhomogeneities only once and over an indirectly-monitored delay $t_1^{max}$, it operates a number $N_2$ of times equaling the number of digitized points, imparting at every instance a correction corresponding to the evolution time $\Delta t_2$. Aside from the practical consequences that these differences in implementation have, the description underlying the transverse shim-pulse correction is similar to the one given earlier for the longitudinal spatial encoding scenario. We thus extend here the analysis just given based on the $\pi/2-\pi/2$ procedure, to the case of an inhomogeneity refocusing implemented by a pair of frequency-chirped $\pi-\pi$ pulses acting while in the presence of pulsed gradients.

Following arguments given elsewhere concerning the use of adiabatic $\pi$ sweeps to obtain spatially-encoded signals [21,22,46,47], we can describe the overall phase evolved during the course of each of transverse dwell time $\Delta t_2$ in FIG. 12C as $$\phi_e(r) = \phi_\pi^-(r) - \phi_\pi^+(r) + \phi_{inh}^-(r) + \phi_{inh}^+(r) \tag{70}$$

Here the functions $$\phi_\pi^\pm(r) = -\tau^\pm(r)\cdot\omega^\pm(r) + 2\phi_{RF}^\pm[\tau^\pm(r)] + [t_\pi^\pm - \tau^\pm(r)]\cdot\omega^\pm(r) \tag{71}$$

denote the phase evolutions that in the rotating frame of reference the two consecutive $\pi$ inversions lasting times $t_\pi^\pm$ will impart, while the $$\phi_{inh}^\pm(r) = \left\lfloor\frac{\Delta t_2}{2} - t_\pi^\pm\right\rfloor\Omega_{inh}(r) \tag{72}$$

terms describe the effects of the inhomogeneities to be compensated, acting before the first and after the last of the chirped $\pi$ pulses. Notice that if the two pulses are identical eq. 70 predicts that their net effect will be zero, meaning that they will have to differ from one another if the $\phi_{inh}^\pm$ effects are to be compensated. Inhomogeneity effects can then be removed either by manipulating the gradients (included in the $\omega^\pm$'s), or by manipulating both the gradients as well as the phase patterns that are imparted by the RF pulses. Pines et al have presented within a numerical framework applications of the first of these corrective choices; instead, and as was the case for the treatments presented above, we chose to focus on the opportunities opened up by tailoring the offset-driven $\phi_{RF}^\pm$ terms appearing in eq. 70. Since once the burden of thy $\Omega_{inh}$ correction is switched onto the RF the gradient shapes to be used remain to be defined, we assumed for the sake of experimental simplicity that these were equal over the course of the π pulses. In other words, we made $\omega^+(r)=\omega^-(r)=\gamma G_e r + \Omega_{inh}(r)$ for the two consecutive π sweeps. It can then be shown that a small additional gradient becomes necessary to enable the presence of a period of free evolution (i.e., to break the trivial $t_\pi^+ = t_\pi^- = \Delta t_2/2$ high resolution condition); this was introduced in the form of a small $k_0 = G_0 P_0$ gradient pulse adding an overall additional phase $k_0 r$. When applied to the scenario posed by eqs. 70-72, the inhomogeneity-compensated evolution conditions then demands $$\frac{d\phi_e(r)}{dr} = [\Delta t_2 - t_\pi^+ - t_\pi^-]\frac{d\Omega_{inh}}{dr} + 2\left\{\begin{array}{l}\left[\tau^+(r) - \frac{t_\pi^+}{2}\right] - \\ \left[\tau^-(r) - \frac{t_\pi^-}{2}\right]\end{array}\right\} \quad (73)$$

$$\left[\gamma G_e + \frac{d\Omega_{inh}}{dr}\right]$$

$$= k_o.$$

A redundancy arises here in control variables, given by the fact that either the $\tau^+(r)$ or $\tau^-(r)$ functions (i.e., either one of the RF sweeps originating $\phi^+$ and $\phi^-$) could in principle be modulated for the sake of compensating out the effects of $\Omega_{inh}(r)$. To further determine this problem we chose a symmetric-like solution, where the compensating tasks are equally split between the two π sweeps. This in turn leads to the functions $$\tau^\pm(r) = \frac{t_\pi^\pm}{L}(r + L/2) \pm \delta\tau(r), \quad (74)$$

The boundary conditions $\tau^+(-L/2)=\tau^-(-L/2)=0$; $\tau^+(+L/2)=t_\pi^+$; $\tau^-(+L/2)=t_\pi^-$ can then be used to define the length of the pulses and gradients to be used for a given inhomogeneity profile and $\Delta t_2$ value; with these parameters at hand the correcting functions can be derived as $$\delta\tau(r) = \frac{k_o + \frac{d\Omega_{inh}(r)}{dr}[t_\pi^+ + t_\pi^- - \Delta t_2]}{4\left[\gamma G_e + \frac{d\Omega_{inh}(r)}{dr}\right]} - \frac{(t_\pi^+ - t_\pi^-)z}{2L} \quad (75)$$

As in the case of the longitudinal compensation these demands can be inverted to derive the $r(\tau^\pm)$ functions, from which the offset frequency shapes $\phi^\pm = O[r(\tau^\pm)]$ follow. Also in this instance, the amplitudes of the resulting RF sweeps need to be tailored to fulfill in all cases the adiabaticity demands of π inversions.

An Experimental Comparison of Methods.

In order to evaluate the refocusing performance of the inhomogeneity compensation approaches introduced in the preceding paragraphs, a series of simple tests were carried out utilizing the $^1$H NMR spectrum of a nButylchloride/CDCl$_3$ solution as target. Under normal high-resolution conditions the four individual chemical sites and the mutual $^1$H—$^1$H J couplings within this compound are clearly visible (FIG. 13A). An uniaxial field inhomogeneity was mimicked by setting the various spectrometer z shim currents to arbitrary values, leading to a continuous $^1$H lineshape containing few discernible site-related features. Still, a conventional mapping of the sites' resonance frequencies vs position had no difficulties in revealing the $\Omega_{inh}(\hat{z})$ inhomogeneity profiles for every site (FIG. 13B). Using such artificially broadened spectrum as starting point (FIG. 14A) the strategies sketched in FIGS. 12B and 12C were assayed (results arising from the approach in FIG. 12A are not hereby presented as they have already been illustrated in Ref. [18]). FIG. 14B shows the kind of resolution improvement obtained with the longitudinal corrective scheme in FIG. 12B. The indirect-domain spatially-encoded compensation employed a $t_1^{max} \approx 40$ ms, two π/2 chirped pulses applied while in the presence of a $|G_e|=10$ G/cm encoding gradient along the $\hat{z}$ direction, and a data decoding period $T_a=0.4$ ms under the action of a $G_a=10$ G/cm acquisition gradient. Arguably, a stronger encoding gradient could have lead to smaller shift-induced errors in the inhomogeneity correction, which for the present case were given by $\|\Delta\Omega_{cs}/\gamma G_e\|\approx 0.1$ mm. On the other hand stronger gradients would also have exacerbated the potential effects of diffusion over the course of $t_1$. The effective half line width observed for the peaks in this corrective experiment was ca. 30 Hz; sufficient to unambiguously resolve the inequivalent chemical sites, yet not their internuclear spin-spin couplings.

FIG. 14C illustrates a second set of results, this time obtained with the transverse shim-pulse corrections of FIG. 12C. Constant 10 G/cm gradients were used in this compensation, acting in unison with ≈4.5 ms long frequency-tailored π pulses. These dual RF sweeps were chirped over a 100 kHz range; ≈10% outside the observation region L (≈1.90 cm) in order to avoid potential edge effects. Following these corrections a 0.5 ms window free of RF and incorporating the required $k_0$ correction (−0.327 cm$^{-1}$) were introduced in order to enable a chemical shift encoding by the spins, followed by the acquisition of a high-resolution $t_2$ data point. A total of 64 such π pulses/data acquisition modules were employed, leading to an overall acquisition time of 224 ms. This kind of direct-domain spatial correction procedure clearly allowed us to resolve the homonuclear J couplings, with effective line widths decreasing from ≈1500 Hz to about 4 Hz. On the other hand, the fact that out of the 224 ms acquisition time only ≈32 ms took place under conditions of free evolution, lead to a substantial scaling of the apparent chemical shifts effects—with the spectrum taking the appearance of data recorded at a 75 MHz Larmor frequency, rather than at its actual 501 MHz frequency. As pointed out earlier, this reflects the fact that the shift evolution freezes over the course of the π-π compensations, whereas the J-coupling evolution proceeds nearly unhindered over the full length of $t_2$.

The two inhomogeneity refocusing solutions just described are in a way complementary: one operates by spatially encoding its compensations along an indirect $t_1$ evolution domain, while the other refocuses inhomogeneities in-between $\Delta t_2$ direct-domain dwell times. A natural approach to try out is consequently to combine both 1D refocusing strategies, so as to explore new opportunities towards the acquisition of two-dimensional NMR spectra in inhomogeneous fields. Indeed neither of the two corrective approaches just described makes any special demands on the evolutions that might have occurred in a complementary time-domain space, thereby allowing for their natural integration without substantial additions or modifications. FIG. 15 illustrates results obtained from such combination, using once again the conditions of FIG. 13 as an example. Notice that the resulting 2D spectra, which exhibit a remarkable high resolution along their two dimensions, are in all cases the result of single-scan acquisition experiments.

Extensions to Multiple-Scan Acquisition Strategies

The spatially-selective encoding strategies described above can sharpen up spatially inhomogeneous NMR peaks by orders of magnitude. Yet as the experimental results also illustrate, these approaches face a number of limitations in delivering an optimum chemical shift information. The main limitation of the indirect-domain spatial encoding approach concerns—as is also the case for single-scan 2D NMR—the issue of sensitivity. Indeed although a variety of manipulations and optimizations could lead to a resolution that exceeds the one exemplified in FIG. 14B, such experiments would demand that the actual acquisition time of the data ($T_a$) be made much shorter that the decay time introduced by the inhomogeneity. And although this can always be achieved by employing a sufficiently large acquisition gradient $G_a$, a price has to be paid in terms of a larger filter bandwidth (proportional to $\gamma G_a L$) and of a stronger ensuing noise affecting the data. As for the direct-domain compensation approach, it's main drawback appears to stem from the substantial scaling of the chemical shifts on which it incurs. Once again it seems likely that a number of optimizations could be here implemented to reduce the duration taken by the z-rotations—for instance by applying the two refocusing π pulses in near simultaneity rather than in the sequential fashion depicted in FIG. 12. Still it is not evident that the resulting improvements could enable the routine use of the compensation towards chemical shift-based identifications, particularly in the relatively low fields normally associated to MR imaging and spectroscopy in wide bore animal or clinical scanners.

And yet in these latter cases, where sensitivity is usually limited by low metabolite concentrations and completing acquisitions within a single scan is not a primary concern, the single-instant nature of the spatially encoded compensation principle can be combined with the classical scheme of 2D NMR, to deliver a robust approach for correcting the inhomogeneities. In such cases one can envision a family of experiments where inhomogeneities acting over the course of the indirect domain, are corrected in advance and at the time of the excitation by a suitable polychromatic pulse [48] acting in a spatially-selective manner owing to the application of a strong magnetic field gradient (FIG. 16A). This in turn requires setting, for each $t_1$ increment within an otherwise freely evolving 2D acquisition, the phases of the individual N components making the polychromatic excitation pulse according to $$[\phi_{RF}]_i = -O(r_i) \cdot \tau_p - t_1 \cdot \Omega_{inh}(r_i), i=1,\ldots,N, \quad (76)$$

where $\tau_p$ is the duration of the polychromatic pulse and $\{O(r_i) = \gamma G_e r_i + \Omega_{inh}(r_i)\}_{i=1\ldots N}$ constitute the pulse's basic N frequency elements. The position-dependent evolution phases introduced by the excitation gradient and the $\Omega_{inh}(r)$ distribution would then cancel out at the culmination of the indirect-domain evolution period, enabling a high resolution signal $S(t_1)$ to be sampled. Repeating the procedure a suitable number of $t_1$ free evolution increments, should then yield a conventional high resolution time-domain signal when viewed along the indirect domain. Notice that since such signals can be observed while in the absence of ancillary field gradients no extra sensitivity penalties will be involved, and that since in general $\tau_p \ll t_1^{max}$ no significant scaling of the shifts and J-couplings from their free-evolution values will result. Thus are the main two drawbacks associated to the single-scan procedures described above, taken care of. Notice moreover that since in a general case inhomogeneities will lead to an effective decay time $T_2^* \ll T_2$, it becomes possible to monitor signals along the direct $t_2$ domain under the presence of a CPMG-type echo train—further enhancing the per-scan sensitivity [49,50]. All in all, if numerous individual scans are to be collected anyhow for the sake of signal averaging and if inhomogeneity is a substantial problem, it appears convenient to transform these scans into individual $t_1$ increments incorporating the inhomogeneity compensation scheme embodied by eq. 76, rather than simply take their average as in a conventional 1D hard-pulse experiment.

To explore the compensation abilities of the scheme just described, a series of tests were carried out. An illustration of the experiment's performance is demonstrated in FIGS. 16B and 16C, which summarize the 2D results arising from the n-butylchloride/$CDCl_3$ standard subject once again to a ca. 1.5 kHz inhomogeneity along the z-axis. Although these inhomogeneities result in a conventional FID whose $T^*_2$ is only a few ms long (FIG. 17A), signals evolving for hundreds of ms along both $t_1$ and $t_2$ are obtained upon using the inhomogeneity compensation procedure (FIG. 17B). For this particular example the inhomogeneity averaging reflects the compensation introduced by a single, 400 µs long π/2 polychromatic pulse triggering the $t_1$ evolution, and the refocusing effects brought about by a train of hard CPMG π pulses executed every 4 ms during $t_2$. Notice that by virtue of the free evolution experienced by the spins during $t_1$ chemical shifts and J-couplings result in a spectrum with a completely normal appearance—yet with linewidths that are ca. 400 times sharper than in their single-pulse counterpart. A similar approach could be employed over the phase-encoding period of a gradient-echo MRI acquisition, to yield high-definition images in the presence of gross inhomogeneities.

It follows that a spatially-encoded 2D corrective-approach can significantly improve the appearance of spectroscopic or imaging NMR data without incurring in any apparent penalties—at least for cases where numerous scans are to be collected in any case for the sake of improving sensitivity. A question that then naturally arises concerns the potential limitations of this 2D inhomogeneity compensation procedure. In principle one could assume that, given an encoding gradient that is large enough compared to the local inhomogeneity and sufficient RF power to efficiently excite the resulting gradient-induced bandwidth, arbitrarily large inhomogeneities could be compensated by the procedure. While at the same time, the low sensitivities following from the short $T_2^*$'s imposed by the magnet's inhomogeneities could be dealt with by the application of a signal-enhancing CPMG train. Given such considerations it appears that even currently-available commercial gradient probeheads, capable of reaching in excess of 2000 G/cm, could go to great lengths towards dealing with the ≈100 ppm inhomogeneities normally characterizing high-field Physics-oriented magnets. At some point, however, a new inhomogeneity-driven line broadening mechanism will arise, associated now to the incoherent motions that spins in a liquid will undergo over the course of the $t_1$ period—between the time they are excited, and the time when their coherent (echo is detected. Such diffusion effects are known to inflict decays of the form $$\exp\left[-D\left(\frac{\partial \Omega_{inch}}{\partial z}\right)^2 t_1^3\right]$$

onto a spins' evolution [51], and will eventually limit the accuracy with which Field inhomogeneities can be refocused by the hereby proposed coherent manipulations. In order to get a better idea of the destructive effects imposed by such phenomena a series of numerical simulations were carried out based on a quadratic inhomogeneity (linear terms being usually minor close to the magnet's sweet spot and anyhow addressable by linear compensating gradients). It was found that when having $G_e \approx 2000$ G/cm gradients available for doing the compensation, ≈50 kHz wide heterogeneities (100 ppm @ 11.7 T over the full sample volume) could be reduced to ca. 30 Hz line widths in the resolved 2D peaks—this residual reflecting the action of diffusive effects placing an ultimate limit on the spatial refocusing.

By treating the sample in a spatially-selective fashion, the combined application of external field gradients and of frequency-selective pulses opens up a number of new opportunities towards the acquisition of high resolution NMR spectra and high-definition MRI images within inhomogeneous fields. The discussion of the present invention employed an artificially-broadened 1D model, in order to focus on some single- and multiple-scan compensating alternatives. The former have obvious speed advantages, but achieve their aim at the expense of either sensitivity or resolution limitations. For low-sensitivity, low-field cases where signal averaging may anyhow be required and where chemical shift resolution is at a premium, such sacrifices may be unacceptable. An alternative was thus presented based on merging multiscan acquisitions with the spatially-encoded inhomogeneity-compensation procedure, within the framework of a traditional 2D NMR experiment. The resulting compensation is then endowed with a good sensitivity by virtue of the summations involved in the $t_1$ Fourier transformation and the $t_2$ CPMG acquisition, together with an unsealed spectral information reflecting the free evolution occurring along $t_1$. A further homonuclear J-domain encoding, unimportant at high $B_0$ fields but potentially diagnostic at lower fields [52], also arises along the direct domain. All these features combined could proof particularly useful in a number of scenarios including in vivo analyses of metabolites in animal or human scanners; studies that are generally characterized by relatively high heterogeneities, limited shimming capabilities, and relatively low magnetic fields where chemical shift displacements are at a premium.

A number of simplifications adopted throughout the discussion are worth remarking. One involved the $B_0$ inhomogeneities, which were assumed one-dimensional and time independent. Another concerned the RF manipulations, which were assumed to act instantaneously and on the basis of the small-angle approximation. While these assumptions were taken for the sake of evidencing more clearly the nature of the compensation procedures, none of them is actually essential and all can be dispensed of in realistic applications. From a practical standpoint, the greatest challenge is probably posed by the extension of the procedure hereby described from one spatial dimension to three. There are a number of different ways by which such extension can be carried out; these range from transforming the single-axis compensation procedure into a multiple-axis one where multiple corrective RF pulses are applied while under the action of linearly-independent gradients, to the design of a compensation procedure based on the application of a single multi-dimensional corrective RF pulse. The first of these approaches could be readily incorporated into standard spectroscopic sequences such as STEAM or PRESS [35], yet the nature of $\Omega_{inh}(r)$ profiles that could be thus compensated is mostly limited to products of 1D field inhomogeneities. The latter approach by contrast would be truly general, yet given the lengthier nature of multidimensional RF pulses vis-à-vis their 1D counterparts [53] it could be more susceptible to signal losses. In-between solutions, involving sequential 1D and 2D RF compensating pulses, could constitute a good compromise to overcome these limitations. The single-instant nature of the various schemes hereby discussed also makes them suitable for dealing with periodic time-dependent $B_0$ variations, provided these are amenable to characterizations by means navigator scans [54]. As for the design of all our RF compensations based on the small angle approximation, it is also worth noting that numerous different alternatives discussed in the literature are worth exploring within an inhomogeneity compensation context [53].

CONCLUDING REMARKS

The invention of the method and apparatus includes a protocol for retrieving multidimensional nuclear magnetic resonance (NMR) spectra and magnetic resonance imaging (MRI) profiles within a single scan, as has been recently proposed, based on a spatial encoding of the MR interactions. It has also been shown that the selectivity with which spins are manipulated during this encoding process opens up the possibility for compensating for magnetic field inhomogeneities; not by demanding extreme uniformities from the $B_0$ fields employed, but rather by compensating for their effects at a radiofrequency excitation and/or refocusing level. The present invention here employs its potential in an MRI setting and in a purely spectroscopic scenario, where the goal is the acquisition of high-definition multidimensional images of the spins' density and/or their spectral response. It is shown that in combination with time-dependent gradient manipulations such compensation approach offer a greater flexibility, and can be used to counteract substantial field inhomogeneities at either global or local levels over relatively long periods of time—for both one—as well as multi-dimensional single-scan MRI situations or experiments. The upper tolerable limits in the field distortions talus become much larger than those acceptable in comparable NMR/MRI acquisition modes based on a simple excitation of the spins and Fourier-transformation (FT) of the data. The new compensation method and apparatus provide a scheme that could find uses in areas where heterogeneities in magnetic fields present serious obstacles, including functional studies in regions near tissue/air interfaces, imaging or spectroscopy of high-susceptibility areas, real-time imaging in surgical environments, ex situ MRI, etc. Modified versions of the compensation method and apparatus hereby presented that could also offer a robust route to eliminate other common NMR/MRI artifacts, including spatial heterogeneities in the $B_1$ RF fields amplitudes, as well as chemical shift artifacts in imaging experiments. The principles of the $B_0$ compensation method and apparatus of the present invention have been disclosed for one- and higher-dimensional cases, and experimentally demonstrated on a series of 1D and 2D NMR and MRI experiments of simple phantoms subject to field inhomogeneities.

As proposed, according to the present invention, a protocol is presented for retrieving nuclear magnetic resonance (NMR) spectra based on a spatially-dependent encoding of the MR interactions. It has also been shown that the spatial selectivity with which spins are manipulated during such encoding opens up new avenues towards the removal of magnetic field inhomogeneities; not by demanding extreme $B_0$ field uniformities, but rather by compensating for the dephasing effects introduced by the field distribution at a radiofrequency excitation and/or refocusing level. The present invention discusses in further detail a number of strategies deriving from this principle, geared at acquiring both uni- as well as multi-dimensional spectroscopic data at high resolution conditions. Different variants are presented, tailored according to the relative sensitivity and chemical nature of the spin system being explored. In particular a simple multi-scan method and apparatus is discussed capable of affording substantial improvements in the spectral resolution, at nearly no sensitivity or scaling penalties. This new compensation method and apparatus is therefore well-suited for the collection of high-resolution data in low-field systems possessing limited signal-to-noise ratios, where magnetic field heterogeneities might present a serious obstacle. Potential areas of applications of these techniques include high-field in vivo NMR studies in regions near tissue/air interfaces, clinical low field MR spectroscopy on relatively large off-center volumes difficult to shim, and ex situ NMR. The principles of the different compensation methods have been reviewed and experimentally demonstrated for one-dimensional inhomogeneities; further improvements and extensions have also been briefly discussed.

Figure 19:
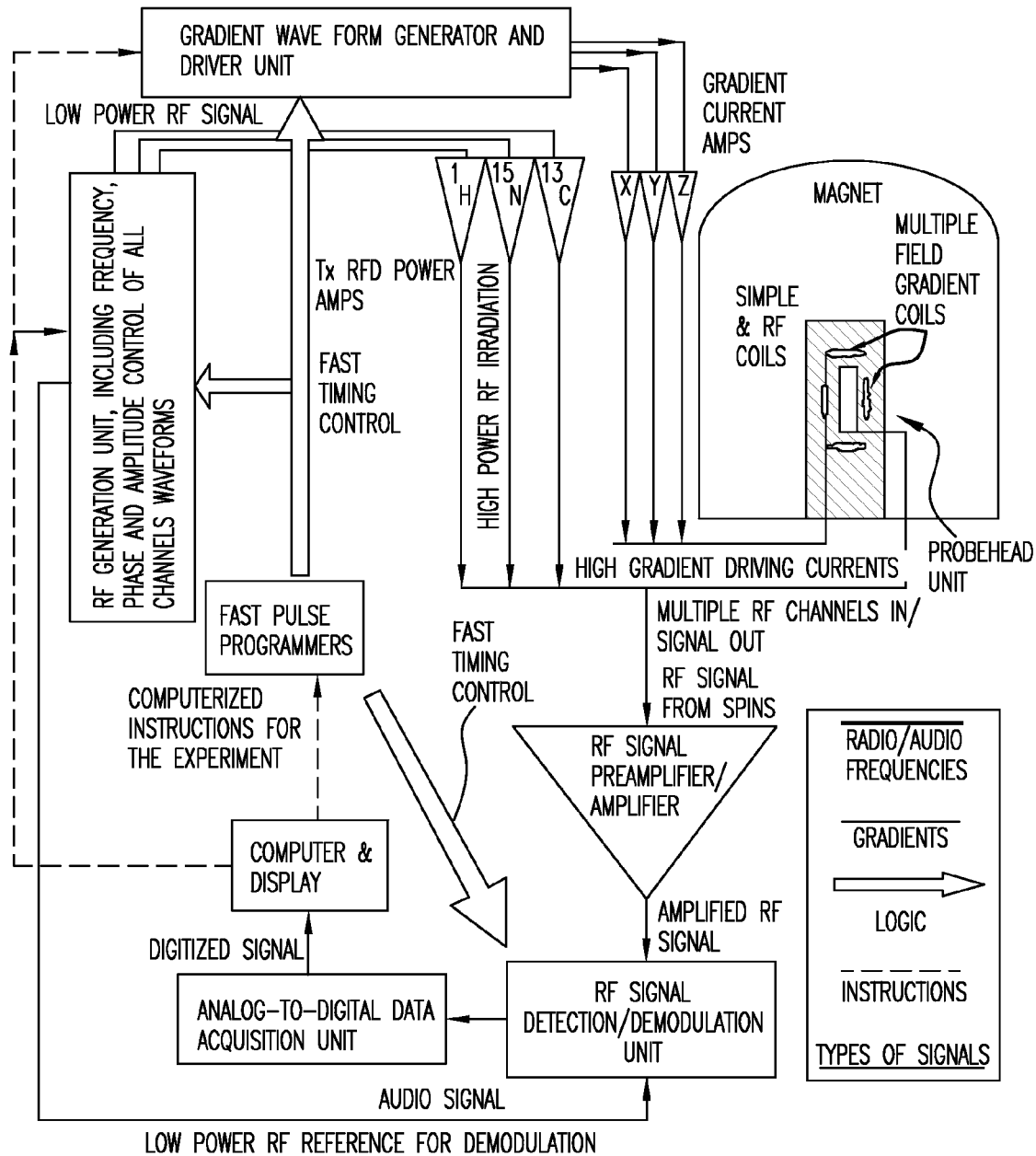
FIG. 19 is a block diagram of a preferred embodiment of the apparatus of the present invention with respect to NMR/MRI.

Referring now to FIG. 19, there is shown in block diagram a preferred embodiment of an NMR/MRI apparatus according to the present invention with the types of signals shown in the block diagram shown in the legend box at the lower right of the drawing. As shown, the apparatus consists of a magnet 100 that generates a high-quality, high-intensity magnetic field that is uniform within the volume of a sample 106 undergoing test or monitoring. As shown, the magnet includes an ancillary shim coil system for achieving a good homogeneity over the desired volume. Included within this embodiment are the coils 102 for generating the magnetic field gradients required by the invention. The magnetic field strength may be stabilized with the aid of an additional locking circuitry. Within a probehead unit 104 in the magnet 100 is positioned the sample 106 and one or multiple RF coils 108.

The probehead unit 104 ("probe") contains the sample 106 to be studied, as well as ancillary electronic equipment, including the coils 102 needed for generating the field gradients required by the invention, the electronics associated with an efficient PF irradiation of the spins, and the circuitry for an efficient detection of the spins' signal. Numerous such gradient and RF circuits are present in the single probe; the former for accounting for the three spatial directions, the latter for the simultaneous irradiation of multiple nuclear species ($^1$H, $^2$H, $^{13}$C, etc.) as well as for the detection of signals coming from multiple coils.

The gradient wave form generator and driver unit 110 is comprised of a digital gradient waveform generator and a gradient driver that translates these digital signals into low-level analog currents, which are fed to gradient amplifiers X, Y, Z via lines 140 where these low-level signals are translated into intense high gradient driving currents that are supplied via lines 142 to the gradient coils 102 surrounding the sample 106. Three such units are independently present, driving orthogonal x, y and z geometries.

RF Generation and Irradiation Unit 112 is comprised of an RF unit having a low-level synthesizer generating the basic low power RF signal used to irradiate EL spin, an amplitude- and phase-control stage capable of creating pulses of different frequencies and shapes. Unit 112 is coupled via lines 136 to and feeds high-power amplifiers 114 that translate these low-level signals into the intense pulses that are fed via lines 138 to common lines 139 into the RF coils 108 in the probe 104 for the actual irradiation. Common lines 139 serve as multiple RF Channels In/Signals Out. Unit 112 also provides a reference RF for the subsequent demodulation of the spins' signal from the radio (MHz) to the audio (kHz) range via line 134 to RF Signal Detection/Demodulation Unit 124. Several such units are usually present, one per spin species to be irradiated during a particular sequence ($^1$H, $^3$C, $^{15}$N, $^2$H, etc.).

A Signal Detection Unit receives the RF signal from spins via multiple RF channels In/Signals Out line 139 and coupled line 144. The Unit is comprised of one or several RF signal preamplifier/amplifier 120 to effect the requisite preamplification, and then, amplification. Preamplifier/amplifier 120 is coupled, in turn, to an RF Signal Detection/Demodulation unit 124 including the functions of demodulation and detection, which in turn is coupled to an Analog-to-Digital Data Acquisition Unit 126 that contains the digitization components, capable of transforming the voltage originally generated by the spins following their irradiation into a string of complex numbers (the Free Induction Decay or FID).

A Computer and Display 130 is coupled to Fast Pulse Programmers 132, which receive instructions from the computer 130, via bus 150, as indicated in FIG. 13. These components 130 and 132 are responsible for interfacing to the user, and then creating the desired sequence of commands that all remaining units in the apparatus will carry out during the course of the operation of the apparatus or the experiment. Thus, the computer 130 also provides instructions via bus 152 to the RF generation unit 112 and to the Gradient Wave Form Generator Driver Unit 110. In accordance with standard computer practice, users commands, input via a standard I/O 154, such as a keyboard or other such input device, are translated by the computer 130 into strings of binary digits and logical timing signals, that are in turn executed by the various units. The computer 130 containing adequate memory is also usually the final depository of the digitized FID, where its data is processed into an NMR spectrum according to the algorithms and other information set forth above and display takes place. The Fast Pulse Programmers 132 are connected by buses 160 and 162 to provide fast timing control to the RF Signal Detection/Demodulation Unit 124, the RF generation unit 112 and the Gradient Wave Form Generator and Driver Unit 110.

The present invention (i.e., system or apparatus described in detail in this description of specific embodiments and as generally depicted in FIG. 19 or any part thereof), as previously noted, may be implemented using hardware, software or a combination thereof and may be implemented in one or more computer systems or other processing systems, and the capability would be within the skill of one ordinarily skilled in the art of programming of computers from the teachings and detailed disclosure provided in the foregoing description of the apparatus and the process. As noted, the computer system utilized in the invention represents any single or multi-processor computer, and in conjunction therewith, single-threaded and multi-threaded applications can be used. Unified or distributed memory systems can be used. In one example, the system and method of the present invention is implemented in a multi-platform (platform independent) programming language such as Java, programming language/ structured query language (PL/SQL), hyper-text mark-up language (HTML), practical extraction report language (PERL), Flash programming language, common gateway interface/structured query language (CGI/SQL) or the like and can be implemented in any programming language and browser, developed now or in the future, as would be apparent to a person skilled in the relevant art(s) given this description. In another example, the system and method of the present invention, may be implemented using a high-level programming language (e.g., C++) and applications written for the Microsoft Windows NT or SUN OS environments. It will be apparent to persons skilled in the relevant art(s) how to implement the invention in alternative embodiments from the teachings herein.

The Computer system of the invention includes one or more processors and can execute software implementing the routines described above. Various software embodiments are described in terms of this exemplary computer system. After reading this description, it will become apparent to a person skilled in the relevant art how to implement the invention using other computer systems and/or computer architectures.

Figure 20:
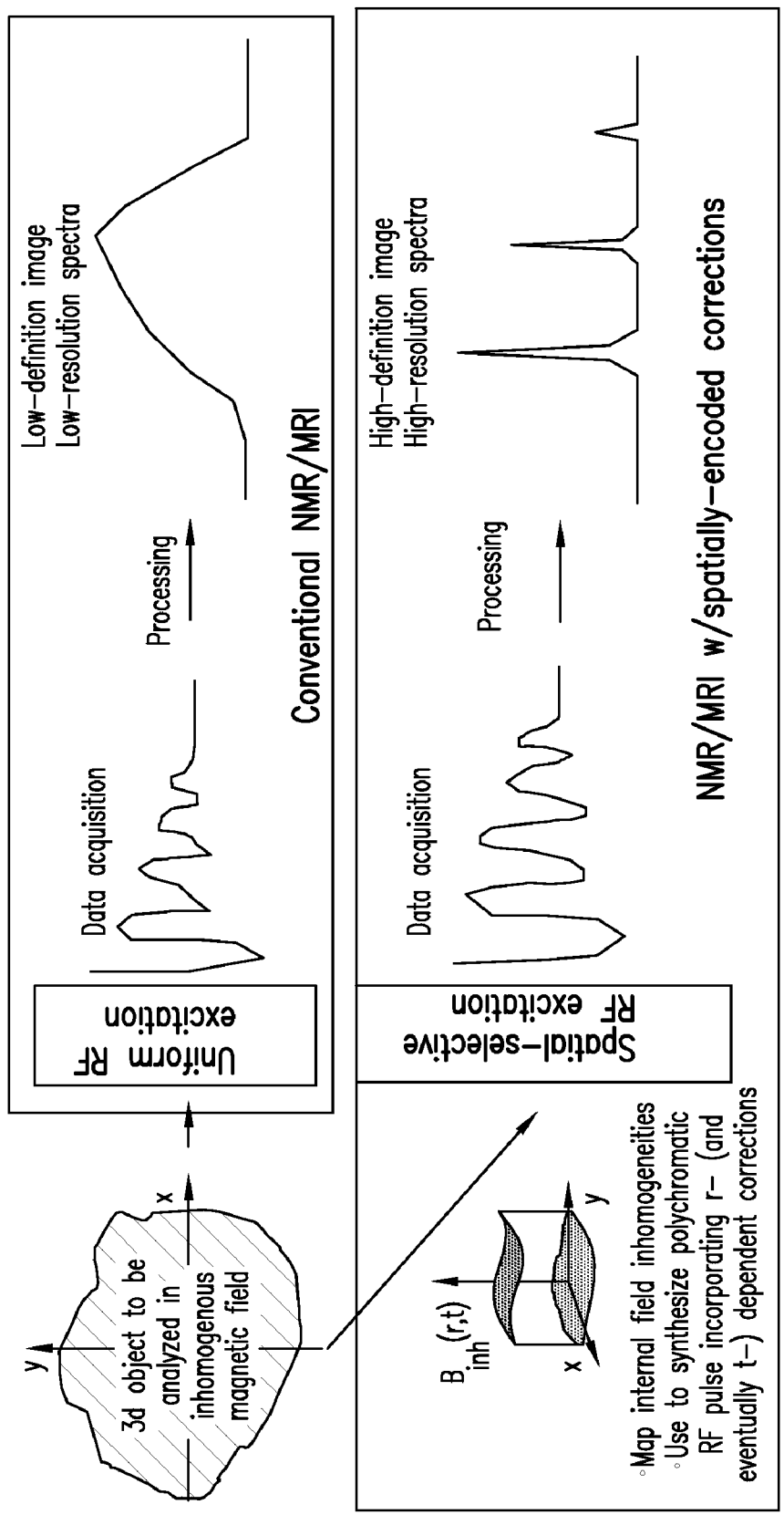
FIG. 20 is schematic diagram showing a 3D object to be analyzed, in inhomogeneous magnetic field, showing graphically in a top view using uniform RF excitation data acquisition, processing and low-definition image or low-resolution spectra as in a conventional NMR/MRI, and in a bottom view an abbreviated flow chart and graphically, for spatial—selective RF excitation data acquisition processing and the resulting high-definition or high-resolution spectra using the NMR/MRI with spatially-encoded corrections.

FIG. 20 shows at the upper left the 3D object to be analyzed, in inhomogeneous magnetic field. The diagram to the right, upper view, shows graphically in a top view the flowchart using uniform RF excitation data acquisition, processing and low-definition image or low-resolution spectra as in a conventional NMR/MRI. In the bottom view is shown an abbreviated flow chart for mapping internal field inhomogeneities, the use of synthesizing polychromatic RF pulses incorporating r- (and eventually t-) dependent corrections. Shown graphically, in the view to the right, for spatial—selective RF excitation are the step data acquisition, processing and the resulting high-definition or high-resolution spectra using the NMR/MRI with spatially-encoded corrections.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

REFERENCES

[1] Schmidt F, Stehling M K, Turner R. *Echo Planar Imaging: Theory, Technique and Application*, Berlin: Springer Verlag; 1998.

[2] Buxton R B. *An Introduction to Functional MRI: Principles and Techniques*, Cambridge: Cambridge University Press; 2001.

[3] Mansfield P, Grannel P K. NMR Diffraction in Solids, J. Phys. C: Solid State Phys. 1973; 6: L422-L426.

[4] Mansfield P. Multi-planar image formation using NMR spin echoes. J. Phys. C: Solid State Phys. 1977; 10: 55-58.

[5] Haase A. Snapshot FLASH MRI. Applications to T1, T2 and chemical-shift imaging. Magn. Reson. Med. 1990; 13: 77-89

[6] Lowe I J, Wyson R B. DANTE ultrafast imaging sequence (DUFIS). J. Magn. Reson. B 1993; 101: 106-109.

[7] Jeener J. Lecture presented at Ampere International Summer School II, Basko Polje, Yugoslavia, September 1971.

[8] Aue W P, Bartholdi E, Ernst R R. Two dimensional spectroscopy. Application to nuclear magnetic resonance. J. Chem. Phys. 1976; 64:2229-2246.

[9] Twieg D B. The k-trajectory formulation of the NMR imaging process with applications in analysis and synthesis of imaging methods. Med. Phys. 1983: 10: 610-621.

[10] Doyle M, Turner R, Cawley M, Glover P, Morris G K, Chapman B, Ordidge R J, Coxon R, Coupland R E, Worthington B S, Mansfield P. Real time cardiac imaging of adults at video frame rates by magnetic resonance imaging, Lancet 1986; 2:682-683

[11] Ahn C B, Kim J H, Cho Z H. High speed spiral scan echo planar imaging. IEEE Trans. Med. Imaging. 1986; 5:2-5.

[12] Oshio K, Feinberg D A. GRASE imaging: A novel fast MRI technique. Magn. Reson. Med. 1991; 20: 344-349.

[13] Frydman L, Scherf T, Lupulescu A. The acquisition of multidimensional NMR spectra within a single scan. Proc. Natl. Acad. Sci USA 2002; 99: 15858-15862.

[14] Frydman L, Scherf T, Lupulescu A. Principles and features of single-scan two-dimensional NMR spectroscopy. J. Am. Chem. Soc. 2003; 125: 9204-9217.

[15] Shrot Y, Frydman L. Single-scan NMR spectroscopy at arbitrary dimensions. J. Am. Chem. Soc. 2003; 125: 11385-11396.

[16] Frydman L. U.S. Pat. No. 6,873,153: "Method and apparatus for acquiring multidimensional spectra and improved unidimensional spectra within a single scan" (2005).

[17] Shrot Y, Frydman L. Spatially encoded NMR and the acquisition of 2D magnetic resonance images within a single scan. J. Magn. Reson. 2005; 172: 179-190.

[18] Shapira B, Frydman L. Spatial encoding and the acquisition of high-resolution NMR spectra in inhomogeneous magnetic fields. J. Am. Chem. Soc. 2004; 126: 7184-7185.

[19] Shapira B, Frydman L. High resolution NMR in inhomogeneous magnetic fields: A comparison of strategies based on spatially encoded corrections. J. Magn. Reson., 182, 12-21 (2006).

[20] Topgaard D, Martin R W, Sakellariou D, Meriles C A, Pines A. "Shim pulses" for NMR spectroscopy and imaging. Proc. Natl. Acad. Sci USA 2004; 101: 17576-17581.

[21] Tal A, Shapira B, Frydman L. A continuous phase-modulated approach to spatial encoding in ultrafast 2D NMR spectroscopy. J. Magn. Reson. 2005; 176:107-114.

[22] Andersen N S, Kockenberger W. A simple approach for phase-modulated single-scan 2D NMR spectroscopy. Magn. Reson. Chem. 2005; 43:795-797.

[23] Jackson J I, Meyer C H, Nishimura D G, Macovski A. Selection of a convolution function for Fourier inversion using gridding. IEEE Trans. Med. Imaging. 1991; 10:473-478.

[24] Jezzard P, Balaban R S. Correcting for geometric distortions in echo planar images from $B_0$ variations. Magn. Reson. Med. 1995; 34: 65-73.

[25] Irarrazabal P, Meyer C H, Nishimura D G, Macovski A. Inhomogeneity correction using an estimated linear field map. Magn. Reson. Med. 1996; 35: 278-282.

[26] Shinnar M, Eleff H, Subramanian H and Leigh J S. The synthesis of pulse sequences yielding arbitrary magnetization vectors. Magn. Reson. Med. 1989; 12:74-80

[27] Pauly J M, LeRoux P, Nishimura D G, Macovski A. Parameter relations for the Shinnar-LeRoux Selective Excitation Pulse Design Algorithm. IEEE Trans. Med. Imaging. 1991; 10:53-65.

[28] Schulte R F, Tsao J, Boesiger P, Pruessmann K P. Equiripple design of quadratic-phase RF pulses. J. Magn. Reson. 2004; 166: 111-122.

[29] Pruessmann K P, Weiger M, Scheidegger M B, Boesiger P. Sense: Sensitivity encoding for fast MRI. Magn. Reson. Med. 199; 42:952-962.

[30] Sodickson D K, McKenzie C A. A generalized approach to parallel magnetic resonance imaging. Med. Phys. 2001; 28:1629-1643.

[31] Merboldt K-D, Finsterbusch J, Frahm J. Reducing inhomogeneity artifacts in functional MRI of human brain activation—thin sections vs gradient compensation. J. Magn. Reson. 2000; 145:184-191

[32] Stenger V A, Boada F E, Noll D C. 3D tailored RF pulses for the reduction of susceptibility artifacts in T2-weighted functional MRI. Magn. Reson. Med. 2000; 44:525-531.

[33] D. M. Grant, R. K. Harris, Eds., Encyclopedia of NMR, J. Wiley & Sons, Chichester, 1996.

[34] D. D. Laukien, W. H. Tschopp, Superconducting NMR magnet design, Concepts Magn. Reson. 6 (1994) 255-273.

[35] D. D. Stark and W. G. Bradley Eds, Magnetic Resonance Imaging, $3^{rd}$ Ed., Mosby, St. Louis, 1999; pp. 181-214.

[36] P. J. McDonald, Stray field magnetic resonance imaging, Prog. Nucl. Magn. Reson. Spect. 30 (1997) 69-99

[37] D. P. Weitekamp, J. R. Garbow, J. B. Murdoch, A. Pines, High resolution NMR spectra in inhomogeneous magnetic fields: Applications of total spin coherence transfer echoes, J. Am. Chem. Soc. 103 (1981) 3578-3580.

[38] J. J. Balbach, M. S. Conradi, D. P. Cistola, C. G. Tang, J. R. Garbow, W. C. Hutton, High resolution NMR in inhomogeneous fields, Chem. Phys. Lett. 277 (1997) 367-374.

[39] S. Vathyam, S. Lee, W. S. Warren, Homogeneous NMR spectra in inhomogeneous fields, Science 272 (1996) 92-96.

[40] Y. Lin, S. Ahn, N. Murali, W. Brey, C. R. Bowers, W. S. Warren, High resolution>1 GHz NMR in unstable magnetic fields, Phys. Rev. Lett. 85 (2000) 3732-3735.

[41] C. A. Meriles, D. Sakellariou, H. Heise, A. J. Moulé, A. Pines, Approach to high resolution ex situ NMR spectroscopy, Science 293 (2001) 82-85.

[42] J. Perlo, V. Dernas, F. Casanova, C. A. Meriles, J. Reimer, A. Pines, B. Blümich, High resolution NMR spectroscopy with a portable single-sided sensor, Science 308, (2005) 1278-1279.

[43] D. Topgaard, R. W. Martin, D. Sakellariou, C. A. Meriles, A. Pines, "Shim pulses" for NMR spectroscopy and imaging, Proc. Natl. Acad. Sci. USA 101 (2004) 17576-17581.

[44] N. Chen, A. Wyrwicz, Removal of intravoxel dephasing artifact in gradient-echo images using a field-map based RF refocusing technique, Magn. Reson. Med., 42 (1999) 807-812.

[45] Y. Shrot, B. Shapira, L. Frydman, Ultrafast 2D NMR spectroscopy using a continuous spatial encoding of the spin interactions, J. Magn. Reson. 171 (2004) 162-169.

[46] P. Pelupessy, Adiabatic single-scan 2D NMR spectroscopy, J. Am. Chem. Soc. 125 (2003)12345-12350.

[47] A. Tal, L. Frydman, Spatial encoding and the single-scan acquisition of high definition MR images in inhomogeneous magnetic fields. J. Magn. Reson., 181, 179-194 (2006).

[48] E. Kupce, R. Freeman, Pulse design in the frequency domain, J. Magn. Reson. A 103 (1993) 358-363.

[49] S. Meiboom and D. Gill. Modified spin-echo method for measuring nuclear relaxation times, Rev. Sci. Instr. 29 (1959) 688-691.

[50] R. Siegel, T. T. Nakashima, R. Wasylishen, Signals-to-noise enhancement of NMR spectra of solids using multiple-pulse spin-echo experiments, Concepts Magn. Reson. 26A (2005) 62-77.

[51] H. Y. Carr, E. M. Purcell, Effects of diffusion on free precession in nuclear magnetic resonance experiments, Phys. Rev. 94 (1954) 630-638.

[52] R. E. Hurd, J. Kurhanewicz, Single voxel oversampled J-resolved spectroscopy of in vivo human prostate tissue, Magn. Reson. Med., 45 (2001) 973-980.

[53] M. A. Bernstein. K. F. King, X. J. Zhoh, Handbook of MRI pulse sequences, Academic, New York, 2004.

[54] T. S. Sachs, C. H. Meyer, J. Kohlu, D. G. Nishimura, A. Macovski, Real-time motion detection in spiral MRI using navigators. Magn. Reson. Med. 32 (1994) 639-645.

What is claimed is:

1. In a method for treating a sample to acquire one of high-definition magnetic resonance images (MRI images) and nuclear magnetic resonance (NMR) spectra, even in the presence of magnetic field distortions, within one or multiple scans that comprises the steps of: (1) acquiring data of the sample by applying a magnetic field gradient on the sample to endow spins at different positions within the sample with different resonance frequencies while simultaneously applying a radiofrequency (RF) pulse in unison with the magnetic field gradient to encode spins at different positions within the sample with an excitation/inversion profile; (2) correcting field inhomogeneities at the time of acquisition to be independent of the field inhomogeneities; (3) capturing and decoding the spin signals thus created to decode at least one of the spins' spatial locations and spectroscopic responses unaffected by field inhomogeneity; and (4) retrieving from decoded signals and storing a set of data indicative of one of a final undistorted image and spectrum being sought;

the improvement comprising effecting the correction of field inhomageneities in step (3) by continuously sweeping chirped π/2 RF pulses twice during acquisition, over an initial time to effect progressive excitation of spins and over a final time to implement regressive storage of a transverse evolution resulting in encoding $t_1$ effects of the shifts and couplings as a spatial pattern of stored magnetizations.

2. In a method according to claim 1 the further improvement of applying a pair of consecutive frequency-chirped π–π RF pulses spanning the shortest possible times in-between signal acquisition of step (3) and after the spins have been excited to inversion to refocus the effects of inhomogeneities acting within a predetermined dwell time $\Delta t_2$ while preserving the effects of chemical shifts.

3. In a method according to claim 1 the further improvement of oscillating the field gradient.

4. In a method according to claim 2 including the further improvement of oscillating the field gradient.

5. In a method for treating a sample to acquire one of high-definition magnetic resonance images (MRI images) and nuclear magnetic resonance (NMR) spectra, even in the presence of magnetic field distortions, within one or multiple scans that comprises the steps of: (1) quantifying a priori the spatial nature of the field inhomogeneities; (2) acquiring data of the sample by applying a magnetic field gradient on the sample to endow spins at different positions within the sample with different resonance frequencies; (3) simultaneously applying a radiofrequency (RF) pulse in unison with the magnetic field gradient to encode spins at different positions within the sample with an excitation/inversion profile; (4) correcting the spins' evolution phases and their signal amplitudes at the time of the acquisition to be independent of the field inhomogeneities by temporal shaping of the encoding pulse; (5) capturing and decoding the spin signals thus created and decoding at least one of the spins' spatial locations and spectroscopic responses unaffected by inhomogeneity; and (6) subjecting the collected decoded spin signals to a suitable procedure to retrieve and store a set of data of the sample indicative of one of a final undistorted image and spectrum being sought;

the improvement comprising eliminating the effects of field inhomogeneities by the steps of;
(a) in addition to temporal shaping of the encoding pulse in step (4), performing one of shaping the initial field gradient and predetermining dwell time $\Delta t$;
(b) maintaining a linearity between the coordinate direction of the pulse and the acquisition time; and
(c) maintaining a constant pixel size throughout acquisition.

6. In a method according to claim 5 the further improvement of oscillating the field gradient.

7. In a method for treating a sample to acquire one of high-definition magnetic resonance images (MRI images) and nuclear magnetic resonance (NMR) spectra, even in the presence of magnetic field distortions, within one or multiple scans that comprises the steps of: (1) acquiring data of the sample by applying a magnetic field gradient on the sample to endow spins at different positions within the sample with different resonance frequencies while simultaneously applying a radiofrequency (RF) pulse in unison with the magnetic field gradient to encode spins at different positions within the sample with an excitation/inversion profile; (2) correcting field inhomogeneities at the time of acquisition to be independent of the field inhomogeneities; (3) capturing and decoding the spin signals thus created to decode at least one of the spins spatial locations and spectroscopic responses unaffected by field inhomogeneity; and (4) retrieving from decoded signals and storing a set of data indicative of one of a final undistorted image and spectrum being sought;

the improvement comprising effecting the correction of field inhomogeneities in step (2) by applying a pair of consecutive frequency-chirped π–π RF pulses spanning the shortest possible times in-between signal acquisition of step (3) and after the spins have been excited to inversion to refocus the effects of inhomogeneities acting within a predetermined dwell time $\Delta t_2$ while preserving the effects of chemical shifts.

8. In a method according to claim 7 the further improvement of oscillating the field gradient.

9. In an apparatus for treating a sample to acquire one of high-definition magnetic resonance images (MRI images) and nuclear magnetic resonance (NMR) spectra, even in the presence of magnetic field distortions, within one or multiple scans that comprises: (1) means for acquiring data of the sample by applying a magnetic field gradient on the sample to endow spins at different positions within the sample with different resonance frequencies while simultaneously applying a radiofrequency (RF) pulse in unison with the magnetic field gradient to encode spins at different positions within the sample with an excitation/inversion profile; (2) means for correcting field inhomogeneities at the time of acquisition to be independent of the field inhomogeneities; (3) means for capturing and decoding the spin signals thus created to decode at least one of the spins' spatial locations and spectroscopic responses unaffected by field inhomogeneity; and (4) means for retrieving from decoded signals and storing a set of data indicative of one of a final undistorted image and spectrum being sought;

the improvement comprising the means for correcting field inhomogeneities including means for continuously sweeping chirped π/2 RF pulses twice during acquisition, over an initial time to effect progressive excitation of spins and over a final time to implement regressive storage of a transverse evolution resulting in encoding $t_1$ effects of the shifts and couplings as a spatial pattern of stored magnetizations.

10. in an apparatus according to claim 9 the further improvement of means for applying a pair of consecutive frequency-chirped π–π RF pulses spanning the shortest possible times in-between signal acquisition and after the spins have been excited to inversion to refocus the effects of inhomogeneities acting within a predetermined dwell time $\Delta t_2$ while preserving the effects of chemical shifts.

11. In an apparatus according to claim 9 the further improvement of means for controlling the field gradient to oscillate the field gradient.

12. In an apparatus according to claim 10 the further improvement of means for controlling the field gradient for oscillating the field gradient.

13. In an apparatus for treating a sample to acquire one of high-definition magnetic resonance images (MR images) and nuclear magnetic resonance (NMR) spectra, even in the presence of magnetic field distortions, within one or multiple scans that comprises: (1) means for quantifying a priori the spatial nature of the field inhomogeneities; (2) means for acquiring data of the sample by applying a magnetic field gradient on the sample to endow spins at different positions within the sample with different resonance frequencies; (3) means for simultaneously applying a radiofrequency (RF) pulse in unison with the magnetic field gradient to encode spins at different positions within the sample with an excitation/inversion profile; (4) means for correcting the spins' evolution phases and their signal amplitudes at the time of the acquisition to be independent of the field inhomogeneities by temporal shaping of the encoding pulse; (5) means for capturing and decoding the spin signals thus created and decoding at least one of the spins' spatial locations and spectroscopic responses unaffected by inhomogeneity; and (6) means for subjecting the collected decoded spin signals to a suitable procedure to retrieve and store a set of data of the sample indicative of one of a final undistorted image and spectrum being sought;

the improvement comprising the means for eliminating the effects of field inhomogeneities, in addition to temporal shaping of the encoding pulse; including;

(a) means for performing one of shaping the initial field gradient and predetermining dwell time $\Delta t$;

(b) first means for controlling linearity between the coordinate direction of the pulse and the acquisition time; and (c) second means for controlling pixel size throughout acquisition.

14. In an apparatus according to claim 13 the further improvement of third means for controlling the field gradient for oscillating the field gradient.

15. In an apparatus for treating a sample to acquire one of high-definition magnetic resonance images (MRI images) and nuclear magnetic resonance (NMR) spectra, even in the presence of magnetic field distortions, within one or multiple scans that comprises the steps of: (1) means for acquiring data of the sample by applying a magnetic field gradient on the sample to endow spins at different positions within the sample with different resonance frequencies while simultaneously applying a radiofrequency (RF) pulse in unison with the magnetic field gradient to encode spins at different positions within the sample with an excitation/inversion profile; (2) means for correcting field inhomogeneities; (3) means for capturing and decoding the spin signals thus created to decode at least one of the spins' spatial locations and spectroscopic responses unaffected by field inhomogeneity; and (4) means for retrieving from decoded signals and storing a set of data indicative of one of a final undistorted image and spectrum being sought;

the improvement comprising the means for effecting the correction of field inhomogeneities including means for applying a pair of consecutive frequency-chirped π–π RF pulses spanning the shortest possible times in-between signal acquisition and after the spins have been excited to inversion to refocus the effects of inhomogeneities acting within a predetermined dwell time $\Delta t_2$ while preserving the effects of chemical shifts.

16. In an apparatus according to claim 15 including the further improvement of controlling the field gradient for oscillating the field gradient.

* * * * *